(12) United States Patent
Yu et al.

(10) Patent No.: US 11,658,097 B2
(45) Date of Patent: May 23, 2023

(54) MANUFACTURING METHOD FOR SEMICONDUCTOR DEVICE INCLUDING THROUGH DIE HOLE

(71) Applicant: Taiwan Semiconductor Manufacturing Company, Ltd., Hsinchu (TW)

(72) Inventors: Chen-Hua Yu, Hsinchu (TW); Kuo-Chung Yee, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 114 days.

(21) Appl. No.: 17/381,169

(22) Filed: Jul. 20, 2021

(65) Prior Publication Data

US 2021/0351111 A1   Nov. 11, 2021

Related U.S. Application Data

(62) Division of application No. 16/413,607, filed on May 16, 2019, now Pat. No. 11,075,145.

(51) Int. Cl.
| | | |
|---|---|---|
| *H01L 23/48* | (2006.01) | |
| *H01L 23/31* | (2006.01) | |
| *H01L 23/00* | (2006.01) | |
| *H01L 21/768* | (2006.01) | |

(52) U.S. Cl.
CPC ...... *H01L 23/481* (2013.01); *H01L 21/76877* (2013.01); *H01L 23/3121* (2013.01); *H01L 24/09* (2013.01); *H01L 24/17* (2013.01); *H01L 24/33* (2013.01); *H01L 2224/02372* (2013.01)

(58) Field of Classification Search
CPC ..................................................... H01L 23/481
USPC ........................................................... 257/774
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |

(Continued)

*Primary Examiner* — Ajay Arora
(74) *Attorney, Agent, or Firm* — JCIPRNET

(57) ABSTRACT

Curable material layer is coated on surface of first die. First die includes first substrate and first contact pad. Second die is bonded to first die. Second die includes second substrate and second contact pad. Second contact pad is located on second substrate, at an active surface of second die. Bonding the second die to the first die includes disposing second die with the active surface closer to the curable material layer and curing the curable material layer. A through die hole is etched in the second substrate from a backside surface of the second substrate opposite to the active surface. The through die hole further extends through the cured material layer, is encircled by the second contact pad, and exposes the first contact pad. A conductive material is disposed in the through die hole. The conductive material electrically connects the first contact pad to the second contact pad.

20 Claims, 42 Drawing Sheets

(56) References Cited

U.S. PATENT DOCUMENTS

2016/0155724 A1* 6/2016 Kim .................... H01L 21/6835
257/774
2018/0315620 A1* 11/2018 Lee ....................... H01L 23/544

* cited by examiner

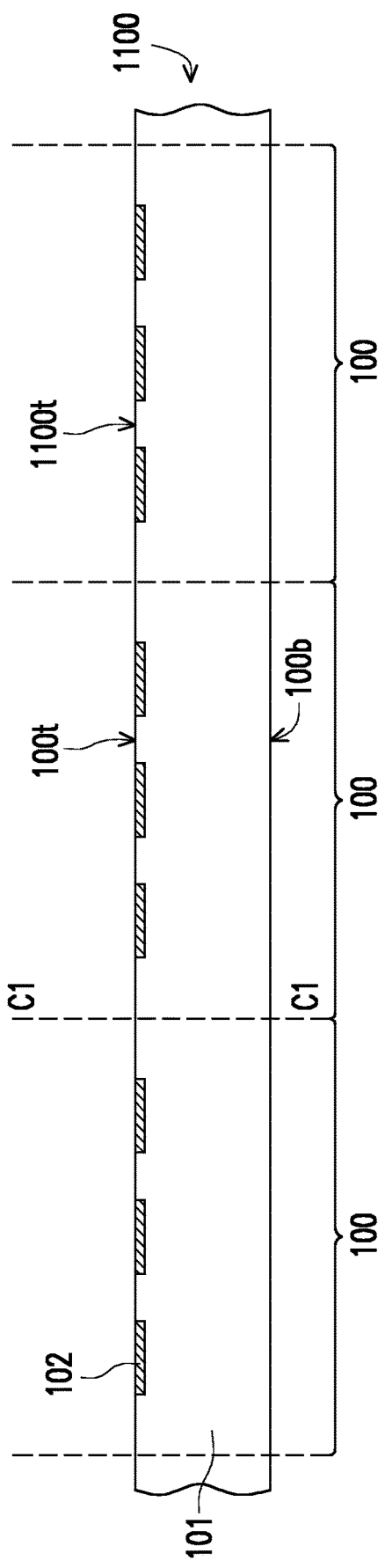
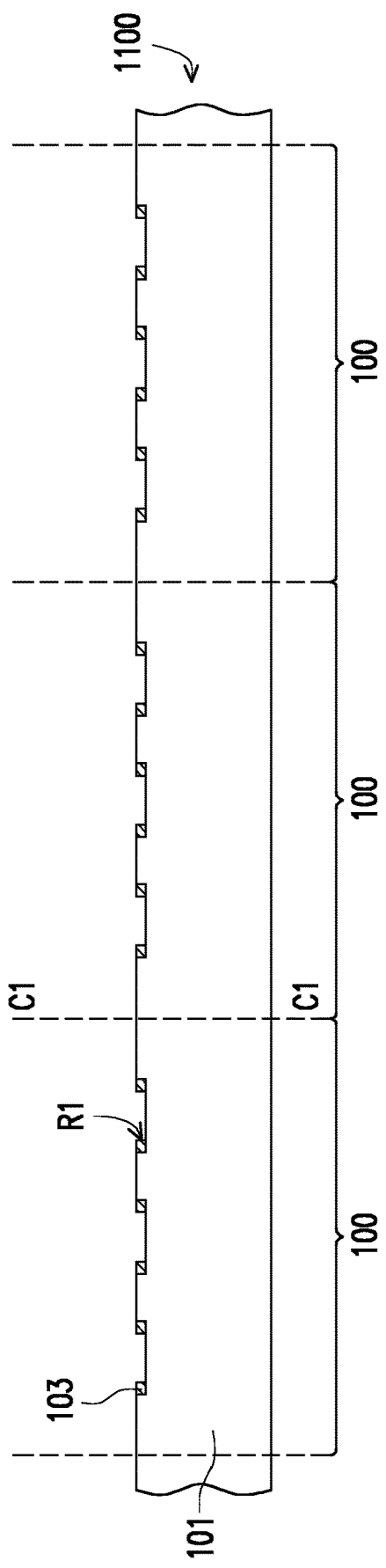
FIG. 1A
FIG. 1B

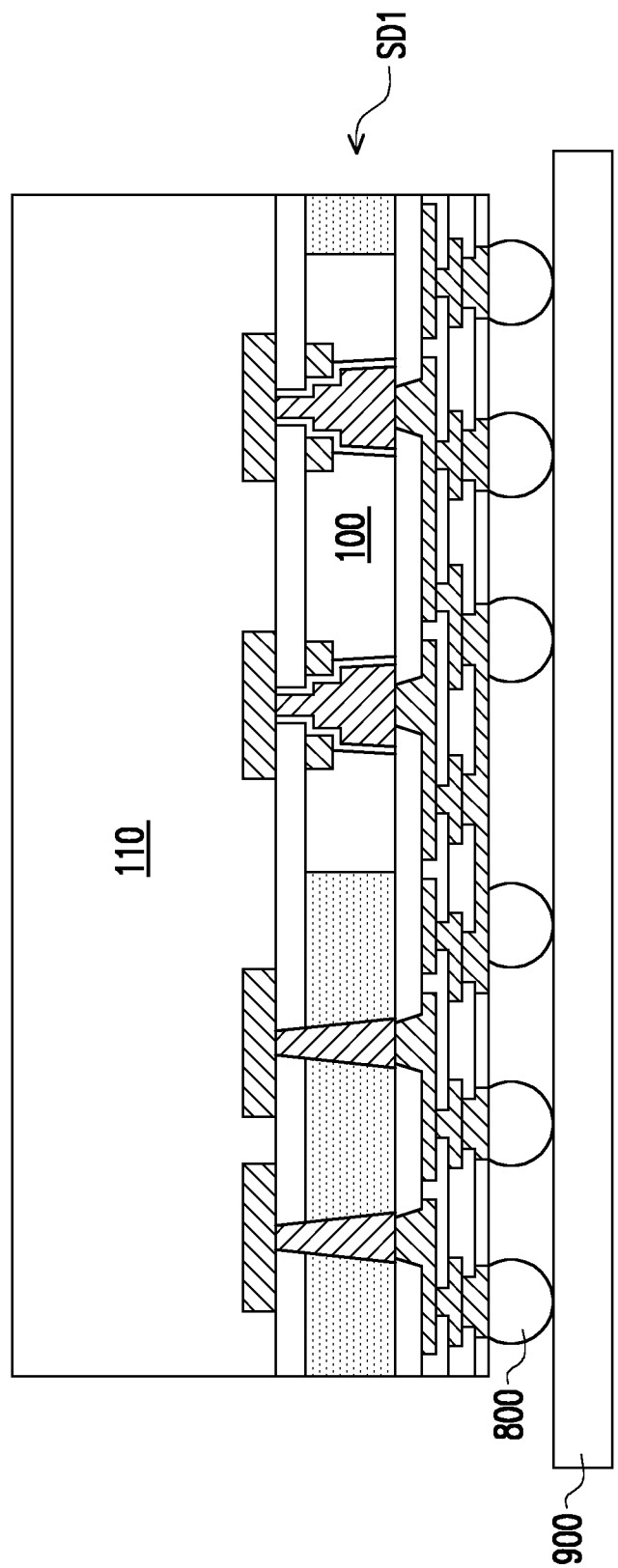

ND METHOD FOR
MANUFACTURING METHOD FOR SEMICONDUCTOR DEVICE INCLUDING THROUGH DIE HOLE

CROSS-REFERENCE TO RELATED APPLICATION

This application is a divisional application of and claims the priority benefit of a prior application Ser. No. 16/413,607, filed on May 16, 2019. The entirety of the above-mentioned patent application is hereby incorporated by reference herein and made a part of this specification.

BACKGROUND

Semiconductor devices and integrated circuits used in a variety of electronic applications, such as cell phones and other mobile electronic equipment, are typically manufactured from a single semiconductor wafer. The dies of the wafer may be processed and packaged with other semiconductor devices or dies at the wafer level, and various technologies have been developed for wafer level packaging. In addition, for multi-die packages, the arrangement of the dies and the corresponding connecting elements affects data transmission speed and reliability of the packaged products.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1A through FIG. 1B show schematic cross-sectional views of structures produced at various stages of a manufacturing method of a semiconductor device according to some embodiments of the present disclosure.

FIG. 2J shows a schematic cross-sectional view of a semiconductor device connected to a circuit substrate according to some embodiments of the present disclosure.

DESCRIPTION OF THE EMBODIMENTS

Figure 2A:
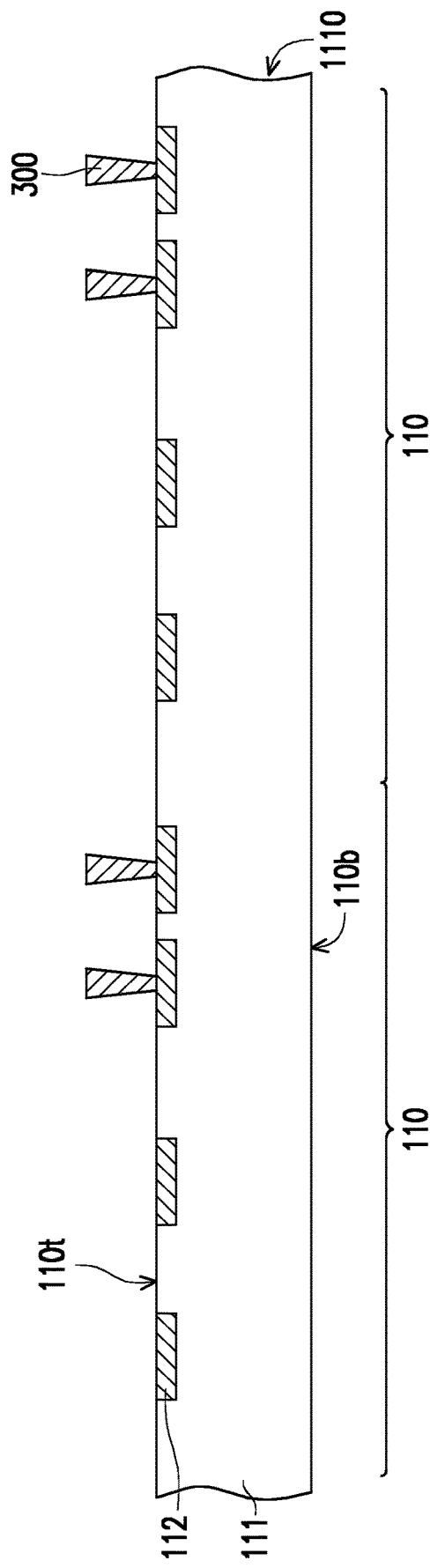
FIG. 2A through FIG. 2I show schematic cross-sectional views of structures produced at various stages of a manufacturing method of a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2B:
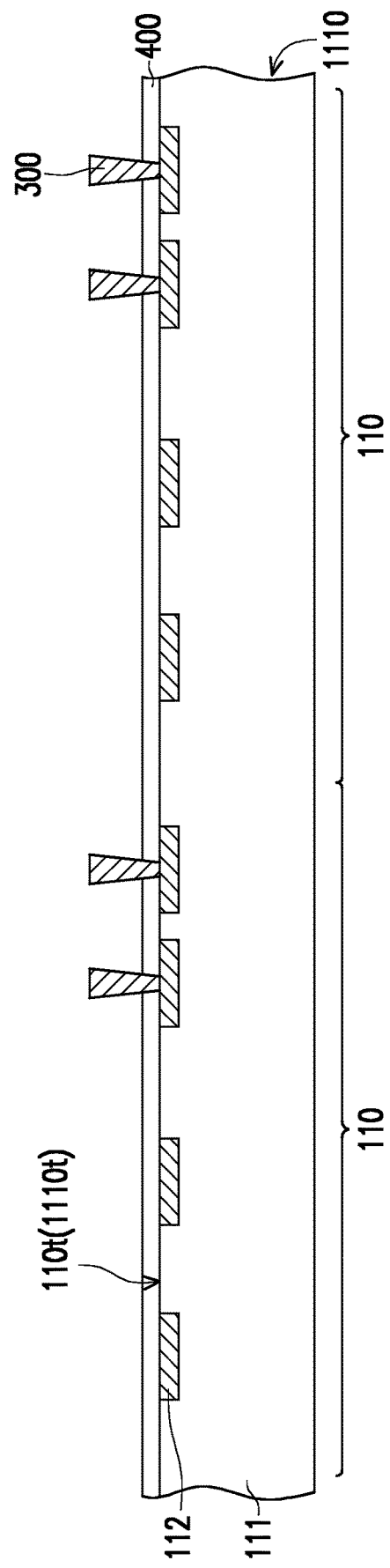
Figure 2C:
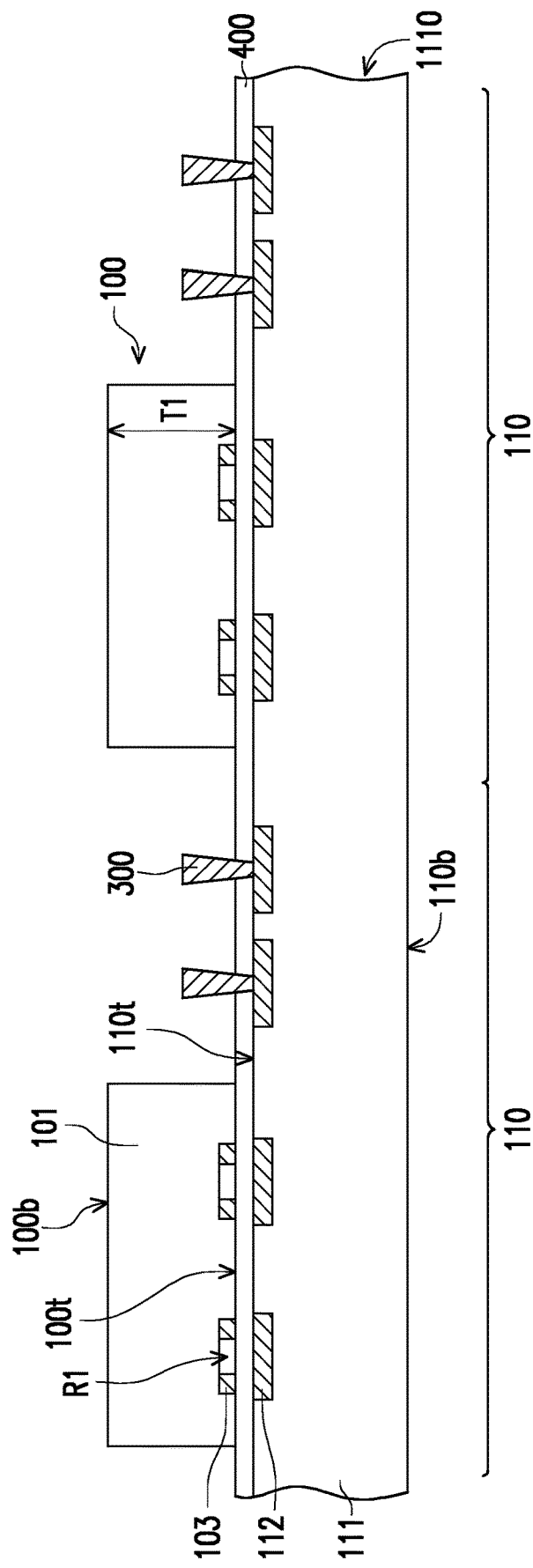
Figure 2D:
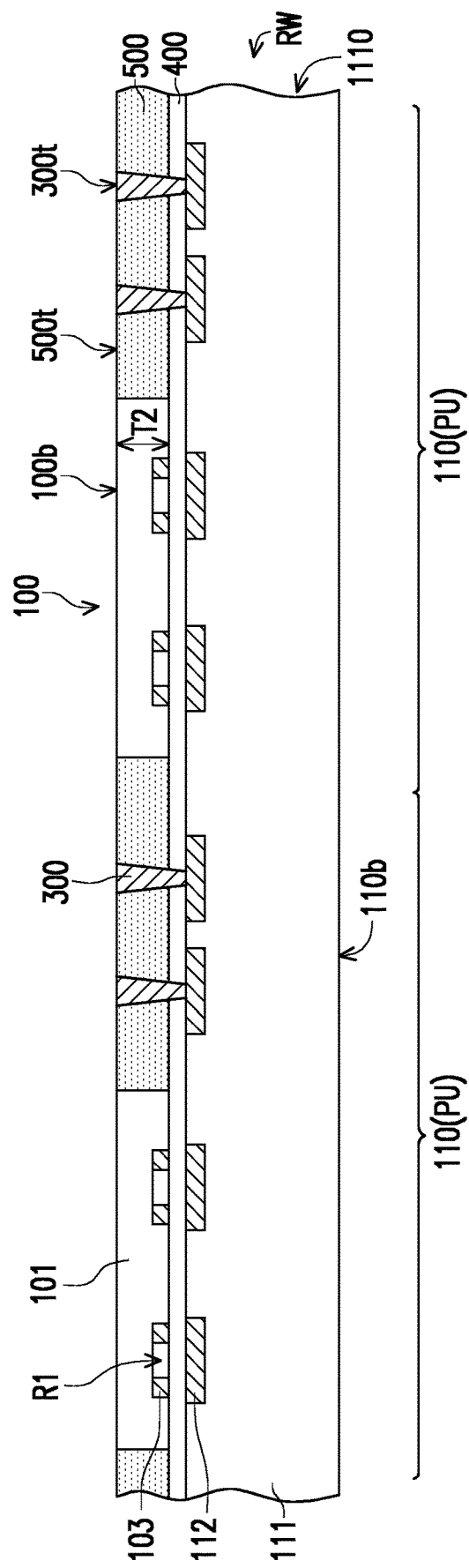
Figure 2E:
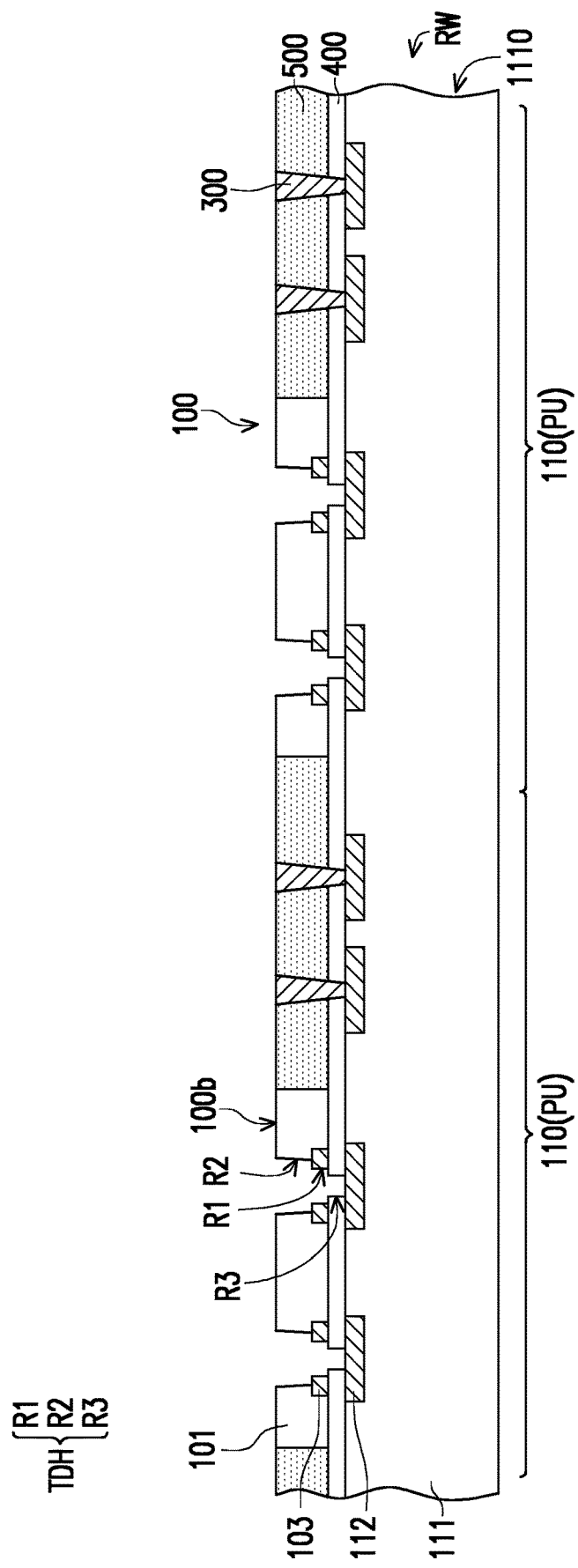
Figure 2F:
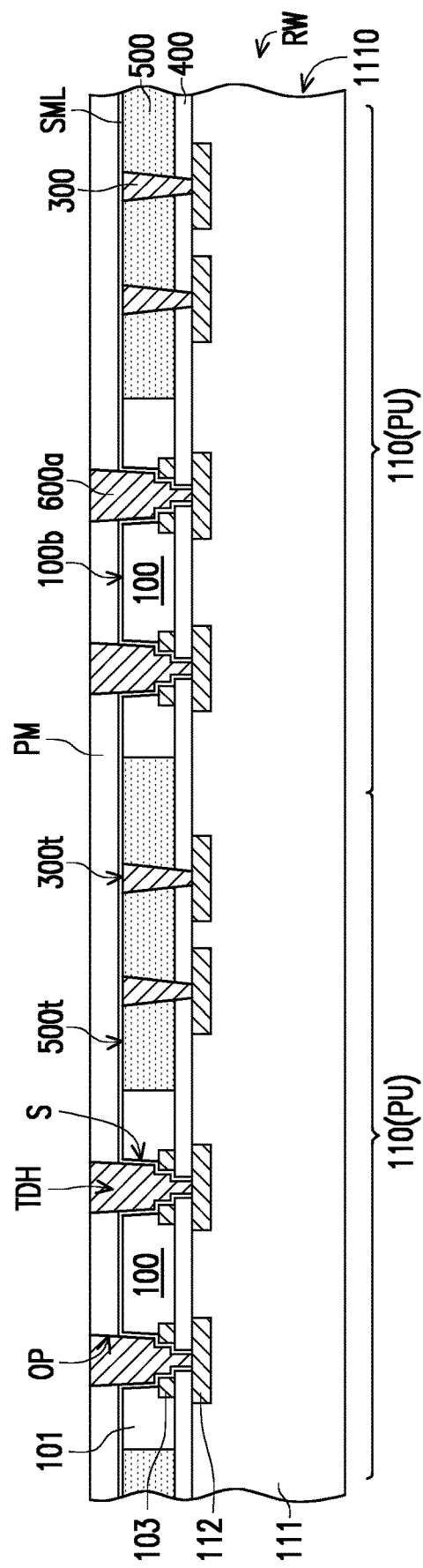
Figure 2G:
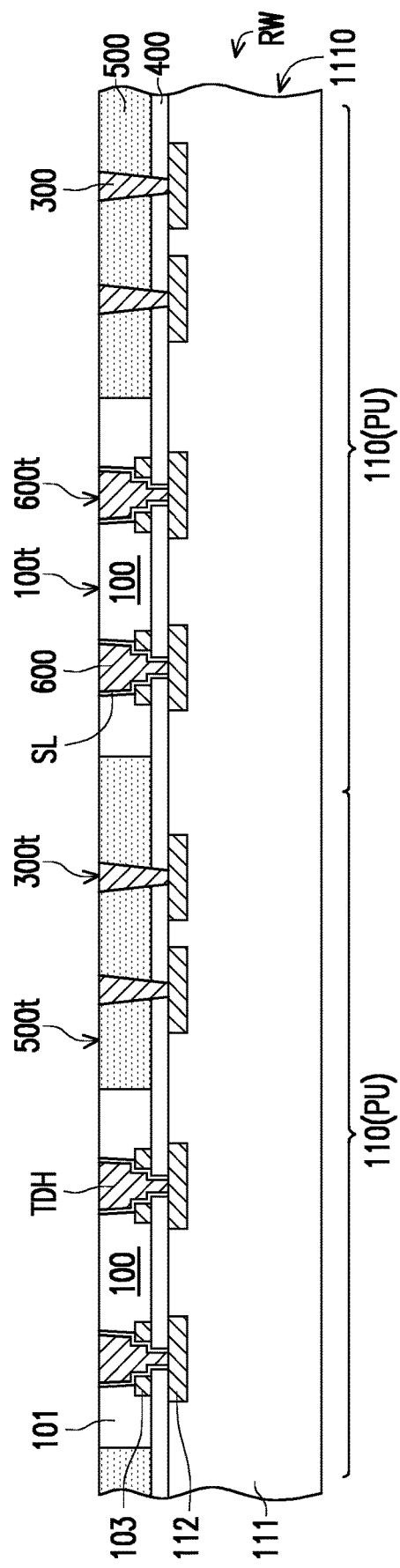
Figure 2H:
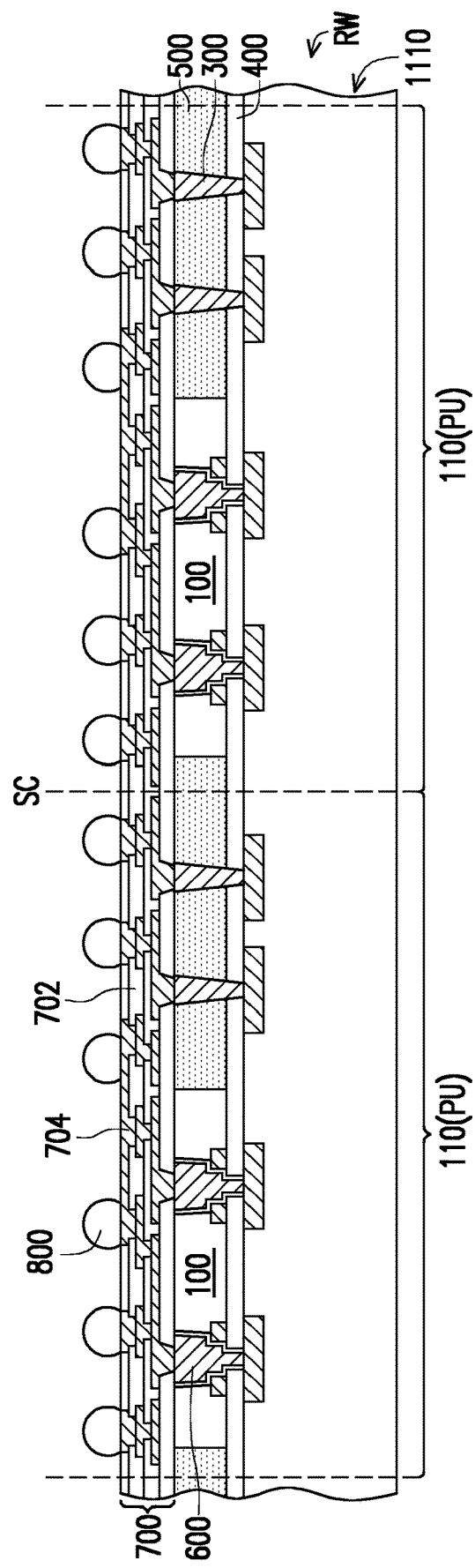
Figure 2I:
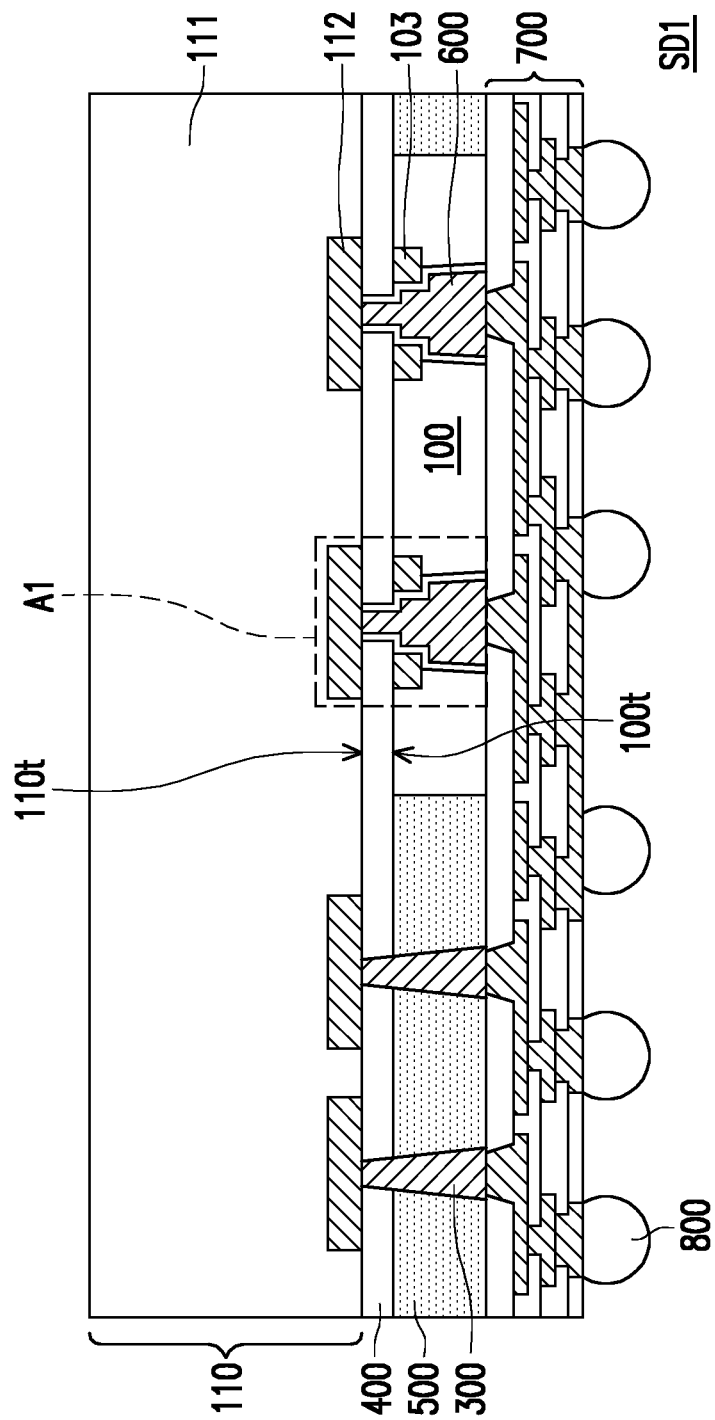

FIG. 1A through FIG. 1B and FIG. 2A through FIG. 2I show schematic cross-sectional views illustrating structures produced at various stages of a manufacturing method of a semiconductor device SD1 shown in FIG. 2I. Referring to FIG. 1A, a semiconductor wafer 1100 is provided. In some embodiments, the semiconductor wafer 1100 may be a silicon bulk wafer. In some embodiments, the semiconductor wafer 1100 may be a wafer made of semiconductor materials, such as semiconductor materials of the groups III-V of the periodic table. In some embodiments, the semiconductor wafer 1100 may include elementary semiconductor materials such as silicon or germanium, compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. The semiconductor wafer 1100 has a plurality of semiconductor dies 100 formed therein, and the dies 100 are parts of the semiconductor wafer 1100 defined by the cut lines C1-C1. The semiconductor wafer 1100 includes a semiconductor substrate 101 and a plurality of conductive pads 102 disposed on a frontside surface 1100t of the semiconductor wafer 1100. In some embodiments, a passivation layer (not shown) covers the frontside surface 1100t of the semiconductor wafer 1100. In FIG. 1A, three dies 100 are shown to represent plural dies 100 formed within the wafer 1100, but the disclosure does not limit the number of dies 100 formed in the wafer 1100. Each of the semiconductor dies 100 may include active components (e.g., transistors or the like) and, optionally, passive components (e.g., resistors, capacitors, inductors, or the like) formed in the semiconductor substrate 101. Each of the semiconductor dies 100 may be or include a logic die, such as a central processing unit (CPU) die, a graphic processing unit (GPU) die, a micro control unit (MCU) die, an input-output (I/O) die, a baseband (BB) die, a memory die (SRAM, DRAM, Flash or the like), IPD die (Integrated Passive Device), or an application processor (AP) die. In some embodiments, a semiconductor die 100 includes a memory die such as a high bandwidth memory die.

Each die 100 may present a plurality of conductive pads 102 exposed on an active surface (top surface) 100t. Each top surface 100t may correspond to a portion of the frontside surface 1100t of the semiconductor wafer 1100. In certain embodiments, the conductive pads 102 include aluminum pads, copper pads, or other suitable metal pads. When included, the passivation layer (not shown) may extend over the frontside surface 1100t of the semiconductor wafer 1100, and may be formed with openings revealing the conductive pads 101. In some embodiments, the passivation layer may be a single layer or a multi-layered structure, including a silicon oxide layer, a silicon nitride layer, a silicon oxy-nitride layer, a dielectric layer formed by other suitable dielectric materials or combinations thereof. The conductive pads 102 may be partially exposed by the openings of the passivation layer. In some embodiments, conductive posts (not shown) may be formed in the opening of the passivation layer (not shown) electrically connected to the conductive pads 102.

Referring to FIG. 1A and FIG. 1B, in some embodiments, the conductive pads 102 are patterned to produce recesses R1 exposing the semiconductor substrate 101. For example, during an etching step, portions of the conductive pads 102 may be removed to form patterned conductive pads 103 which reveal the underlying semiconductor substrate 101. In some embodiments, after producing the patterned conductive pads 103, a singulation step is performed to separate the individual dies 100, for example, by cutting through the semiconductor wafer 1100 along the cut lines C1-C1. In some embodiments, the singulation process typically involves performing a wafer dicing process with a rotating blade and/or a laser beam.

Referring to FIG. 2A, a semiconductor wafer 1110 is provided. The semiconductor wafer 1110 has a plurality of semiconductor dies 110 formed therein, and the dies 110 constitute adjacent portions of the semiconductor wafer 1110 before dicing. Options for the structure of the semiconductor wafer 1110 and the semiconductor dies 110 are similar to the ones described above for the semiconductor wafer 1100 and the dies 100 (shown in FIG. 1A), and a detailed description thereof is omitted for the sake of brevity.

Briefly, each semiconductor die 110 may include a semiconductor substrate 111 and conductive pads 112 disposed on the semiconductor substrate 111 and exposed at an active surface (top surface) 110t of the semiconductor die 110. Each of the semiconductor dies 110 may be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, a semiconductor die 110 includes a memory die such as a high bandwidth memory die. In some embodiments, the semiconductor dies 100 and 110 may be the same type of dies or perform the same functions. In some embodiments, the semiconductor dies 100 and 110 may be different types of dies or perform different functions. For all the embodiments presented herein, the disclosure is not limited by the types of dies included in the semiconductor devices.

Referring to FIG. 2A, a plurality of conductive pillars 300 are formed on the active surfaces 110t of the dies 110. In some embodiments, the conductive pillars 300 may be formed by first forming a mask pattern (not shown) covering the semiconductor wafer 1110 with openings exposing some of the conductive pads 112 of each die 110. Thereafter, a metallic material is filled into the openings by electroplating or deposition. Subsequently, the mask pattern is removed to obtain the conductive pillars 300. However, the disclosure is not limited thereto. Other suitable methods may be utilized in the formation of the conductive pillars 300. In some embodiments, the conductive pillars 300 may be pre-formed pillars or posts which are placed over the conductive pads 112. In some embodiments, the material of the conductive pillars 300 may include a metallic material such as copper, aluminum, platinum, nickel, titanium, tantalum, chromium, gold, silver, tungsten, a combination thereof, or the like. In some embodiments, the conductive pillars 300 are formed on the conductive pads 112 to be electrically connected with the semiconductor dies 110. It should be noted that only two conductive pillars 300 are presented in FIG. 2A for illustrative purposes; however, fewer or more than two conductive pillars 300 may be formed in some alternative embodiments. The number of the conductive pillars 300 may be selected based on design requirements.

In some embodiments, as shown in FIG. 2B, a bonding layer 400 is formed over the top surfaces 110t of the semiconductor dies 110. The bonding layer 400 may blanketly cover the top surface 1110t of the semiconductor wafer 1110 (of which the top surfaces 110t are a part). The conductive pillars 300 may protrude from the bonding layer 400, and only a base portion of a conductive pillar 300 may be wrapped by the bonding layer 400. In some embodiments, the bonding layer 400 includes thermoplastic materials, thermosetting materials, photoactive materials, UV reactive materials, or the like. In some embodiments, the bonding layer 400 is made of an electrically insulating material. In some embodiments, a material of the bonding layer 400 includes polyimide resin, epoxy resin, acrylic resin, phenol resin, benzocyclobutene (BCB), polybenzoxazole (PBO), combinations thereof, or other suitable materials. In some embodiments, the bonding layer 400 may include an inorganic material such as silicon oxide, SiCN and the like such as ceramic adhesives or the like. In some embodiments, the bonding layer 400 is formed by spin coating, lamination, or other suitable techniques. In some embodiments, a thickness of the bonding layer 400 may be less than 1 micrometer, but the disclosure is not limited thereto. It should be noted that whilst FIG. 2A and FIG. 2B show the conductive pillars 300 being formed before the bonding layer 400, the disclosure is not limited thereto. In some alternative embodiments, the bonding layer 400 may be formed before the conductive pillars 300, and a patterning step may be performed to expose the conductive pads 112 over which the conductive pillars 300 are subsequently formed.

Referring to FIG. 2C, in some embodiments, the semiconductor dies 100 are bonded to the semiconductor wafer 1110 via the intervening bonding layer 400. In some embodiments, one semiconductor die 100 is disposed over one semiconductor die 110 besides the conductive pillars 300, in correspondence of the conductive pads 112 which do not have conductive pillars 300 formed on top. In some embodiments, the semiconductor dies 100 and the semiconductor dies 110 are bonded in a face-to-face arrangement, that is, with the respective top surfaces 100t and 110t facing each other (through the interposed bonding layer 400). In some embodiments, the top surfaces 100t of the semiconductor dies 100 may be oriented towards the bonding layer 400 and the backside surfaces 100b may be exposed. In some embodiments, the semiconductor dies 100 are disposed over the semiconductor dies 110 in such a manner that the patterned conductive pads 103 falls over the conductive pads 112 of the semiconductor dies 110. In some embodiments, the recesses R1 open on underlying portions of the bonding layer 400 extending on the conductive pads 112. In some embodiments, the recesses R1 forms cavities defined by the semiconductor substrates 101, the patterned conductive pads 103 and the bonding layer 400. In some embodiments, a span of the conductive pads 112 may be larger than a span of the patterned conductive pads 103 for ease of alignment. However, the disclosure is not limited thereto. In some embodiments, techniques known in the art (e.g., alignment marks) may be used to ensure proper alignment of the semiconductor dies 100 with the semiconductor dies 110. In some embodiments, bonding the semiconductor dies 100 to the semiconductor wafer 1110 may include a curing step. In some embodiments, the curing step includes UV beam curing the bonding layer 400. In some embodiments, the curing step includes thermally curing the bonding layer 400. In some embodiments, a curing temperature of the bonding layer 400 may be 200° C. or less. In some embodiments, bonding the semiconductor dies 100 and 110 at temperatures below 200° C. reduces the thermal stress experienced by porous components of the semiconductor dies (e.g., dielectric layers, low-k dielectric materials, etc.), thus reducing a failure rate during production and increasing the overall process yield.

Referring to FIG. 2C and FIG. 2D, an encapsulant 500 is formed over the semiconductor wafer 1110 to encapsulate the semiconductor dies 100 and the conductive pillars 300. In some embodiments, as shown in FIG. 2D, the encapsulant 500 may extend all over the semiconductor wafer 1110. In some embodiments, a material of the encapsulant 500 includes a molding compound, a molding underfill, a resin (such as an epoxy resin), a combination thereof, or the like. In some embodiments, formation of the encapsulant 500 includes an over-molding process. In some embodiments, forming the encapsulant 500 includes a compression molding process. In some embodiments, an encapsulating material (not shown) is formed over the semiconductor wafer 1110 to at least encapsulate the semiconductor dies 100 and the interconnecting vias 300. In some embodiments, the semiconductor dies 100 and the interconnecting vias 300 are fully covered and not revealed by the encapsulating material. In some embodiments, the encapsulating material is partially removed by a planarization process to form the encapsulant 500. In some embodiments, the planarization process is carried out until top surfaces of the conductive pillars 300 are exposed. In some embodiments, the semiconductor dies 100 may be thinned during the planarization process, and an original thickness T1 (shown in FIG. 2C) may be reduced to a thickness T2 (shown in FIG. 2D). In some embodiments, the thickness T2 may be less than 10 μm, but the disclosure is not limited thereto. Following planarization, the backside surfaces 100b of the semiconductor dies 100 may be substantially coplanar with top surfaces 300t of the conductive pillars 300 and with a top surface 500t of the encapsulant 500. In some embodiments, the planarization of the encapsulating material includes performing a mechanical grinding process, mechanical cutting and/or a chemical mechanical polishing (CMP) process.

With the formation of the encapsulant 500, a reconstructed wafer RW is obtained. In some embodiments, the reconstructed wafer RW includes a plurality of package units PU. In some embodiments, each package unit PU corresponds to a portion of the semiconductor wafer 1110 in which one semiconductor die 110 is formed. In other words, the exemplary process may be performed at a reconstructed wafer level, so that multiple package units PU are processed in the form of the reconstructed wafer RW. In the cross-sectional view of FIG. 2D, two package units PU are shown for simplicity, but, of course, this is for illustrative purposes only, and the disclosure is not limited by the number of package units PU being produced in the reconstructed wafer RW.

Referring to FIG. 2E, in some embodiments through die holes TDH are opened from the backside surfaces 100b of the semiconductor dies 100. In some embodiments, the through dies holes TDH penetrate through the semiconductor substrate 101, reach the first recess R1 formed in the patterned conductive pads 103 and further extend within the bonding layer 400 to expose the conductive pads 112 of the underlying semiconductor dies 110. In some embodiments, the through die holes TDH include the first recess R1 crossing the patterned conductive pads 103, a second recess R2 crossing the semiconductor substrate 101 and a third recess R3 crossing through the bonding layer 400. In some embodiments, a profile of the through die holes TDH may become increasingly narrow proceeding from the backside surface 100b of the semiconductor dies 100 towards the conductive pads 112. In some embodiments, an outline of the second recess R2 may be larger than an outline of the first recess R1, and the outline of the first recess R1 may be larger than an outline of the third recess R3. However, the disclosure is not limited thereto. In some embodiments, inner portions of the semiconductor substrate 101 are exposed following formation of the through die holes TDH. In some embodiments, the through die holes TDH are delimited by the semiconductor substrate 101, the patterned conductive pads 103, the patterned bonding layer 400 and the conductive pads 112. In some embodiments, portions of all these components 101, 103, 400, 112 are exposed by each through die hole TDH. In some embodiments, the through die holes TDH are formed by performing an etching process with a mask pattern (not shown). In some embodiments, the second recess R2 and the third recess R3 may be formed during different etching steps. That is, formation of a through die hole TDH may involve performing a second etching step to form the second recess R2 in the semiconductor substrate 101 and expose the first recess R1, and performing a third etching step to form the third recess R3 in the bonding layer 400, after providing the semiconductor die 100 formed with the first recess R1. In some embodiments, the first recess R1 is formed in the semiconductor die 100 before forming the second recess R2 in the semiconductor die 100 and the third recess R3 in the bonding layer 400. As such, a central portion of the through die holes TDH may be formed before the extremities of the same through die holes TDH. In some embodiments, the order of formation of the recesses R1, R2 and R3 may vary according to production requirements. In some embodiments, the through die holes TDH may be designed to be surrounded by a keep-out zone (not shown) in the semiconductor substrate 101, to prevent damaging active or passive components (e.g., transistors or the like) which may be present within the semiconductor substrate 101 during opening of the through die holes TDH.

Referring to FIG. 2F, in some embodiments, a seed material layer SML is blanketly formed on the exposed backside surfaces 100b of the semiconductor dies 100 and the top surface 500t of the encapsulant 500. In some embodiments, the seed material layer SML is formed directly on the exposed backside surfaces 100b of the semiconductor dies 100, and may be conformally disposed within the through die holes TDH. That is, the seed material layer SML may be disposed along the sidewalls S of the through die hole TDH, over portions of the semiconductor substrate 101, the patterned conductive pads 103, the patterned bonding layer 400 and the conductive pads 112. The seed material layer SML may be formed through, for example, a sputtering process, a physical vapor deposition (PVD) process, or the like. In some embodiments, the seed material layer SML includes copper, tantalum, titanium, a combination thereof, or other suitable materials. In some embodiments, a barrier layer (not shown) may be deposited before forming the seed material layer SML to prevent out-diffusion of the material of the seed material layer SML.

In some embodiments, a patterned mask PM is disposed over the seed material layer SML. The patterned mask PM may include openings OP exposing the through die holes TDH. In some embodiments, outlines of the openings OP of the patterned mask PM may be aligned with and correspond in shape and size to outlines of the underlying through die holes TDH at a level of the backside surfaces 100b of the semiconductor dies 100. In some embodiments, the patterned mask PM is produced over the semiconductor dies 100 and the encapsulant 500 by a sequence of deposition, photolithography and etching. A material of the patterned mask PM may include a positive photoresist or a negative photoresist. In some alternative embodiments, the patterned mask PM is a pre-fabricated mask which is placed on the seed material layer SLM.

In some embodiments, the through die holes TDH are filled with a conductive material to form through die vias 600a. In some embodiments, the through die vias 600a may include a metallic material such as copper, aluminum, platinum, nickel, titanium, tantalum, chromium, gold, silver, tungsten, a combination thereof, or the like. In some embodiments, the conductive material 600a is formed on the portions of the seed material layer SLM exposed by the patterned mask PM by electroplating, electroless plating, physical vapor deposition, chemical vapor deposition, or the like. Referring to FIG. 2F and FIG. 2G, in some embodiments, the patterned mask PM and the underlying portions of seed material layer SML may be removed. A material of the through die vias 600a may be different from a material of the seed material layer SLM, allowing to remove the exposed portions of the seed material layer SLM, for example, during a selective etching step to form a seed layer SL. In some embodiments, the seed layer SL is an optional part of a through die a 600a. In some embodiments, if the through die vias 600a originally formed protrude from the semiconductor dies 100, a planarization step may be included to ensure the top surfaces 600t of the through die vias 600 are substantially coplanar with the backside surfaces 100b of the semiconductor dies 100, the top surface 500t of the encapsulant 500 and the top surfaces 300t of the conductive pillars 300. The through die vias 600 may establish electrical connection between the semiconductor dies 110 and the semiconductor dies 100, by being in direct physical contact with the patterned conductive pads 103 and the conductive pads 112. In some embodiments, because the through die vias 600 cross through the patterned conductive pads 103 and contact the underlying conductive pads 112, a bump-less connection may be established between the semiconductor die 100 and the underlying semiconductor die 110. That is, the semiconductor dies 100 and 110 may be interconnected by the through die vias 600 without requiring additional connectors (e.g., bumps, microbumps, posts, solder joints, etc.), thus overcoming pitch scaling issues encountered, for example, when using microbumps. In some embodiments, the bump-less connection may be reliably established also if the semiconductor wafer 1110 present a certain degree of warping, thus alleviating warpage-originated issues during the manufacturing process which may be encountered when additional connectors (e.g., bumps) are used. In some embodiments, the through die vias 600 may provide a low-resistance interconnection between the semiconductor dies 100 and 110, increasing the package reliability and reducing the power consumption. Furthermore, because the top surfaces 600t of the through die vias 600 are exposed on the backside surfaces 100b of the semiconductor dies 100, the through die vias 600 may be used to provide dual-side vertical connection for the semiconductor dies 100.

In some embodiments, referring to FIG. 2H, a redistribution structure 700 is formed over the semiconductor dies 100. In some embodiments, the redistribution structure 700 is disposed over the encapsulant 500. In some embodiments, the redistribution structure 700 includes a dielectric layer 702, and interconnected redistribution conductive layers 704. The redistribution conductive layers 704 may include a plurality of redistribution conductive patterns. For simplicity, the dielectric layer 702 is illustrated as one single dielectric layer and the redistribution conductive layers 704 are illustrated as embedded in the dielectric layer 702 in FIG. 2H. Nevertheless, from the perspective of the manufacturing process, the dielectric layer 702 may include multiple dielectric layers, and each redistribution conductive layer 704 may be sandwiched between two adjacent dielectric layers. Portions of the redistribution conductive layers 704 may extend vertically within the dielectric layer 702 to establish electrical connection with other overlying or underlying redistribution conductive layers 704. Parts of the topmost redistribution conductive layer 704 may be exposed to serve the purpose of electrical connection with other components subsequently formed. In some embodiments, a material of the redistribution conductive layers 704 includes aluminum, titanium, copper, nickel, tungsten, combinations thereof, or other suitable conductive materials. The redistribution conductive layers 704 may be formed by, for example, electroplating, deposition, and/or photolithography and etching. In some embodiments, the material of the dielectric layer 702 includes polyimide, epoxy resin, acrylic resin, phenol resin, benzocyclobutene (BCB), polybenzoxazole (PBO), or any other suitable polymer-based dielectric material. The dielectric layer 702, for example, may be formed by suitable fabrication techniques such as spin-on coating, chemical vapor deposition (CVD), plasma-enhanced chemical vapor deposition (PECVD), or the like. It should be noted that the number of the redistribution conductive layers 704 and the number of the dielectric layers 702 illustrated in FIG. 2H are merely for illustrative purposes, and the disclosure is not limited thereto. In some alternative embodiments, the number of redistribution conductive layers 704 and the number of dielectric layers 702 may be varied depending on the circuit design. In some embodiments, the redistribution conductive layers 704 physically contact the through die vias 600 and the conductive pillars 300 to establish electrical connection with the semiconductor dies 100 and 110.

In some embodiments, connectors 800 may be formed on the exposed portions of the redistribution conductive patterns 720. The connectors 800 may include solder balls, ball grid array (BGA) connectors, metal pillars, controlled collapse chip connection (C4) bumps, micro bumps, bumps formed via electroless nickel—electroless palladium—immersion gold technique (ENEPIG), a combination thereof (e.g, a metal pillar with a solder ball attached), or the like. In some embodiments, under-bump metallurgies (not shown) are optionally formed between the connectors 800 and the topmost redistribution conductive patterns 720. In some embodiments, the connectors 800 may be used to electrically connect the semiconductor dies 100, 110 to larger devices (not shown).

In some embodiments, referring to FIGS. 2H and 2I, a singulation step is performed to separate the individual semiconductor devices SD1, for example, by cutting through the reconstructed wafer RW along the scribing lanes SC arranged between individual package units PU. In some embodiments, adjacent semiconductor devices SD1 may be separated by cutting through the scribing lanes SC of the reconstructed wafer RW. In some embodiments, the singulation process typically involves performing a wafer dicing process with a rotating blade and/or a laser beam.

After the singulation step, a plurality of semiconductor devices SD1 are obtained. A schematic cross-sectional view of the semiconductor device SD1 according to some embodiments of the disclosure is illustrated in FIG. 2I. The semiconductor device SD1 includes the semiconductor dies 100 and 110 interconnected by the through die vias 600. The semiconductor dies 100 and 110 may be disposed in a face-to-face configuration with the active surfaces 100$t$, 110$t$ facing each other. In some embodiments, the bonding layer 400 is disposed over the active surface 110$t$ of the semiconductor die 110, and separates the active surfaces 100$t$, 110$t$ of the two semiconductor dies 100, 110. The through die vias 600 may be embedded in the semiconductor substrate 101 of the semiconductor die 100, cross through the patterned conductive pads 103, and reach the conductive pads 112 of the semiconductor die 110. A footprint of the semiconductor die 100 may be smaller than a footprint of the semiconductor die 110, so that only portion of the active surface 110$t$ may be occupied by the semiconductor die 100. An encapsulant 500 may be disposed beside the semiconductor die 100, and the semiconductor die 100 may be wrapped by the encapsulant 500. In some embodiments, conductive pillars 300 may extend through the encapsulant 500 and the bonding layer 400 to contact conductive pads 112 of the semiconductor die 110. In some embodiments, the conductive pillars 300 are disposed beside the semiconductor die 100. In some embodiments, the conductive pillars 300 are disposed around the semiconductor die 100. A redistribution structure 700 may be formed over the encapsulant 500 and the semiconductor die 100. The redistribution structure 700 may be electrically connected to the semiconductor die 100 via the through die vias 600. In some embodiments, the through die vias 600 electrically connect the semiconductor dies 100 and 110 with the redistribution structure 700. In some embodiments, the conductive pillars 300 establish an additional connection route for the semiconductor die 110 with the redistribution structure 700.

In some embodiments, the through die vias 600 may directly interconnect the semiconductor dies 100 and 110. That is, the semiconductor dies 100, 110 may be connected using no additional connectors (e.g., bumps, microbumps, posts, solder joints, etc.) beside the through die vias 600. In some embodiments, the bump-less connection between the semiconductor dies 100, 110 increases the package reliability and reduces the power consumption. In some embodiments, because the semiconductor dies 100, 110 may be bonded together via the bonding layer 400 without requiring soldering of connectors, a bonding step of the semiconductor dies 100, 110 may happen at a relatively low temperature, thus avoiding thermal or mechanical stress arising from mismatching coefficients of thermal expansions or the like. Therefore, damages to temperature-sensitive parts (e.g., porous dielectric) may be prevented, a failure rate may be reduced, and overall yields may be increased, thus lowering the unitary manufacturing cost of the produced semiconductor devices.

According to some embodiments, through the connectors 800, the semiconductor device SD1 may be connected to a circuit substrate 900 such as a motherboard, a printed circuit board, or the like, as shown in FIG. 2J.

In FIG. 3A through FIG. 3E are shown schematic cross-sectional views of a portion of semiconductor devices according to some embodiments of the disclosure. The portions of semiconductor device shown in FIG. 3A through FIG. 3E may correspond to the area A1 shown in FIG. 2I for the semiconductor device SD1. In the cross-sectional views of FIG. 3A through FIG. 3E are illustrated some features of the die interconnection established by the through die vias 600 according to some embodiments of the disclosure. It is remarked that the cross-sectional views may be not in scale to highlight some particular features or dimensions, and that some optional elements (e.g., the seed layer SL shown in FIG. 2G) may not be shown for the sake of simplicity. Furthermore, for the sake of simplicity the following description will refer to bi-dimensional quantities (widths, angles, and so on) to describe features of the die interconnection along certain cross-sectional views. It is to be intended that the interconnection is not required to have any particular symmetry (e.g. cylindrical symmetry), and that the described spatial relationships may be encountered in one or more plains of view, but not necessarily in all of them. The portion of semiconductor die 100 shown in FIG. 3A through FIG. 3E is shown in its entire thickness T100 (corresponding to T2 in FIG. 2D). Therefore, a portion of the backside surface 100$b$ and the top surface 600$t$ of the through die vias 600 are also illustrated in FIG. 3A through FIG. 3E. In some embodiments, the schematic cross-sectional views of FIG. 3A through FIG. 3E are taken along a plane passing through a central part (a central axis) of the through die via 600.

Figure 3A:
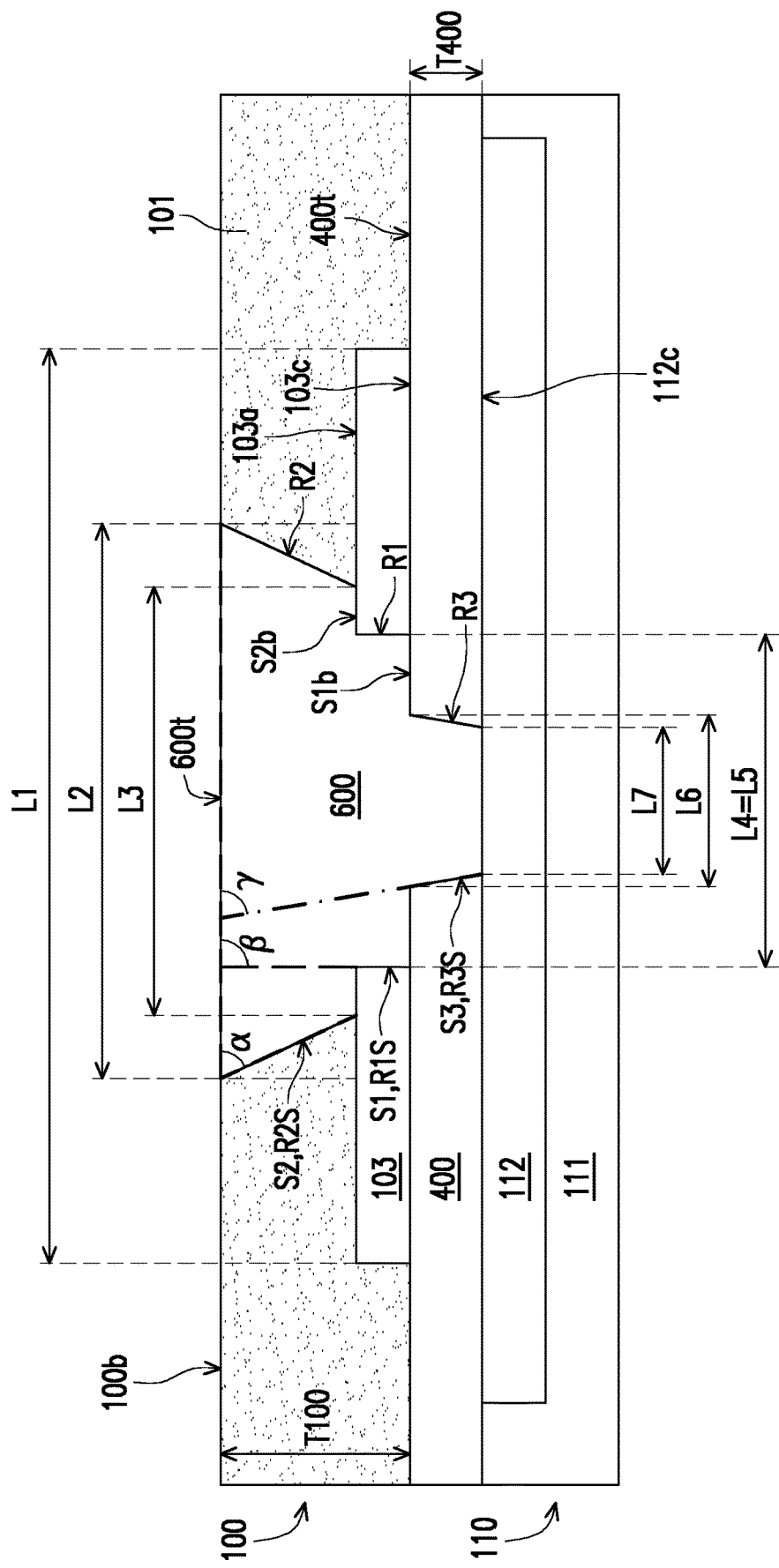
FIG. 3A through FIG. 3E show schematic cross-sectional views of portions of semiconductor devices according to some embodiments of the present disclosure.

In FIG. 3A, a width of the footprint of the patterned conductive pad 103 over the bonding layer 400 is described as a first dimension L1. In some embodiments, a width of the through die via 600 at the level of the backside surface 100*b* of the semiconductor die 100 may be considered a second dimension L2. In some embodiments, the second dimension L2 may be considered a width of the through die via 600 at the top of the second recess R2 (where the side surface S2 of the portion of the through die via 600 in the second recess R2 joins the top surface 600*t*). In some embodiments, the second dimension L2 may be smaller than the first dimension L1. In some embodiments, the second dimension L2 may be up to about 50% of L1. In some embodiments, the second dimension L2 being smaller than the first dimension L1 may facilitate alignment during the etching step to open the second recess R2, thus ensuring that the second recess R2 opens over the first recess R1. In some embodiments, a width of the through die via 600 at the bottom of the second recess R2 (at the level of the interface between the semiconductor substrate 101 and a first surface 103*a* of the patterned conductive pad 103 closer to the backside surface 100*b*; where the side surface S2 contacts the patterned conductive pad 103) may be considered a third dimension L3. In some embodiments, the third dimension L3 may be smaller than the second dimension L2. That is, the side surfaces S2 of the portion of the through die via 600 disposed in the second recess R2 may be inclined at an angle α other than π/2 radians with respect to the top surface 600*t* of the through die via 600. In some embodiments, the top surface 600*t* is considered the surface of the through die via 600 further away from the bonding layer 400. In some embodiments, the side surfaces S2 of the through die via 600 in the second recess R2 may coincide with side surfaces R2S of the second recess R2. In some embodiments, inclined side surfaces R2S of the second recess R2 may alleviate alignment issues with respect to the first recess R1 when the first recess R1 is opened before the second recess R2. In some embodiments, the angle α may be in the range from π/3 to π/2 radians. In some embodiments, if the angle α is π/2 radians the portion of the through die via 600 within the second recess R2 has a substantially vertical profile, and the second dimension L2 is about equal to the third dimension L3 (as shown, for example, in FIG. 3B).

Figure 3B:
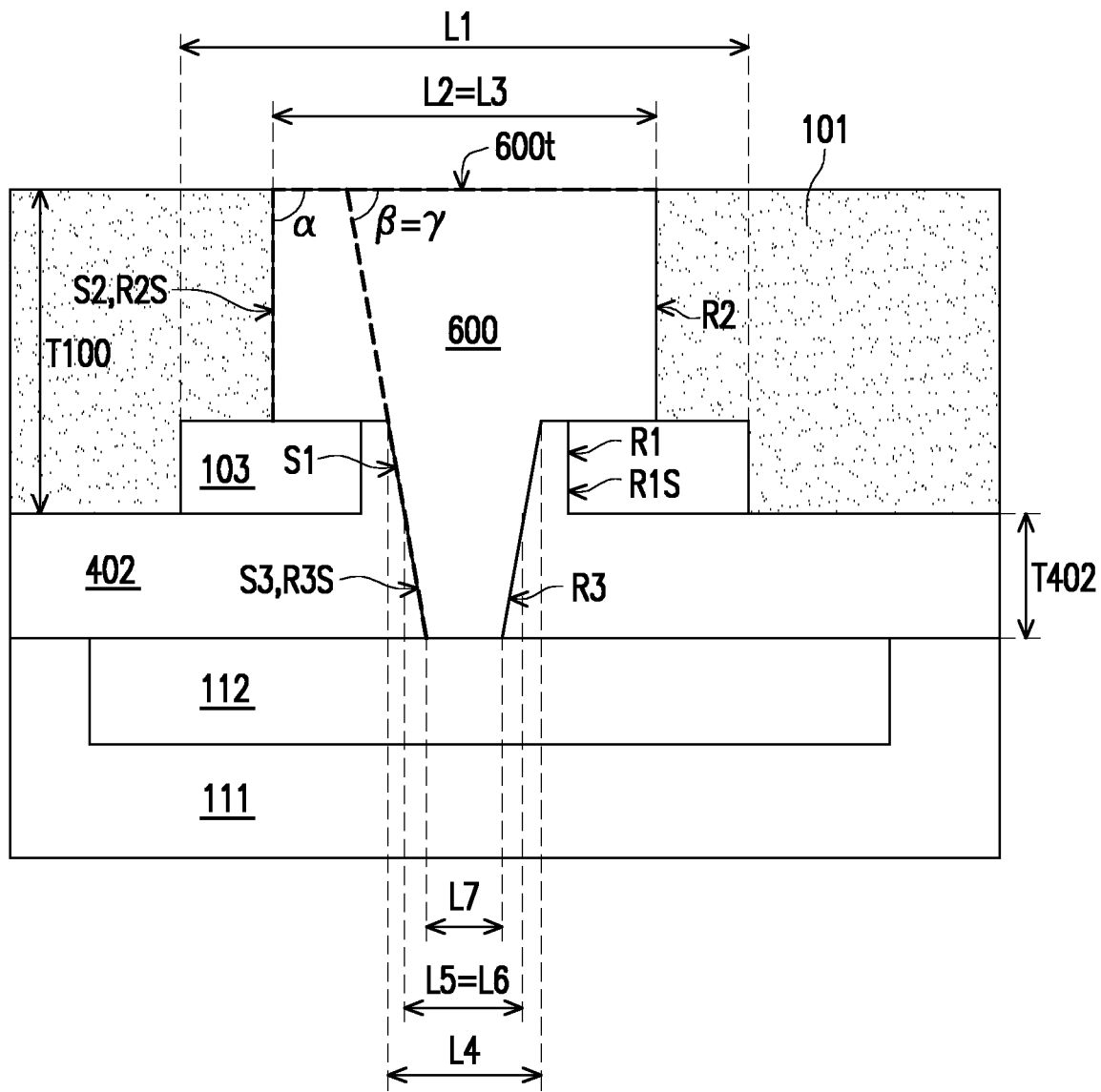
Figure 3C:
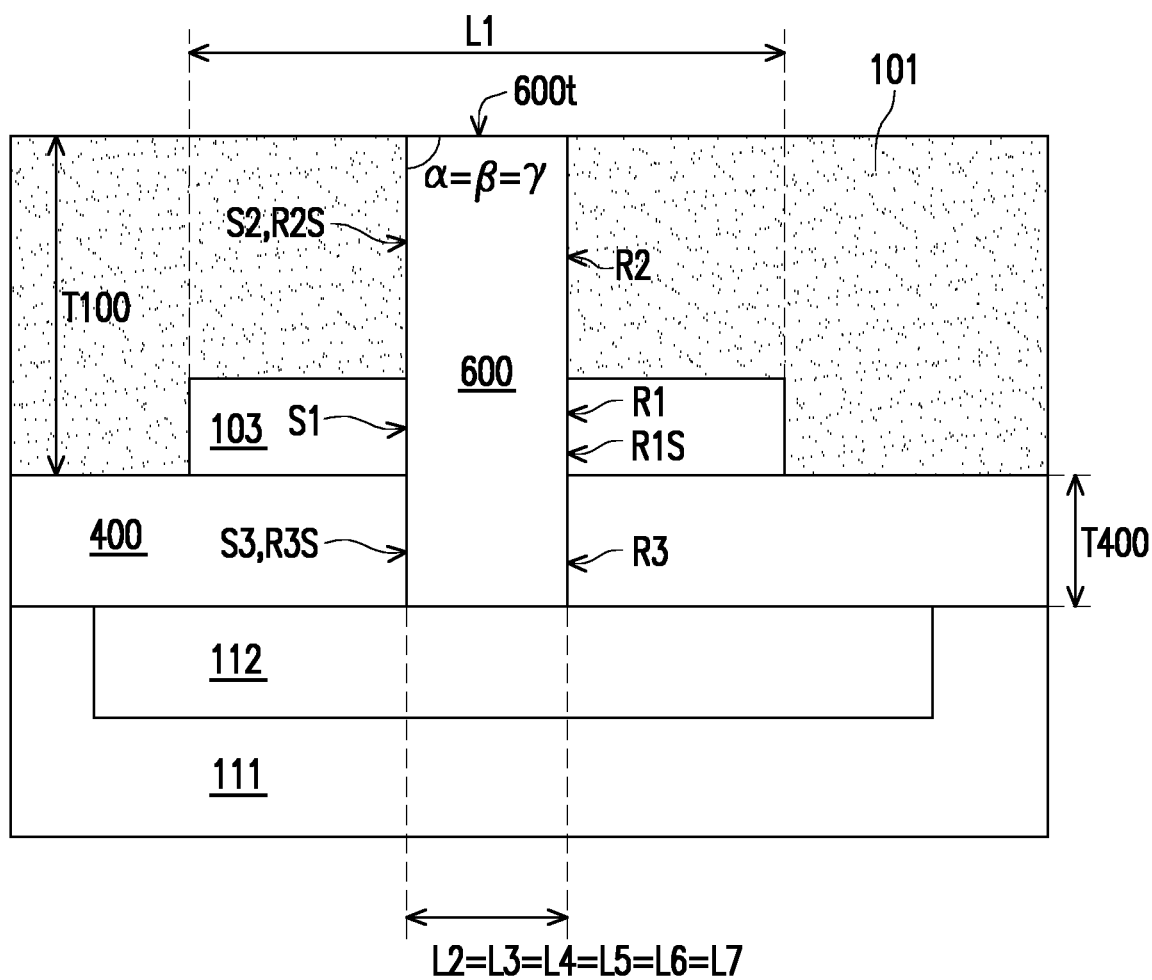
Figure 3D:
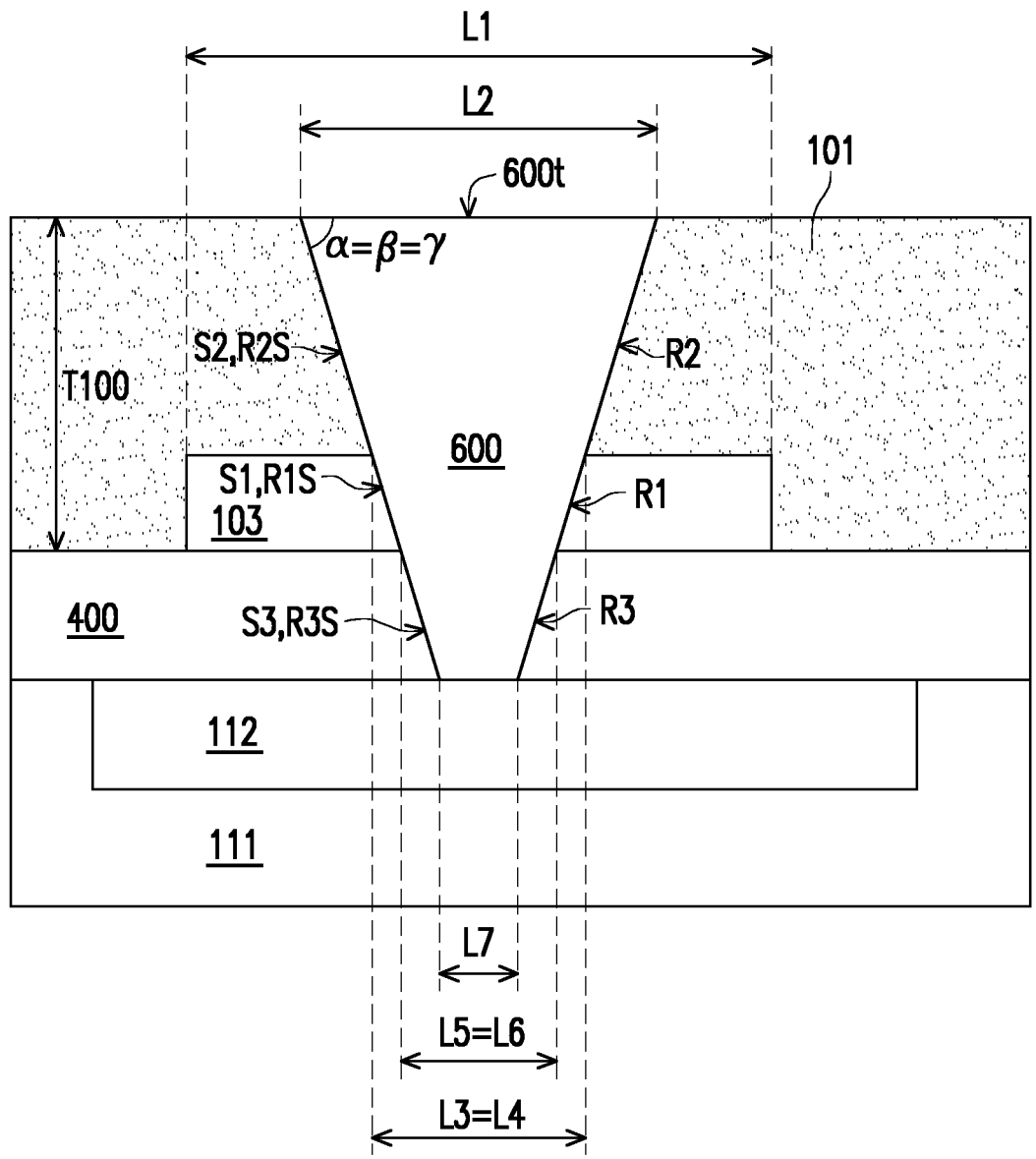
Figure 3E:
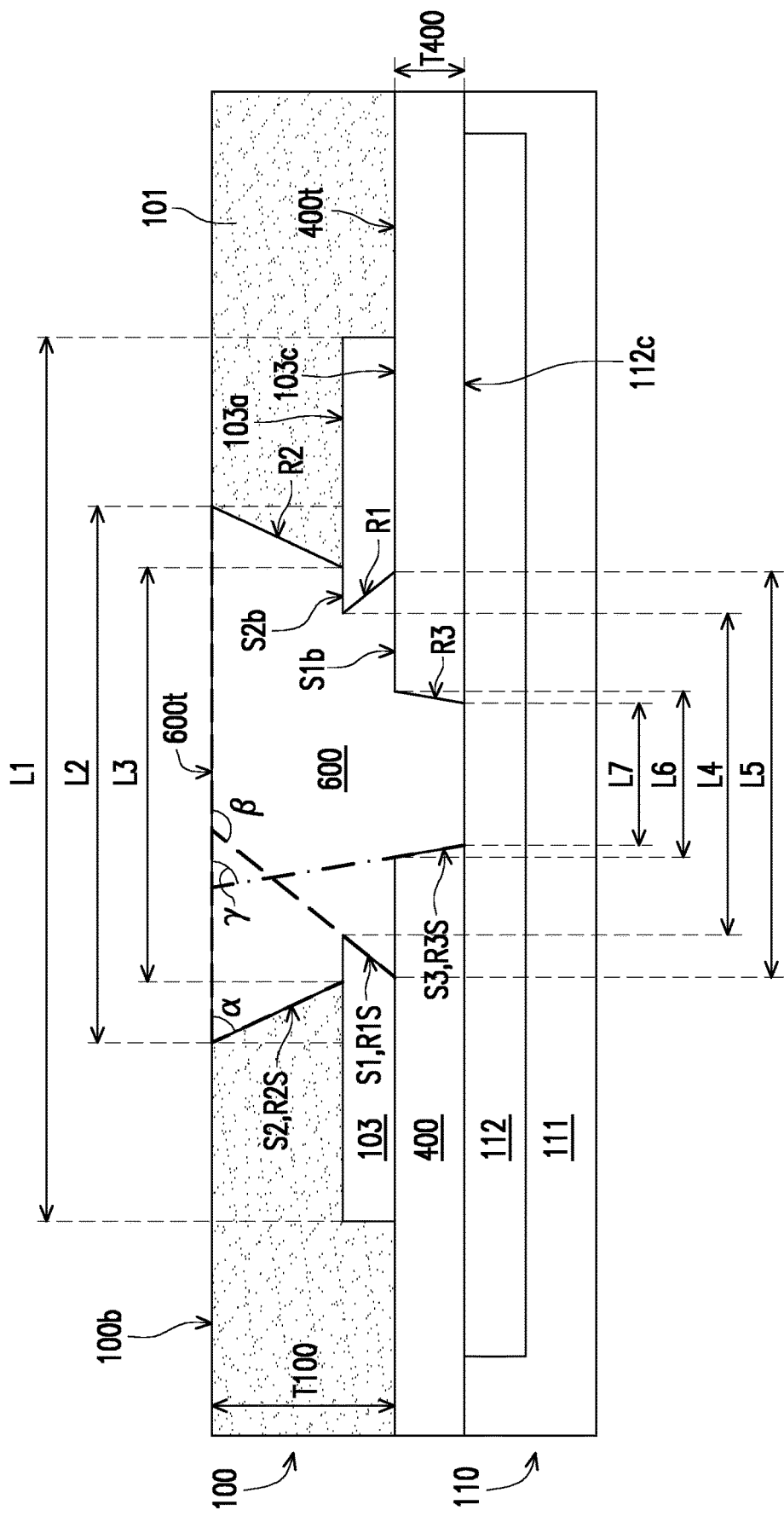

In some embodiments, a fourth dimension L4 may correspond to a width of the through die via 600 at the top of the first recess R1 (at a level where the first surface 103*a* joins a side surface R1S of the first recess; where the side surface S1 of the through die via 600 in the first recess R1 joins the side surface S2 or a surface S2*b*, if present). For the sake of clarity, it is remarked here that what are called "top of the first recess R1" and "bottom of the first recess R1" in the context of the description of FIG. 3A, may be respectively considered "bottom of the first recess R1" and a "top of the first recess R1" in the context of the descriptions of FIG. 1B or FIG. 2C. As shown in FIG. 3A, even though the second recess R2 is formed on the first recess R1, the fourth dimension L4 is not necessarily equal to the third dimension L3. That is, the side surface S2 of the through die vias 600 in the second recess R2 may land on the patterned conductive pad 103, and a surface S2*b* of the through die vias 600 may lie at the bottom of the second recess R2, extending over a surface 103*a* of the patterned conductive pad 103 further away from the bonding layer 400. That is, the side surface S2 of the through die via 600 in the second recess R2 and the side surface S1 of through die via 600 in the first recess R1 may be separated by the surface S2*b* at the bottom of the second recess R2. In some embodiments, as shown in FIG. 3A, the fourth dimension L4 may coincide with a width of the first recess R1 of the patterned conductive pad 103. In some alternative embodiments, a portion of the bonding layer 402 may extend within the first recess R1, and the fourth dimension L4 may not coincide with a width of an opening of the patterned conductive pad 103, as shown, for example, in FIG. 3B. In these embodiments, the side surface S1 of the portion of the through die via 600 extending through the first recess R1 may not coincide with a side surface R1S of the first recess R1. In some embodiments, the side surfaces S1 and the side surface R1S run not parallel with respect to each other, as shown, for example, in FIG. 3B. However, the disclosure is not limited thereto. In some alternative embodiments, the side surface R1S of the first recess R1 and the side surface S1 of the through die via 600 within the first recess R1 may still not coincide while running parallel with respect to each other. In some embodiments, when the bonding layer 400 extends within the first recess R1 the through die via 600 may contact the patterned conductive pad 103 in correspondence of the first surface 103*a*. In some embodiments, the third dimension L3 may be equal to the fourth dimension L4 (as shown, for example, in FIG. 3C and in FIG. 3D), and the side surface S2 of the through die via 600 in the second recess R2 may directly contact (be contiguous with) the side surface S1 of the through die via 600 in the first recess R1. That is, the through die via 600 may not include the surface S2*b* at the bottom of the second recess R2. In the embodiments of FIG. 3C and FIG. 3D in which L3 is equal to L4, electrical contact between the through die via 600 and the patterned contact pad 103 is mostly established within the first recess R1, along the side surface S1.

In some embodiments, a width of the through die via 600 at the bottom of the first recess R1 (at the level where the side surface RS1 of the first recess R1 joins a second surface 103*c* opposite to the first surface 103*a*) may correspond to a fifth dimension L5. In the structure illustrated in FIG. 3A, the fourth dimension L4 is equal to the fifth dimension L5, and an angle β between an imaginary extension of the side surface S1 of the through die via 600 in the first recess R1 and the top surface 600*t* of the through die via 600 is about π/2 radians, but the disclosure is not limited thereto. In some embodiments, the fourth dimension L4 may be different from the fifth dimension L5 (as shown, for example, in FIG. 3B and in FIG. 3D), and the angle β may be in the range from π/2 to 5π/9. Because the first recess R1 and the second recess R2 are opened from opposite etching directions, the first recess R1 may broaden proceeding toward the bonding layer 400 from the top surface 600*t*, as shown, for example, in FIG. 3E. In some embodiments, the angle β may be greater than π/2 radians and the through die via 600 may also broaden proceeding toward the bonding layer 400 from the top surface 600*t*. That is, a width L4 of the through die via 600 at the top of the first recess R1 (closer to the second recess R2) may be larger than a width L5 at the bottom of the recess R1 (closer to the third recess R3). Even when the side surfaces S1 and S2 of the through die via 600 in the recesses R1 and R2 are contiguous (i.e., they are not separated by the surface S2*b* at the bottom of the second recess R2), the angles α and β may be different. In some alternative embodiments, the angles α and β may be the same, and the side surfaces S1 and S2 may describe a continuous surface (as shown, for example, in FIG. 3C and FIG. 3D).

In some embodiments, a sixth dimension L6 may correspond to the width of the through die via 600 at the top of the bonding layer 400 (at the level where the side surface RS3 of the third recess R3 joins a top surface 400t of the bonding layer 400 closer to the backside surface 100b of the semiconductor die 100). As shown in FIG. 3A, even though the first recess R1 is formed on the third recess R3, the sixth dimension L6 is not necessarily equal to the fifth dimension L5. That is, the side surface S1 of the first recess R1 (and the side surface S1a of the through die via 600 in the first recess R1) may land on the bonding layer 400, and a surface S1b of the through die via 600 at the bottom of first recess R1 may extend over the top surface 400t of the bonding layer 400. That is, the side surface S1 of the through die via 600 in the first recess R1 and the side surface S3 of the through die via 600 in the third recess R3 may be separated by the surface S1b at the bottom of the first recess R1. In some alternative embodiments, the fifth dimension L5 may be equal to the sixth dimension L6 (as shown, for example, in FIG. 3B through FIG. 3D), and the side surface S1 of the through die via 600 in the first recess R1 may directly contact (be contiguous with) the side surface S3 of the through die via 600 in the third recess R3.

In some embodiments, a width of the through die via 600 at the bottom of the third recess R3 in contact with the conductive pad 112 (at the interface between the conductive pad 112 and the bonding layer 400; where the side surface R3S of the third recess joins a bottom surface 400b of the bonding layer 400 closer to the conductive pad 112) may correspond to a seventh dimension L7. In some embodiments, the seventh dimension L7 may be smaller than the sixth dimension L6. That is, the through die via 600 in the third recess R3 may have side surfaces S3 inclined at an angle γ other than π/2 radians with respect to the top surface 600t of the through die via 600. In some embodiments, a range of the angle γ may be similar to the range for the angle α described above. In some embodiments, if the angle α is π/2 radians the through die via 600 in the third recess R3 has a substantially vertical profile, and the sixth dimension L6 is about equal to the seventh dimension L7 (as shown, for example, in FIG. 3C). Even when the two side surfaces S1 and S3 are contiguous (i.e., they are not separated by the surface R1b of the through die via 600 at the bottom the first recess R1), the angles β and γ may be different. In some alternative embodiments, the angles β and γ may be the same, and the contiguous side surfaces S1 and S3 may describe a continuous surface (as shown, for example, in FIG. 3B through FIG. 3D).

In some embodiments, a thickness T400 of the bonding layer 400 may be in the range from 0.1 to 1 micrometer. In some embodiments, when the semiconductor dies 100, 110 are bonded face-to-face, the thickness T400 of the bonding layer 400 is measured as the distance between closest facing surfaces of the patterned conductive pads 103 and the conductive pads 112. For the semiconductor die 100, the closest facing surface may correspond to the surface 103c of the patterned conductive pads 103. Similarly, for the semiconductor die 110 the closest facing surface may correspond to the surface 112c of the conductive pad 112 further away from the backside surface 110b (shown in FIG. 2D) of the semiconductor die 110 (the surface 112c of the conductive pads 112 facing the bottom surface 400b of the bonding layer 400). This means that in the embodiments in which the bonding layer 402 extends within the first recess R1 (as shown in FIG. 3B, for example), the portions of the bonding layer 402 extending within the first recess R1 are not considered when evaluating the thickness T402 of the bonding layer 402.

Figure 4:
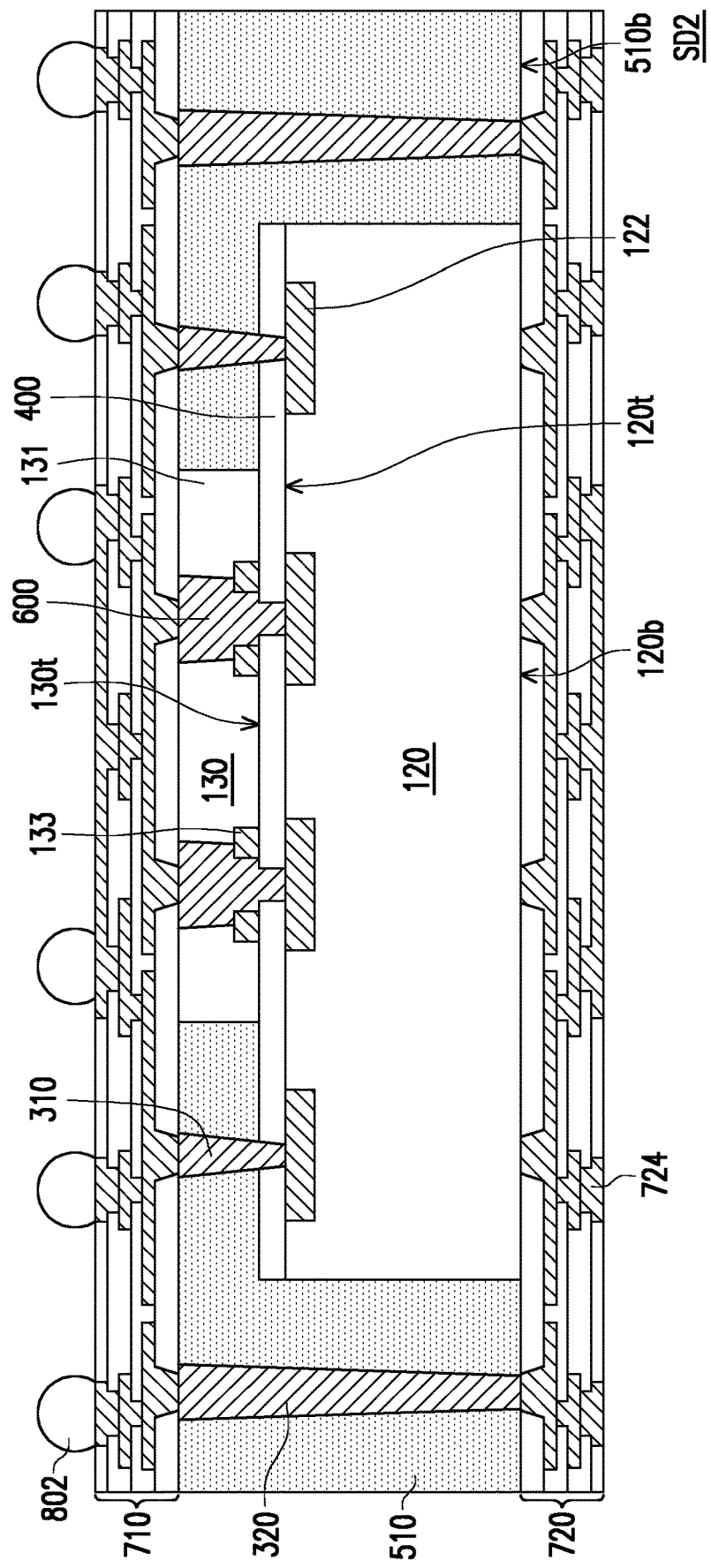
FIG. 4 shows a schematic cross-sectional view of a semiconductor device according to some embodiments of the disclosure.

In FIG. 4 is shown a schematic cross-sectional view of a semiconductor device SD2 according to some embodiments of the disclosure. The semiconductor device SD2 of FIG. 4 may contain similar components to the semiconductor device SD1 of FIG. 2I, and the same or similar reference numerals are used to indicate analogous components between the two devices SD1 and SD2. In the semiconductor device SD2, the semiconductor die 120 is bonded to the overlying semiconductor die 130 in a face-to-face configuration (with respective top surfaces 120t, 130t facing each other) via the intervening bonding layer 400. The semiconductor dies 120 and 130 are interconnected by through die vias 600 which extend through the semiconductor substrate 131 and the patterned conductive pads 133 of the semiconductor die 130, and through the bonding layer 400, to establish electrical communication with the conductive pads 122 of the semiconductor die 120. In some embodiments, the encapsulant 510 wraps the semiconductor dies 120, 130, and the bonding layer 400. In some embodiments, a first redistribution structure 710 extends over the semiconductor die 130 and the encapsulant 500, and is directly connected to the through die vias 600. In some embodiments, conductive pillars 310 are disposed on the semiconductor die 120 besides the semiconductor die 130, and establish electrical connection between some conductive pads 122 of the semiconductor die 120 and the first redistribution structure 710. In some embodiments, the semiconductor die 120 may be connected to the first redistribution structure 710 via the conductive pillars 310 and the through die vias 600. In some embodiments, the conductive pillars 310 cross the bonding layer 400 to reach the conductive pads 122. That is, the bonding layer 400 may extend also on portions of the top surface 120t of the semiconductor die 120 not occupied by the semiconductor die 130. In some embodiments, connectors 802 may be disposed on the first redistribution structure 710 to integrate the semiconductor device SD2 within larger devices (not shown). In some embodiments, a second redistribution structure 720 may extend on a backside surface 120b of the semiconductor die 120 and on a bottom surface 510b of the encapsulant 510 further away from the first redistribution structure 710. The second redistribution structure 720 may be connected to the first redistribution structure 710 via conductive pillars 320 extending through the encapsulant 510. In some embodiments, the second redistribution structure 720 may have exposed conductive patterns 724 available for connection with other semiconductor devices (not shown). That is, the first redistribution structure 710, the second redistribution structure 720 and the conductive pillars 320 may provide dual-side vertical connection for the semiconductor device SD2.

Figure 5A:
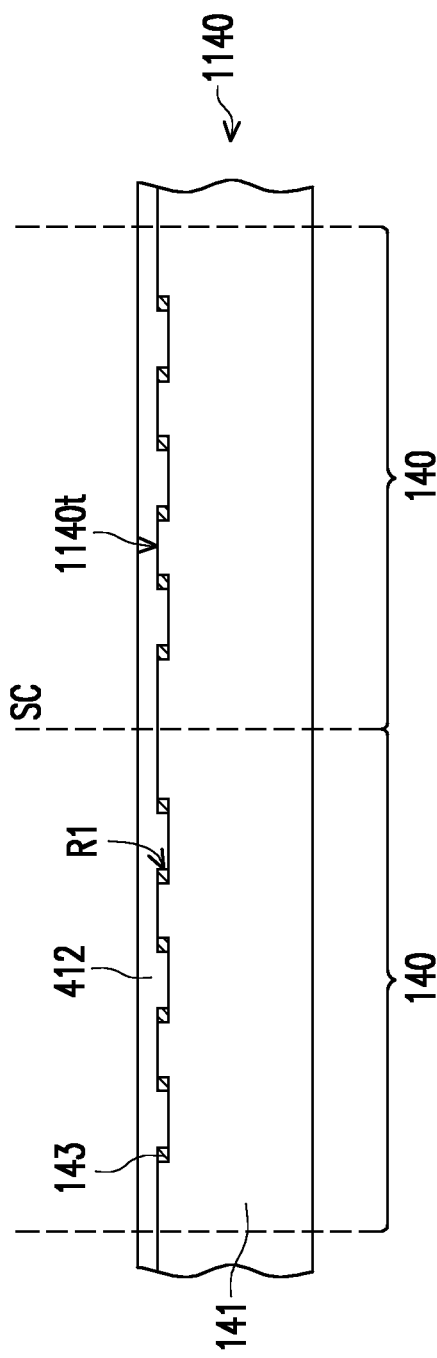
FIG. 5A through FIG. 5H show schematic cross-sectional views of structures produced at various stages of a manufacturing method of a semiconductor device according to some embodiments of the present disclosure.

FIG. 5A through FIG. 5H show schematic cross-sectional views of structures produced during a manufacturing method of a semiconductor device SD3 (shown in FIG. 5H) according to some embodiments of the disclosure. In FIG. 5A, a semiconductor wafer 1140 is shown having semiconductor dies 140 formed therein. In some embodiments, the semiconductor wafer 1140 may be formed by providing a first bonding layer 412 over a top surface 1140t of a manufacturing intermediate produced in a similar fashion to what previously described for the semiconductor wafer 1100 with reference to FIG. 1A and FIG. 1B. Briefly, an etching step may be performed to produce patterned conductive pads 143 in the semiconductor dies 140 having recesses R1 exposing the underlying semiconductor substrate 141. The first bonding layer 412 may be disposed over the top surface 1140t of the semiconductor wafer 1140, filling the recesses R1 formed in the patterned conductive pads 143. The first bonding layer 412 may include similar materials and be produced with similar steps as previously described for the bonding layer 400 with reference to FIG. 2B, and a detailed description thereof is omitted herein for the sake of brevity. After formation of the first bonding layer 412, the semiconductor wafer 1140 may be subjected to a singulation step along the cut lines SC to produce individual semiconductor dies 140.

Figure 5B:
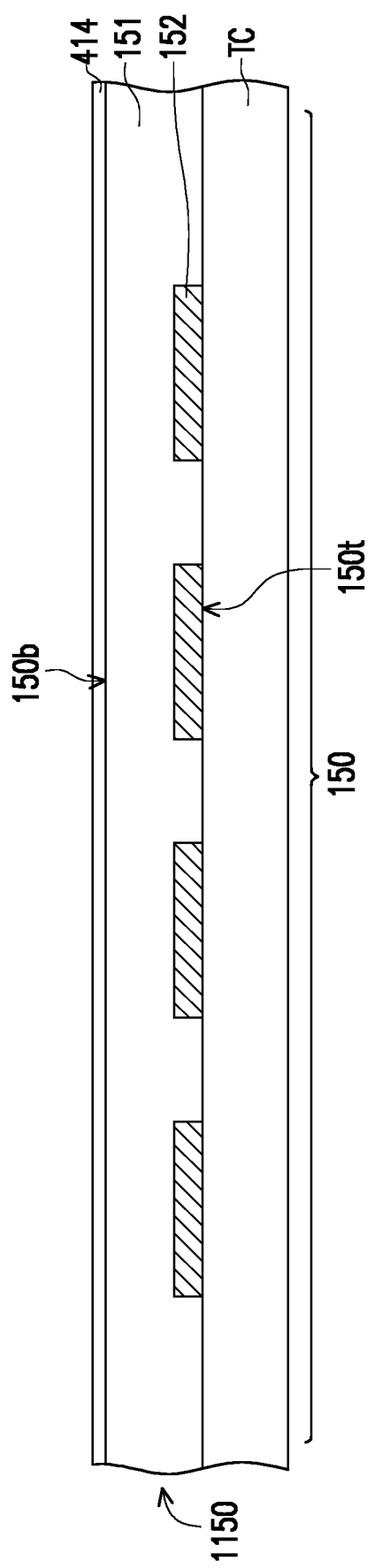

In some embodiments, referring to FIG. 5B, a temporary carrier TC may be provided. In some embodiments, the temporary carrier TC is a glass substrate, a metal plate, a plastic supporting board or the like, but other suitable substrate materials may be used as long as the materials are able to withstand the subsequent steps of the process. In some embodiments, a de-bonding layer (not shown) may be formed over the temporary carrier TC. In some embodiments, the de-bonding layer includes a light-to-heat conversion (LTHC) release layer, which facilitates peeling the temporary carrier TC away from the semiconductor device when required by the manufacturing process. In some embodiments, a semiconductor wafer 1150 having semiconductor dies 150 formed therein is provided over the temporary carrier TC. In some embodiments, the semiconductor wafer 1150 is disposed face-down with respect to the temporary carrier TC, with top surfaces 150t of the semiconductor dies 150 facing the temporary carrier TC. In some embodiments, conductive pads 152 of the semiconductor dies 150 which are exposed on the top surfaces 150t also face the temporary carrier TC, and backside surfaces 150b of the semiconductor dies 150 may be available for further processing. Whilst only a single semiconductor dies 150 is illustrated in the semiconductor wafer 1150, the disclosure is not limited thereto, and multiple semiconductor dies 150 may be processes simultaneously at wafer level. In some embodiments, a second bonding layer 414 is formed on the backside surfaces 150t of the semiconductor dies 150, with similar material and steps as previously described for the bonding layer 400, and a detailed description thereof is omitted herein.

Figure 5C:
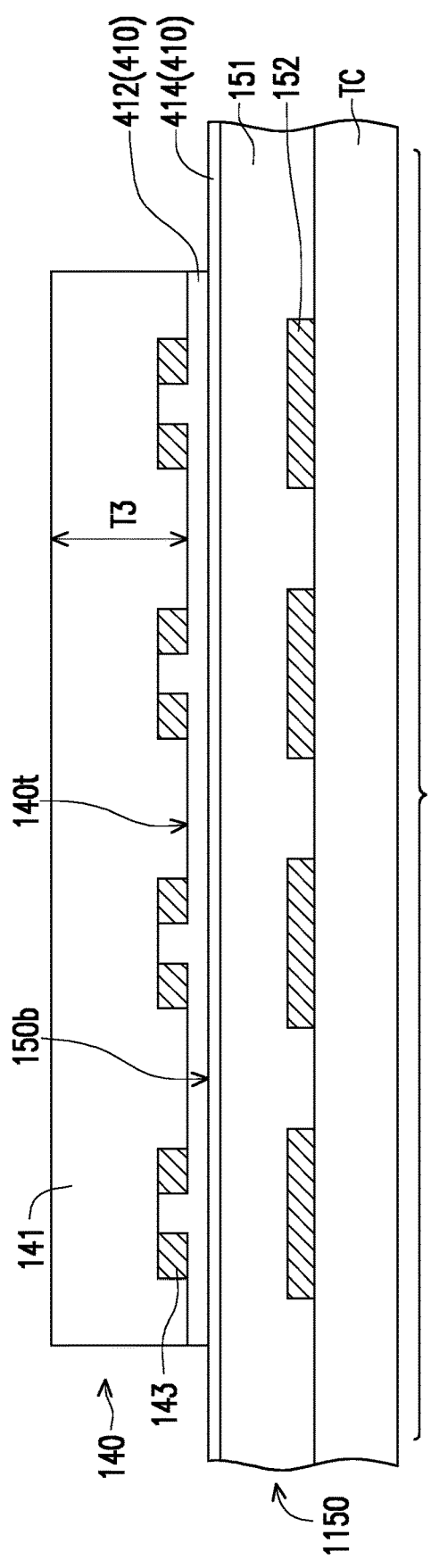
Figure 5D:
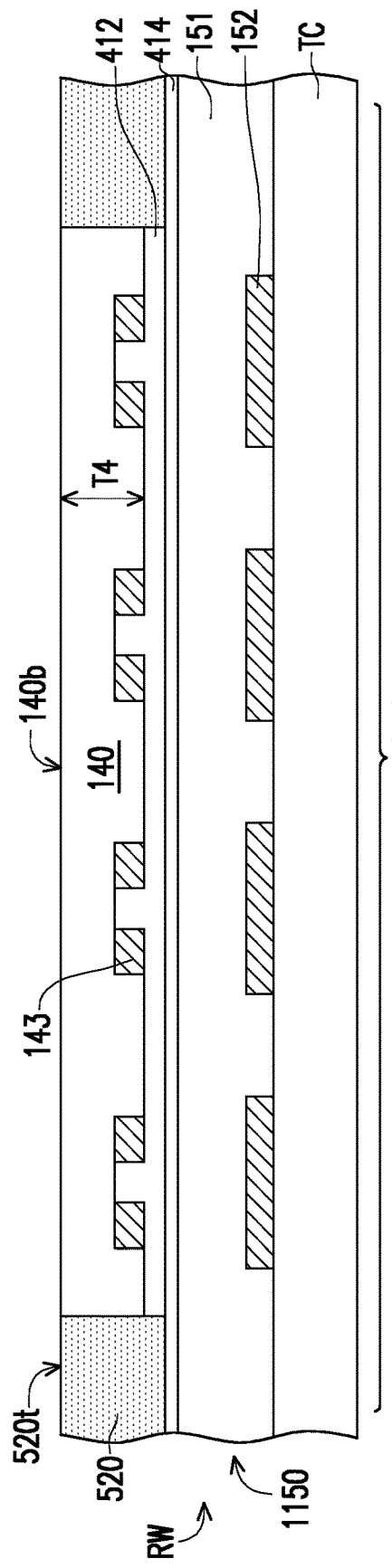

In some embodiments, referring to FIG. 5C, the semiconductor dies 140 (produced form the singulation of the semiconductor wafer 1140 of FIG. 5A) is disposed over the semiconductor dies 150, and each semiconductor die 140 may be bonded to the underlying semiconductor die 150 via the intervening bonding layers 412 and 414 (which may be collectively referred to as bonding layer 410). In some embodiments, the semiconductor die 140 is disposed on the semiconductor die 150 in a face-to-back configuration. That is, the top surface 140t of the semiconductor die 140 may face a backside surface 150b of the semiconductor die 150. In other words, the semiconductor dies 140 and 150 may be disposed with the surfaces 140t, 150b over which the bonding layers 412 and 414 are formed closer with respect to each other. In some embodiments, the two semiconductor dies 140, 150 may be bonded with similar processes as previously described for FIG. 2C. In some embodiments, the bonding layers 412 and 414 may be joined by lamination, resulting in bonding of the semiconductor dies 140, 150. As for the embodiment of FIG. 2C, also in the present embodiment the semiconductor dies 140, 150 may be bonded together at a relatively low temperature (e.g., below about 200° C.). In some embodiments, a footprint of the semiconductor die 140 may be smaller than a footprint of the semiconductor die 150, and portions of the bonding layer 414 may be left exposed after the bonding step. In some embodiments, the bonding layers 412 and 414 may include a same material. In some alternative embodiment, the bonding layers 412 and 414 may include different materials.

In some embodiments, process steps similar to what previously discussed with reference to FIG. 2D to FIG. 2I may produce the semiconductor device SD3 of FIG. 5H. Briefly, referring to FIG. 5C and FIG. 5D, an encapsulant 520 may be formed over the bonding layer 414 surrounding the semiconductor die 140. In some embodiments, formation of the encapsulant includes a planarization step (e.g., a CMP process) during which an original thickness T3 of the semiconductor die 140 is reduced to a final thickness T4. In some embodiments, the thickness T4 may be less than 25 micrometers, but the disclosure is not limited thereto. Following the planarization process, a top surface 520t of the encapsulant 520 and a backside surface 140b of the semiconductor die 140 may be substantially coplanar. In some embodiments, formation of the encapsulant 520 may produce a reconstructed wafer RW including the semiconductor wafer 1150 and the semiconductor dies 140 disposed thereon. In some embodiments, the encapsulant 520 wraps the semiconductor die 140 and the first bonding layer 412 from the sides, and further extends on a portion of the second bonding layer 414 left exposed by the first semiconductor die 140.

Figure 5E:
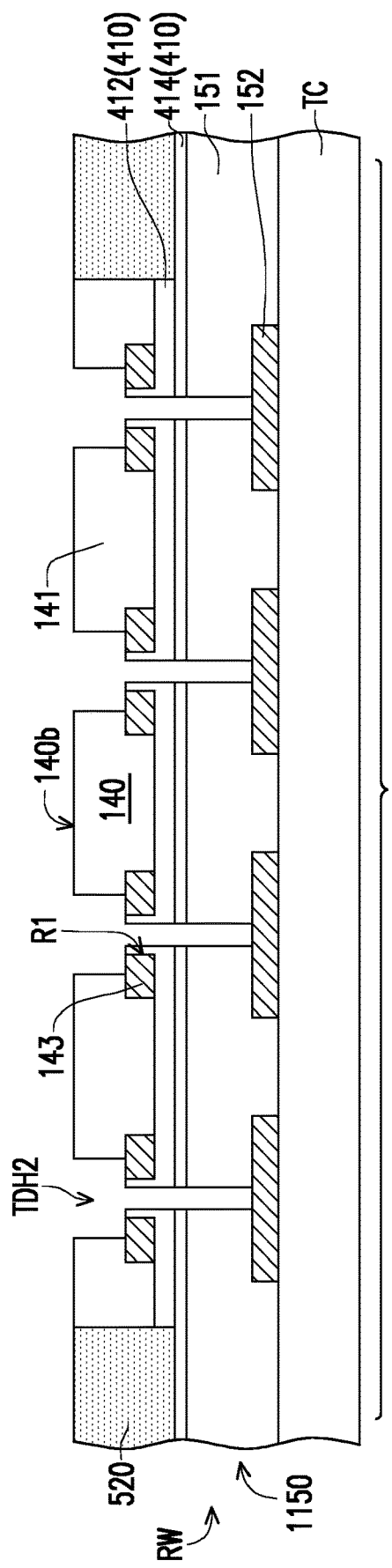
Figure 5F:
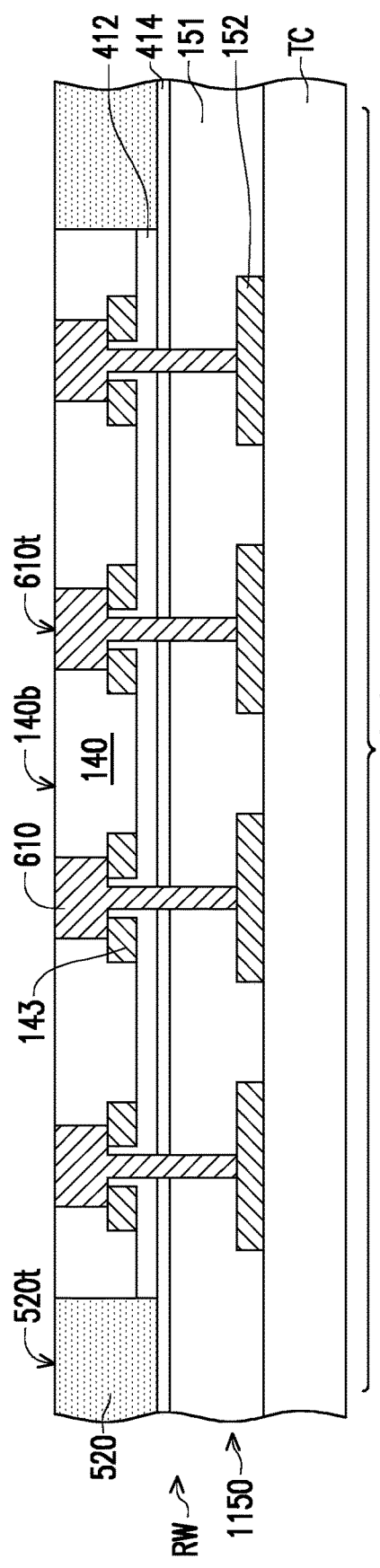
Figure 5G:
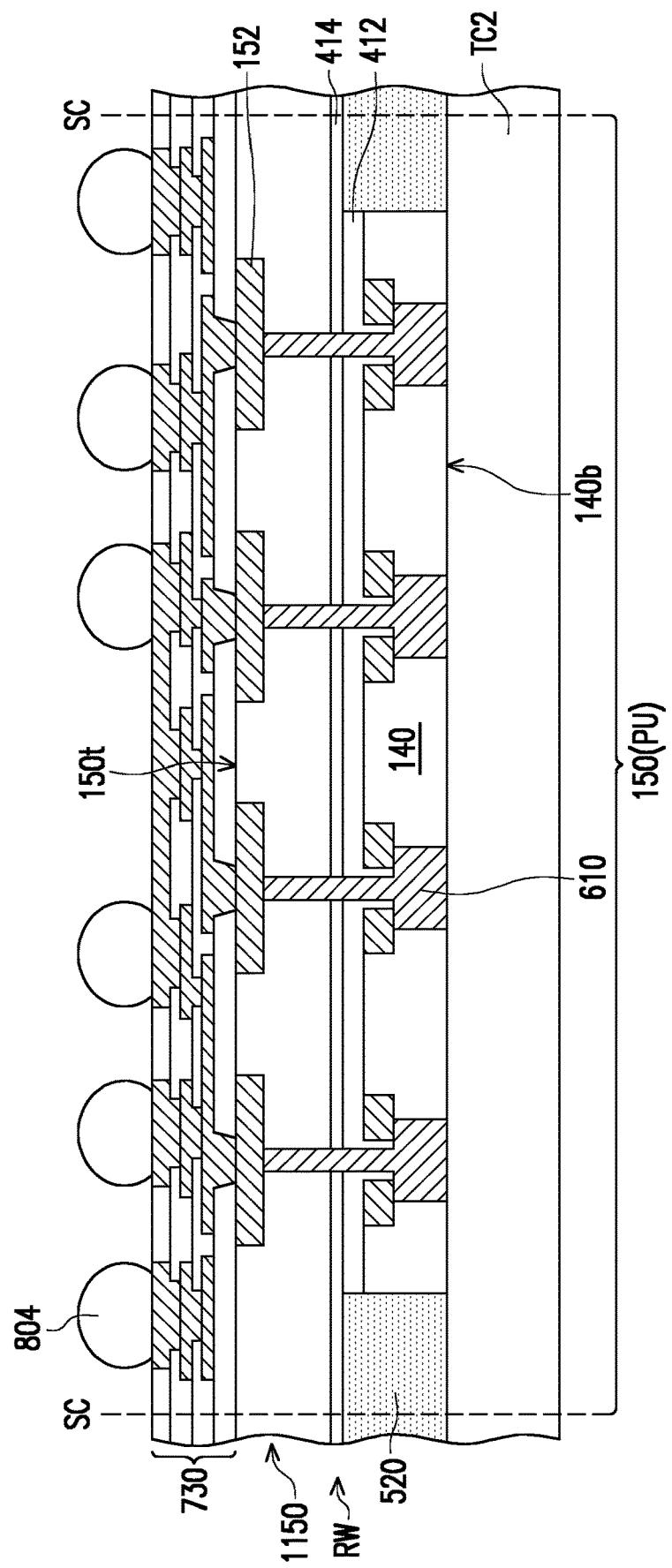

Referring to FIG. 5E, in some embodiments through die holes TDH2 may be opened from the backside surfaces 140b of the semiconductor dies 140 extending through the semiconductor substrate 141, the patterned conductive pads 143, the bonding layers 412, 414 and the semiconductor substrate 151 until reaching the conductive pads 152 of the semiconductor die 150. In some embodiments, the through die holes TDH2 extend through the recess R1 formed in the patterned conductive pads 143. In some embodiments, portions of the first bonding layer 412 may remain within the recess R1 of the patterned conductive pads 143, resulting in a narrower profile of the through die holes 142 within the recesses R1. In some embodiments, the through die holes 142 may be opened during one or more etching steps, similarly to what previously described for the through die holes TDH with reference to FIG. 2E. Differently than the through die holes TDH of FIG. 2E, the through die holes TDH2 of FIG. 5E further extend through the semiconductor substrate 151 of the semiconductor die 150 (lower semiconductor die). Referring to FIG. 5E and FIG. 5F, in some embodiments the through die holes TDH2 may be filled with a conductive material to form the through die vias 610, similarly to what was previously described for the through die vias 600 with reference to FIG. 2F and FIG. 2G. The through die vias 610 interconnect the semiconductor dies 140, 150 by contacting the patterned conductive pads 143 and crossing the bonding layer 410 and the semiconductor substrate 151 to establish electrical connection with the conductive pads 152. A top surface 610t of the through die vias 610 may be substantially coplanar with the backside surface 140b of the semiconductor die 140 and the top surface 520t of the encapsulant 520. Referring to FIG. 5G, in a subsequent step of the process the reconstructed wafer RW may be bonded to a second temporary carrier TC2. In some embodiments, the second temporary carrier TC2 may face the backside surfaces 140b and the through die vias 610 of the semiconductor dies 140. The first temporary carrier TC may be removed to expose the top surfaces 150t and the conductive pads 152 of the semiconductor dies 150. A redistribution structure 730 may be formed over the semiconductor wafer 1150, on the top surfaces 150t of the semiconductor dies 150. The redistribution structure 730 may electrically contact the conductive pads 152 of the semiconductor die 150. In some embodiments, the through die vias 610 may electrically connect the semiconductor die 140 to the redistribution structure 730 via the conductive pads 152. In some embodiments, connectors 804 may be formed on the redistribution structure 730 further away from the semiconductor wafer 150 to allow integration with other devices (not shown). In some embodiments, a singulation step may be performed, for example by cutting the reconstructed wafer RW along the scribe lines SC to produce individual semiconductor devices SD3 (shown in FIG. 5H).

Figure 5H:
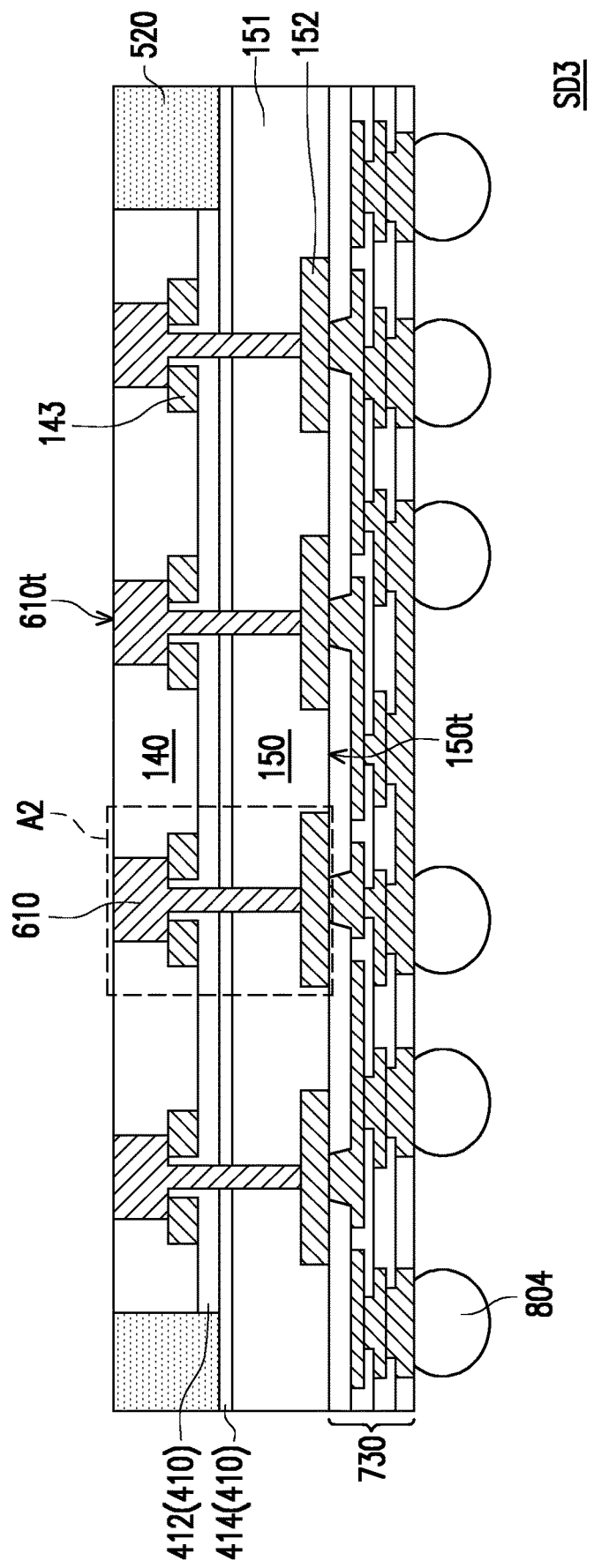
Figure 5I:
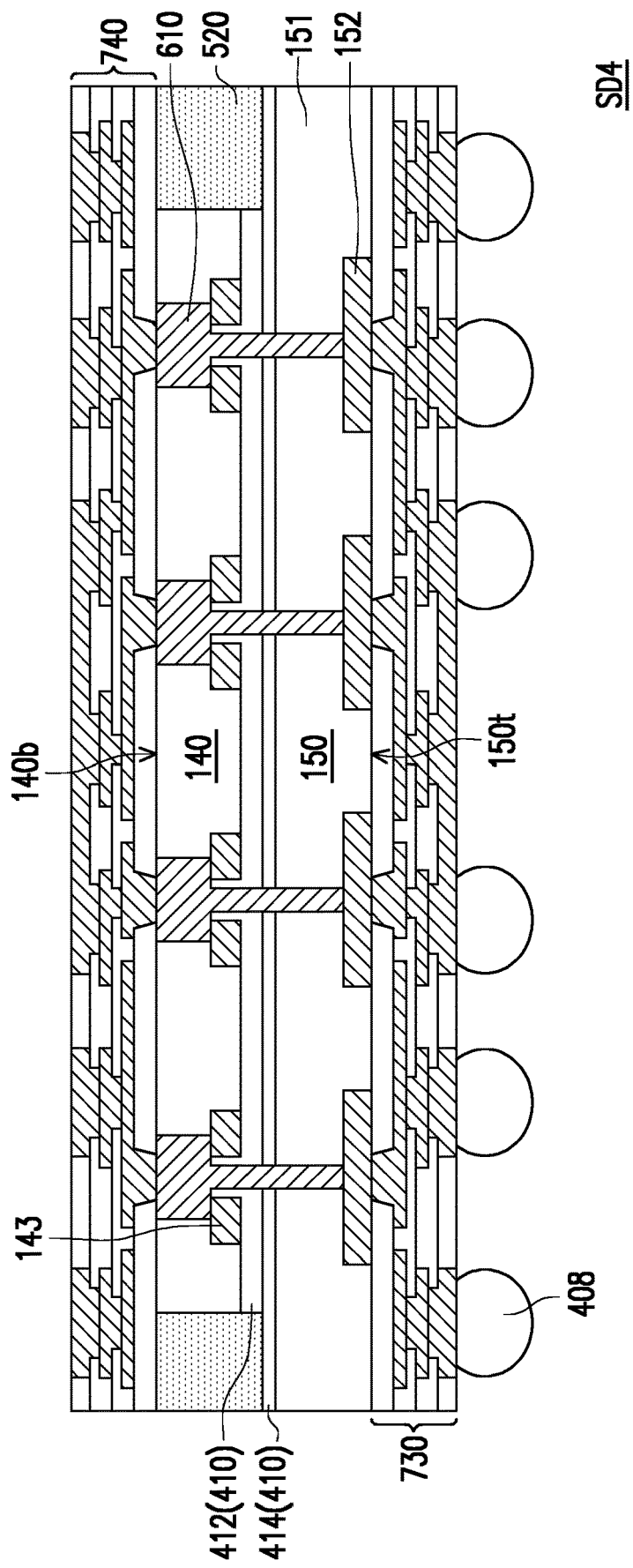
FIG. 5I shows a schematic cross-sectional view of a semiconductor device according to some embodiments of the present disclosure.

In the semiconductor device SD3 shown in FIG. 5H, the semiconductor die 140 (the upper die) is connected to the semiconductor die 150 (the lower die) by the through die vias 610. That is, the through die vias 610 may provide a bump-less connection between the semiconductor dies 140 and 150. In some embodiments, the through die vias 610 further connect the semiconductor die 140 to the redistribution structure 730 disposed on the front surface 150t of the semiconductor die 150. In some embodiments, the top surfaces 610t of the through die vias 610 are available to provide dual side vertical integration for the semiconductor device SD3. In some embodiments, a redistribution structure 740 may be formed over the backside surface 140b of the semiconductor die 140 and the encapsulant 520, as shown in the cross-sectional view of the semiconductor device SD4 of FIG. 5I. In some embodiments, the redistribution structure 740 may be electrically connected with the through die vias 610. Therefore, the through die vias 610 may be used to simultaneously interconnect in a bump-less manner the two semiconductor dies 140, 150, and the two redistribution structures 730 and 740.

Figure 6A:
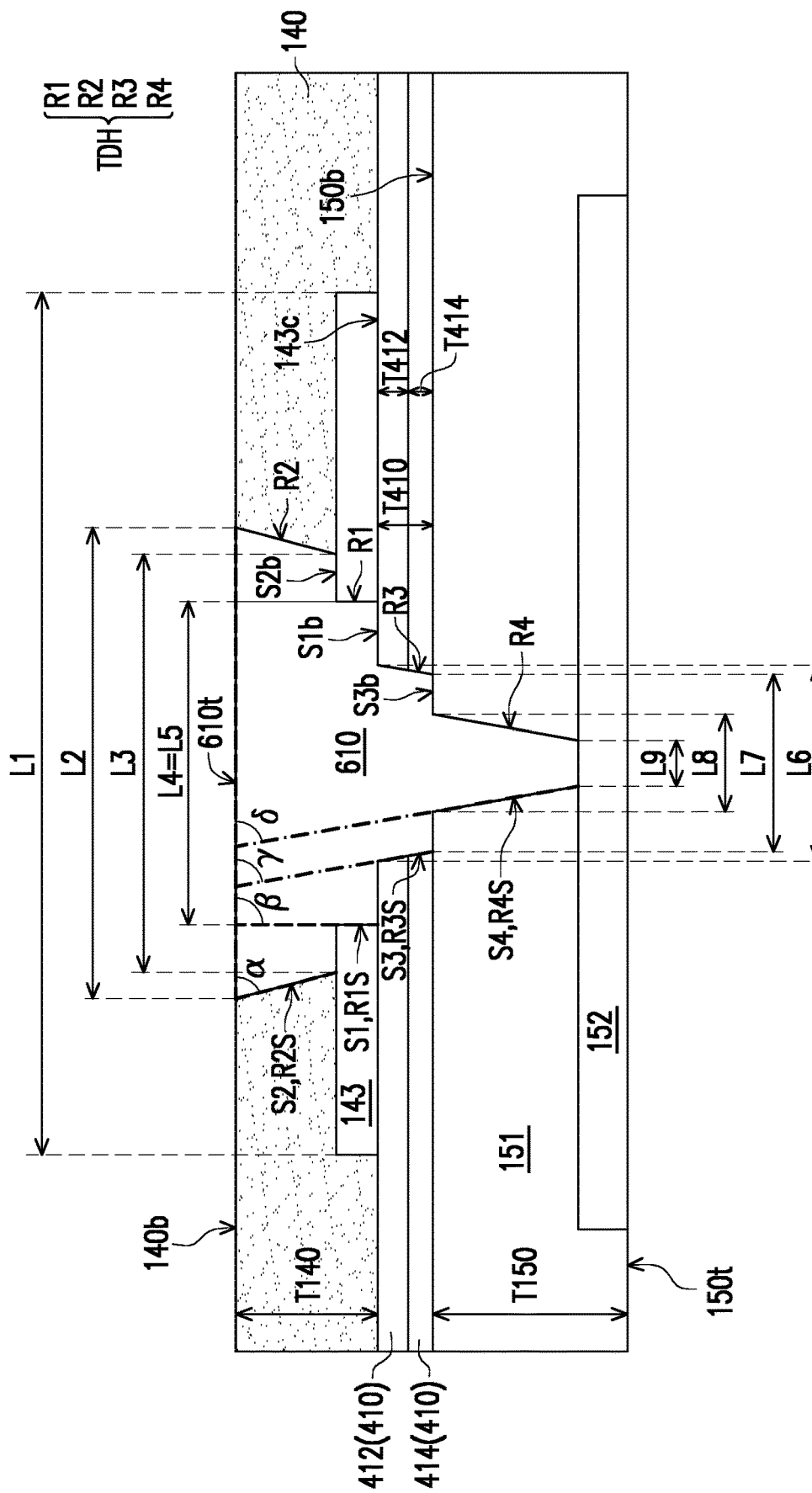
FIG. 6A through FIG. 6B show schematic cross-sectional views of portions of semiconductor devices according to some embodiments of the present disclosure.
Figure 6B:
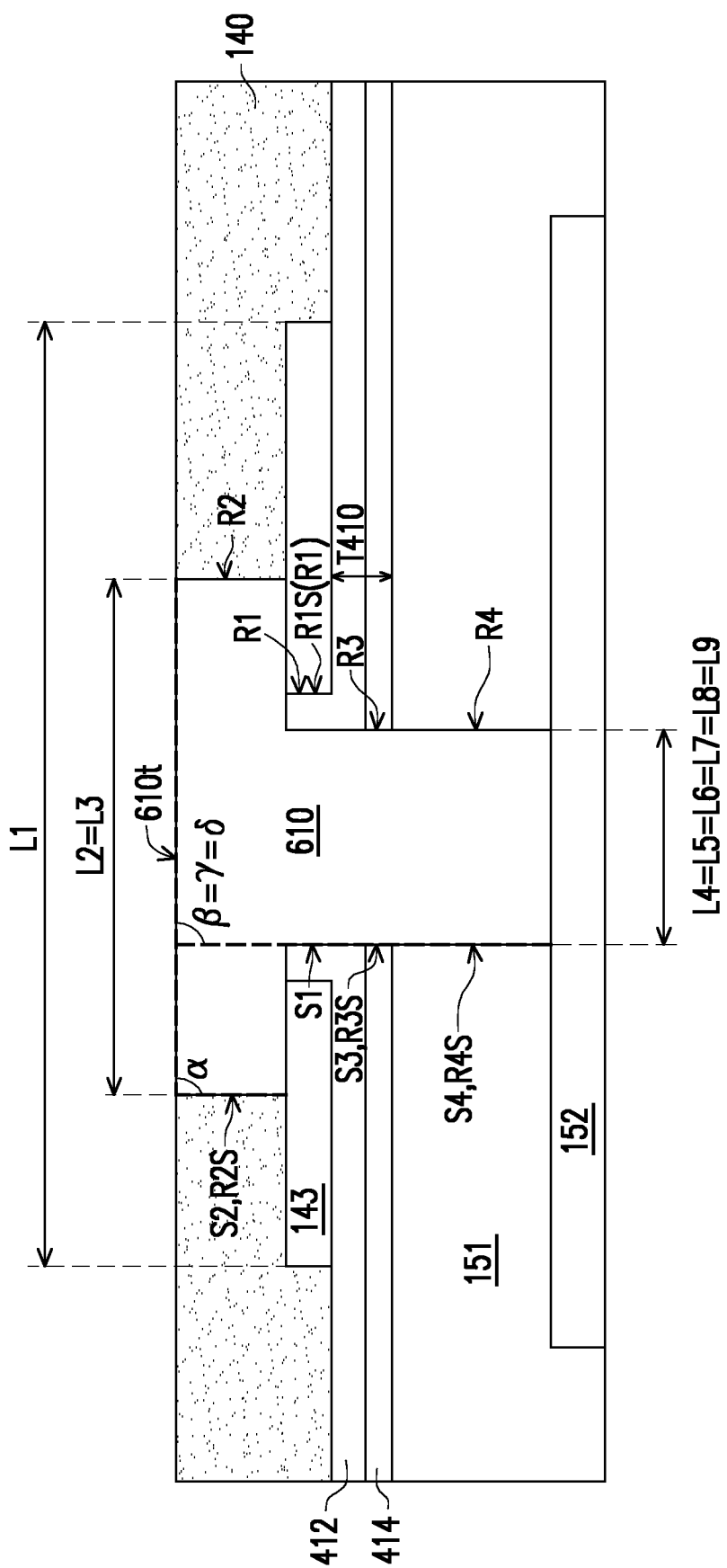

In FIG. 6A and FIG. 6B are shown schematic cross-sectional views of portions of semiconductor devices according to some embodiments of the disclosure. The portions of semiconductor devices shown in FIG. 6A and FIG. 6B corresponds to the area A2 shown in FIG. 5H for the semiconductor device SD3. In the cross-sectional views of FIG. 6A and FIG. 6B are illustrated some features of the die interconnection established by the through die vias 610 according to some embodiments of the disclosure. As discussed above with reference to FIG. 3A through FIG. 3E, it is remarked that the cross-sectional views may be not in scale to highlight some particular features or dimensions, and that some optional elements (e.g., the seed layer SL shown in FIG. 2G) may not be shown for the sake of clarity. Furthermore, the interconnection is not required to have any particular symmetry (e.g. cylindrical symmetry), and that the described spatial relationship may be encountered in one or more planes of view, but not necessarily all of them. In FIG. 6A and FIG. 6B, the portions of semiconductor dies 140 and 150 are illustrated in their entire thicknesses T140, T150, therefore, a portion of the backside surface 140b, the top surface 610t of the through die vias 610, and the top surface 150t are also illustrated. The schematic cross-sectional views of FIG. 6A and FIG. 6B are taken along a plane passing through a central part (a central axis) of the through die via 610.

In the schematic cross-sectional view of FIG. 6A, the dimensions L1 to L7 and the angles α, β, and γ are defined as described above with reference to FIG. 3A to FIG. 3E. In at least some embodiments of the present disclosure, the teachings discussed for FIG. 3A to FIG. 3E concerning the possible relationships and combinations of the dimensions L1 to L7, the angles α, β, and γ and the side surfaces S1, S2, S3 apply also with respect to the embodiments discussed with reference to FIG. 6A and FIG. 6B, and a detailed description thereof is omitted herein for the sake of brevity. However, it should be kept in mind that in the context of the embodiments of FIG. 6A and FIG. 6B the seventh dimension L7 corresponds to the width of the through die via 610 at the bottom of the third recess R3, where the bottom of the third recess may be defined at the interface between the bonding layer 410 and the semiconductor substrate 151, rather than where the through die via 610 reaches the conductive pad 152.

In some embodiment, opening the through die vias TDH2 includes forming a fourth recess R4 in the semiconductor substrate 151 to expose the contact pads 152. The fourth recess R4 may be formed below the third recess R3. In some embodiments, an eighth dimension L8 may correspond to the width of the through die via 610 at the bottom of the semiconductor substrate 151 (where the side surface RS4 of the fourth recess R4 joins a backside surface 150b of the semiconductor die 150). As shown in FIG. 6A, even though the third recess R3 is formed on the fourth recess R4, the eighth dimension L8 is not necessarily equal to the seventh dimension L7. That is, the side surface R3S of the third recess R3 (and the side surface S3 of the through die via 610 in the third recess R3) may land on the semiconductor substrate 151, and a surface S3b of the through die via 610 at the bottom of third recess R3 may extend over the backside surface 150b of the semiconductor die 150. That is, the side surface S3 of the through die via 610 in the third recess R3 and the side surface S4 of the through die via 610 in the fourth recess R4 may be separated by the surface S3b at the bottom of the third recess R3. In some alternative embodiments, the seventh dimension L7 may be equal to the eighth dimension L8 (as shown, for example, in FIG. 6B), and the side surface S3 of the through die via 610 in the third recess R3 may directly contact (be contiguous with) the side surface S4 of the through die via 610 in the fourth recess R4.

In some embodiments, a width of the through die via 610 at the bottom of the fourth recess R4 in contact with the conductive pad 152 (where the through die via 610 contacts the conductive pad 152) may correspond to a ninth dimension L9. In some embodiments, the ninth dimension L9 may be smaller than the eighth dimension L8. That is, the through die via 610 in the fourth recess R4 may have side surfaces S4 inclined at an angle δ other than π/2 radians with respect to the top surface 610t of the through die via 610. In some embodiments, a range of the angle δ may be similar to the range for the angle α described above. In some embodiments, if the angle δ is π/2 radians the through die via 610 in the fourth recess R4 has a substantially vertical profile, and the eighth dimension L8 is about equal to the ninth dimension L9 (as shown, for example, in FIG. 6B). Even when the two side surfaces S3 and S4 are contiguous (i.e., they are not separated by the surface S3b at the bottom of third recess R3), the angles γ and δ may be different. In some alternative embodiments, the angles γ and δ may be the same, and the contiguous side surfaces S3 and S4 may describe a continuous surface (as shown, for example, in FIG. 6B).

In some embodiments, a thickness T410 of the bonding layer 410 may be in the same range described above for the thickness T400. In some embodiments, the thickness T410 may correspond to the sum of the thicknesses T412 and T414 of the bonding layer 412 and 414, respectively. In some embodiments, the thickness T410 of the bonding layer 400 is measured as the distance between the backside surface 150b of the semiconductor die 150 and the closest facing surface of the patterned conductive pads 143. For the semiconductor die 140, the closest facing surface may correspond to the surface 143c of the patterned conductive pads 143 further away from the backside surface 140b of the semiconductor die 100. This means that in the embodiments in which the bonding layer 412 extends within the first recess R1 (as shown in FIG. 6B, for example), the portions of the bonding layer 412 extending within the first recess R1 are not considered when evaluating the thickness of the bonding layer 410.

Figure 7A:
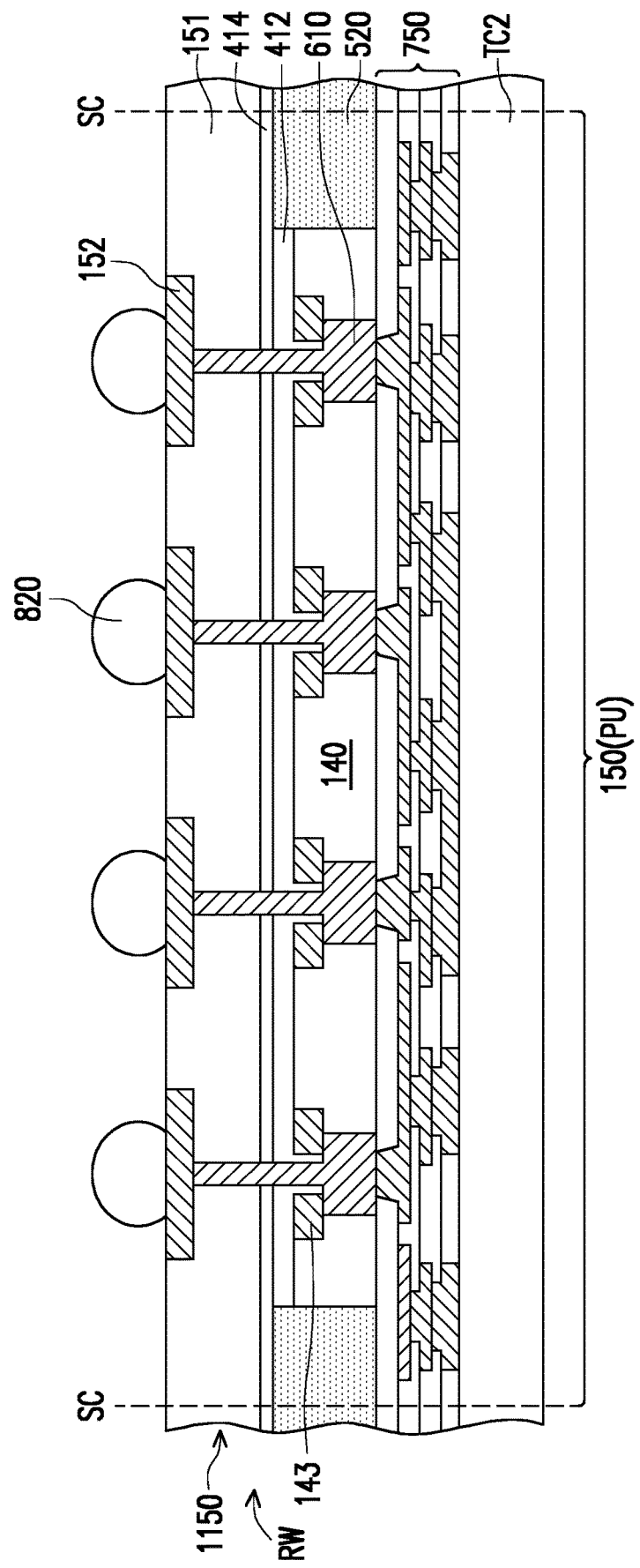
FIG. 7A through FIG. 7B show schematic cross-sectional views of structures produced at various stages of a manufacturing method of a semiconductor device according to some embodiments of the present disclosure.
Figure 7B:
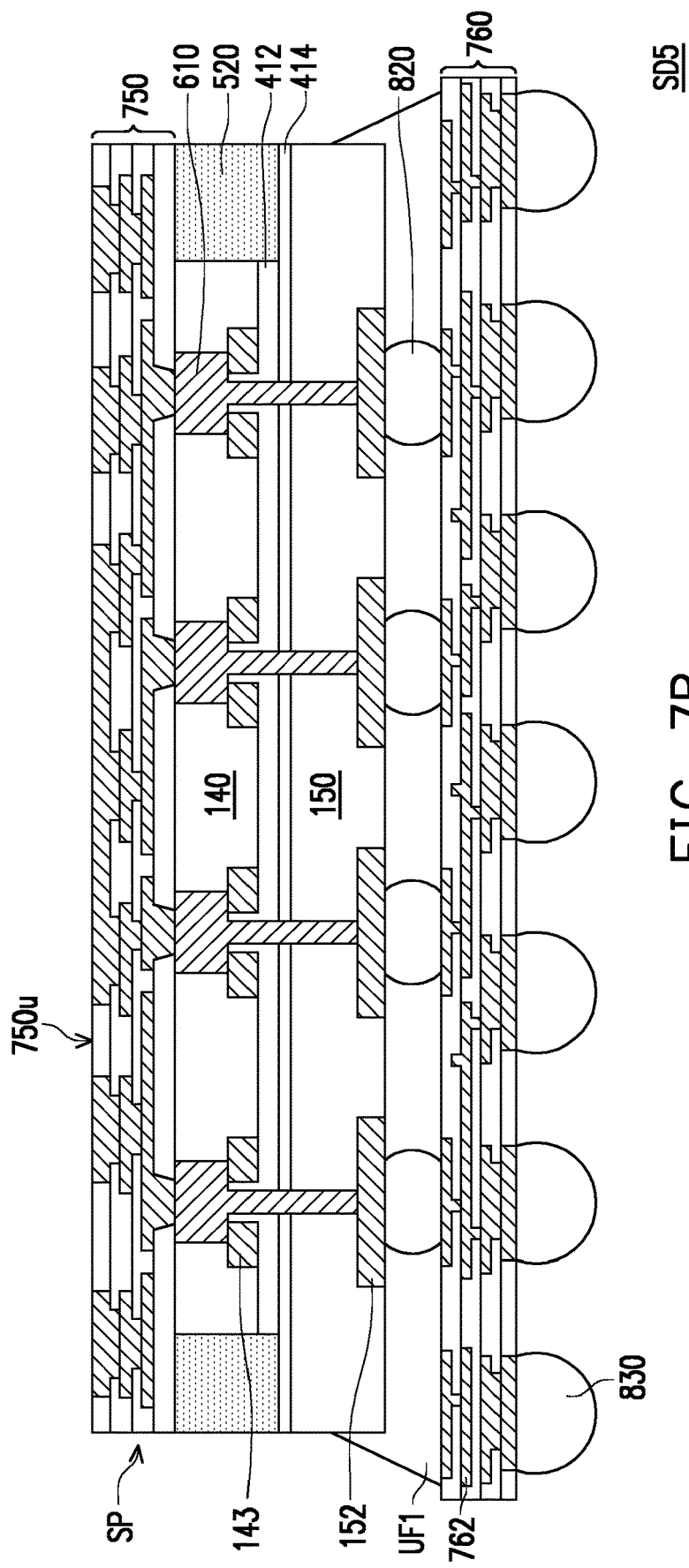

FIG. 7A through FIG. 7B show schematic cross-sectional views of structures produced during a manufacturing method of a semiconductor device SD5 (shown in FIG. 7B) according to some embodiments of the disclosure. In some embodiments, the intermediate structure of FIG. 7A may be obtained from the intermediate structure of FIG. 5F by forming a redistribution structure 750 over the backside surfaces 140b of the semiconductor dies 140, bonding a second temporary carrier TC2 on the redistribution structure 750, debonding the temporary carrier TC and providing connectors 820 over the exposed conductive pads 152. In some embodiments, the redistribution structure 750 is connected to the semiconductor die 150 by the through die vias 610, similarly to what was previously discussed for the redistribution structure 740 of the semiconductor device SD4 of FIG. 5I. In some embodiments, the reconstructed wafer RW of FIG. 7A may be subjected to a singulation process, for example by cutting along the scribe lines SC to produce individual semiconductor packages SP from the package units PU. Referring to FIG. 7A and FIG. 7B, in some embodiments a semiconductor package SP may be bonded to an interposer 760 to produce the semiconductor device SD5. In some embodiments, the semiconductor package SP may be connected to the interposer 760 via connectors 820. In some embodiments, the interposer 760 is made of a semiconductor material, similarly to what was previously discussed with reference to the semiconductor substrate 101. In some embodiments, the interposer 760 includes embedded conductive through vias 762 interconnecting opposite sides of the interposer 760. The connectors 820 may be bonded to the conductive through vias 762 on a first side of the interposer 760. In some embodiments, an underfill 764 may be disposed between the semiconductor package SP and the interposer 762 to protect the connectors 820 against thermal or physical stresses and to secure the electrical connection of the semiconductor package SP with the through vias 762. In some embodiments, the underfill 764 is formed by capillary underfill filling (CUF). A dispenser (not shown) may apply a filling material (not shown) along the perimeter of the semiconductor package SP. In some embodiments, heating may be applied to let the filling material penetrate in the interstices defined by the connectors 820 between the semiconductor package SP and the interposer 762 by capillarity. Connectors 830 may be disposed on a second side of the interposer 760 opposite to the first side to allow integration of the semiconductor device SD5 with other devices (not shown). In some embodiments, the through die vias 610 may provide electrical connection between the interposer 762 and the redistribution structure 750, allowing other devices (not shown) to be connected from the upper surface 750u of the redistribution structure 750.

FIG. 8A through FIG. 8I shows schematic cross-sectional views of structures produced during a manufacturing process of a semiconductor device SD6 (shown in FIG. 8I) according to some embodiments of the disclosure. In some embodiments, referring to FIG. 8A, semiconductor wafers 1160, 1170 are bonded together on a temporary carrier TC.

Figure 8A:
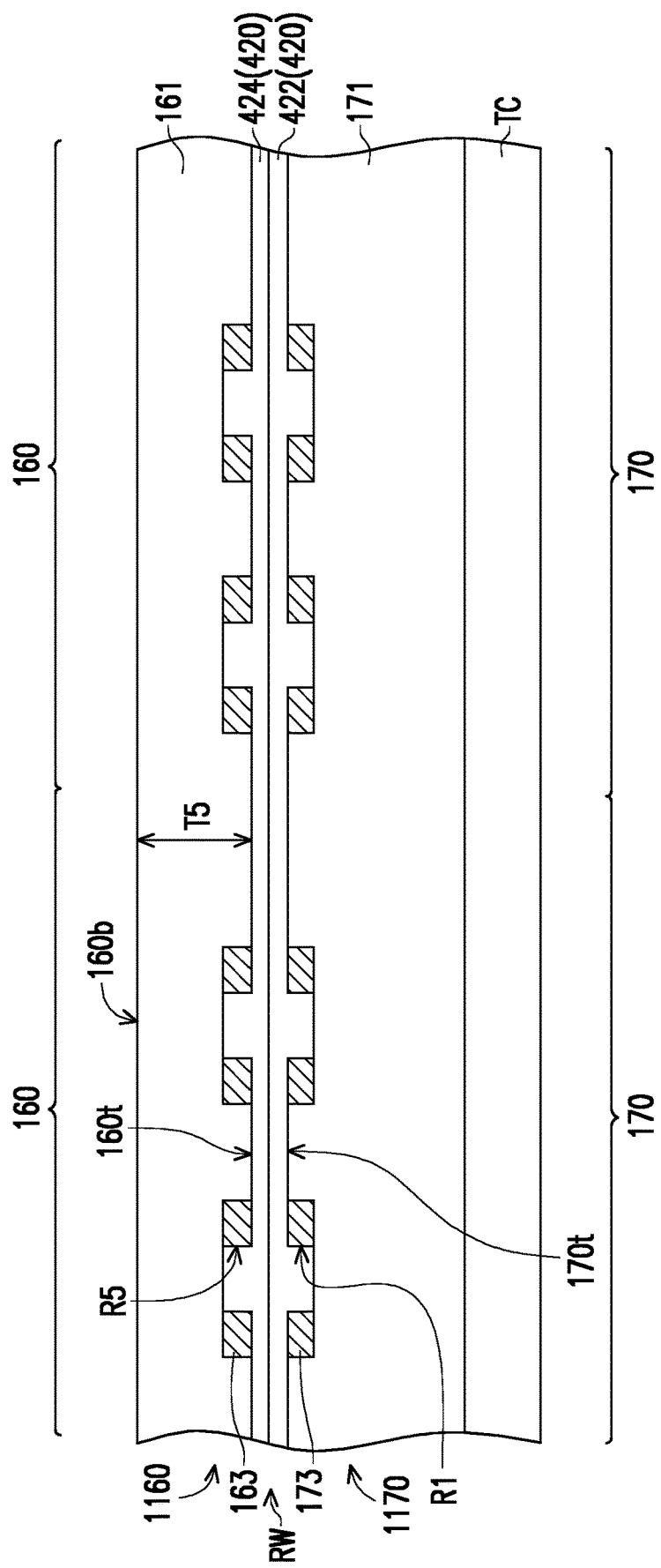
FIG. 8A through FIG. 8I show schematic cross-sectional views of structures produced at various stages of a manufacturing method of a semiconductor device according to some embodiments of the present disclosure.
Figure 8B:
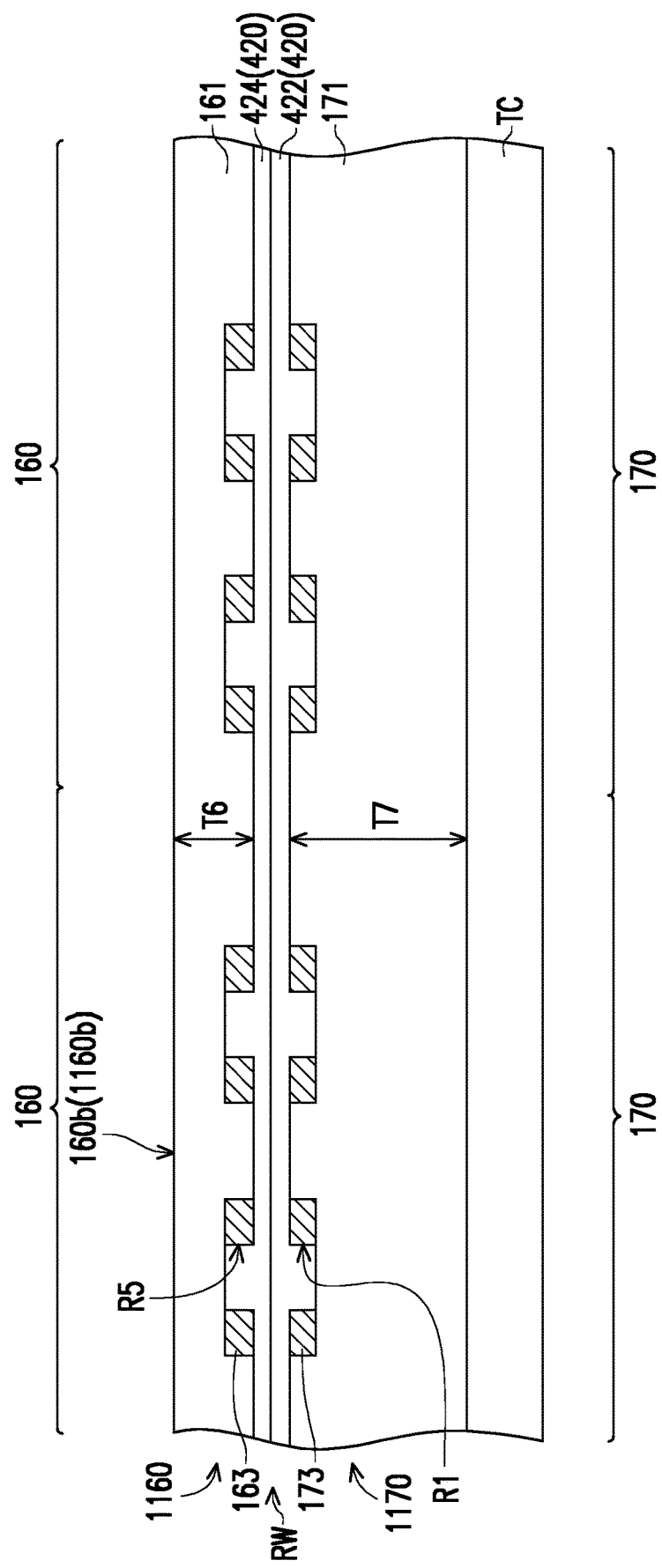
Figure 8C:
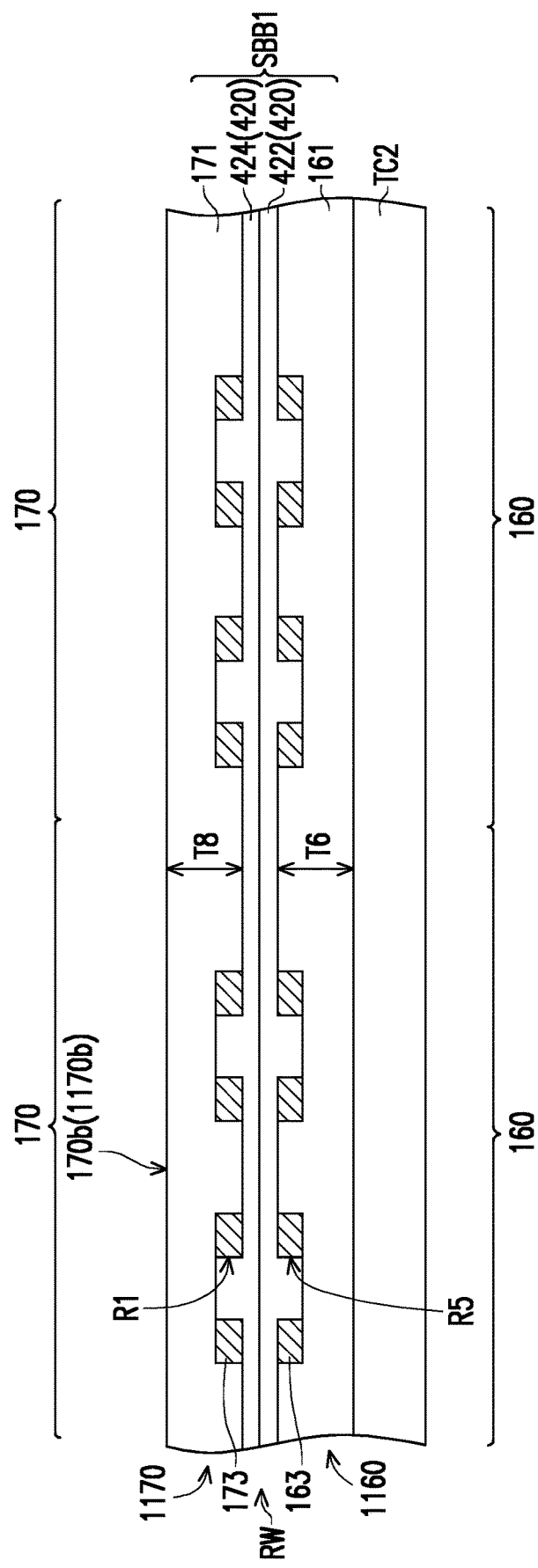

In some embodiments, each of the semiconductor wafers 1160, 1170 has semiconductor dies 160, 170 respectively formed therein. In some embodiments, each of the semiconductor wafers 1160, 1170 was obtained similarly to what was discussed above with reference to the semiconductor wafer 1140 of FIG. 5A. That is, both of the semiconductor dies 160 and 170 may have been subjected to a patterning step (e.g., etching) to produce patterned conductive pads 163 and 173, respectively. Furthermore, a bonding layer 422 may have been formed over the top surfaces 160t of the semiconductor dies 160, filling the recesses R5 exposing the substrate 161 through the patterned conductive pads 163. Similarly, a bonding layer 424 may have been formed over the top surfaces 170t of the semiconductor dies 170, filling the recesses R1 exposing the substrate 171 through the patterned conductive pads 173. In some embodiments, the semiconductor wafers 1160, 1170 may be bonded together with the semiconductor dies 160 and 170 disposed in a face-to-face configuration via the bonding layers 422 and 424 (sometimes collectively referred to as bonding layer 420). In some embodiments, the two semiconductor wafers 1160, 1170 bonded together may be considered a reconstructed wafer RW. In some embodiments, as shown in FIG. 8A, the semiconductor wafer 1170 is disposed between the semiconductor wafer 1160 and the temporary carrier TC, leaving exposed the backside surfaces 160b of the semiconductor dies 160 for further processing. Referring to FIG. 8A and FIG. 8B, a thinning process may be performed on the semiconductor wafer 1160 from the direction of the backside surface 1160b, reducing an original thickness T5 of the semiconductor dies 160 to a final thickness T6. In some embodiments, the thickness T6 may be less than 25 micrometers, but the disclosure is not limited thereto. Referring to FIG. 8B and FIG. 8C, in some embodiments, a second temporary carrier TC2 is bonded to the exposed backside surface 1160b of the semiconductor wafer 1160, and the first temporary carrier TC is removed to expose the backside surface 1170b of the semiconductor wafer 1170. In some embodiments, a thinning process is performed on the semiconductor wafer 1170 from the direction of the backside surface 1170b, reducing an original thickness T7 of the semiconductor dies 170 to a final thickness T8. In some embodiments, the thickness T8 may be less than 25 micrometers, but the disclosure is not limited thereto.

Figure 8D:
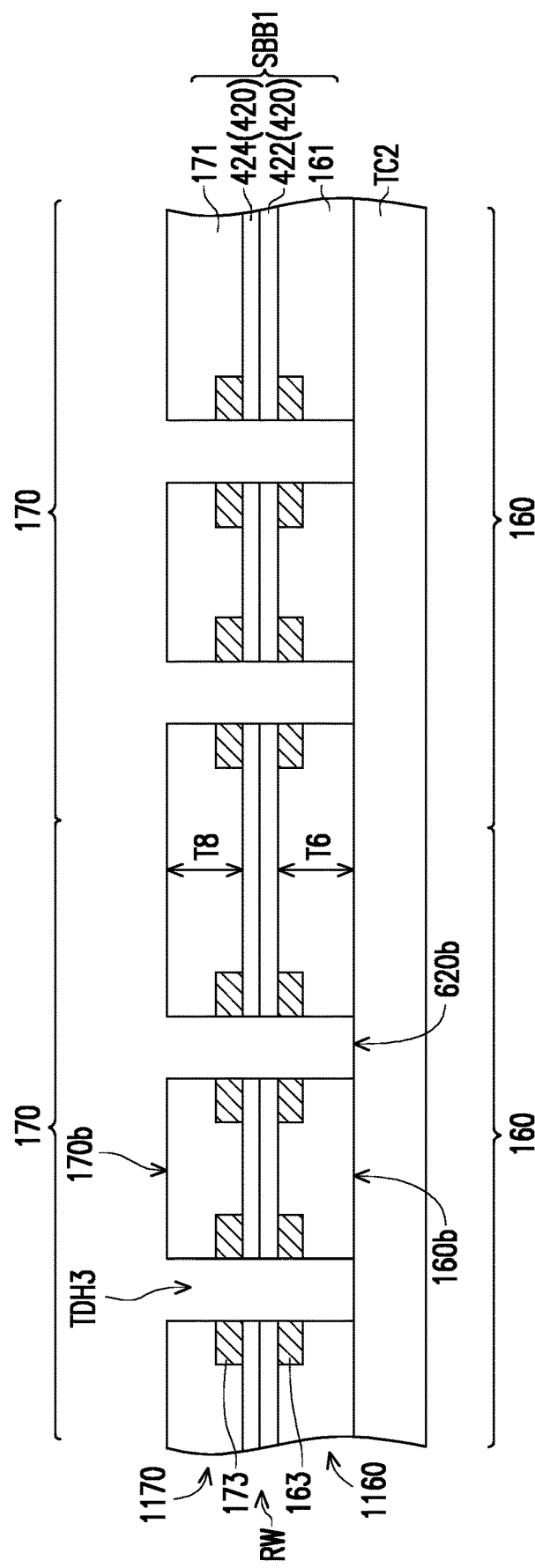
Figure 8E:
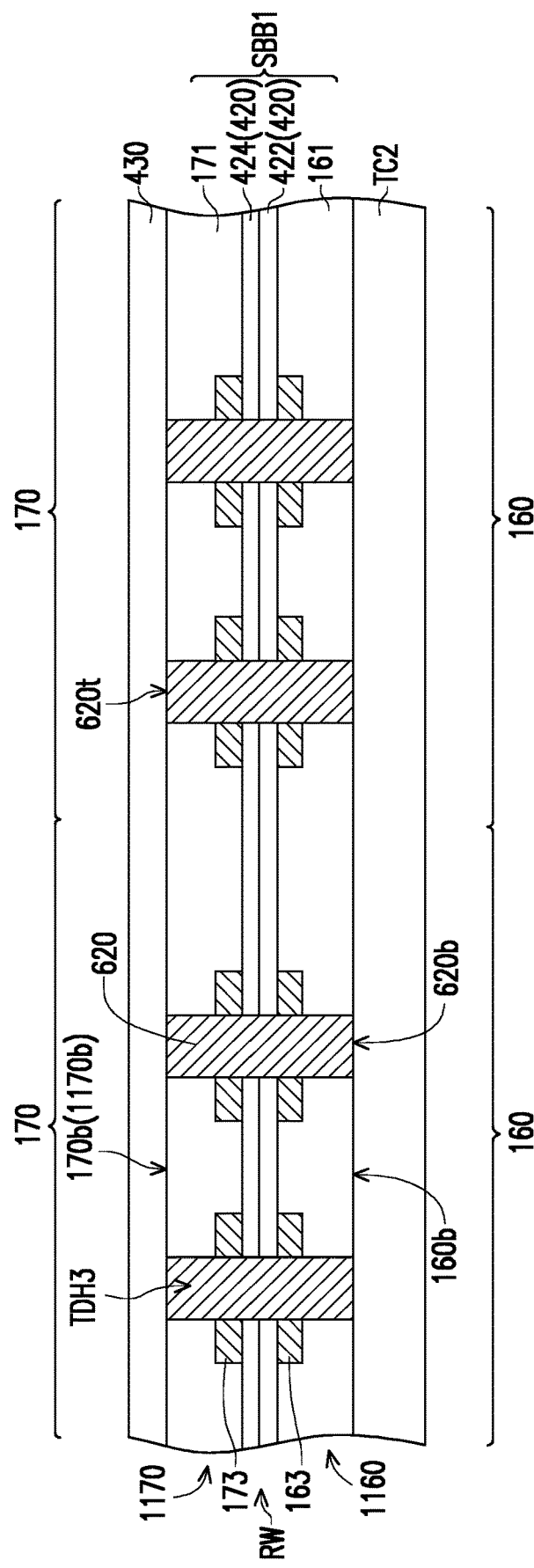

In some embodiments, referring to FIG. 8D, through die holes TDH3 are opened through the semiconductor dies 160 and 170, revealing at least portions of the patterned conductive pads 163, 173 which were hitherto buried within the semiconductor substrates 161, 171. In some embodiments, the through die holes TDH3 extend from a backside surface 170b of the semiconductor die 170 to a backside surface 160b of the semiconductor die 160. That is, the through die holes TDH3 may cross both of the semiconductor dies 160, 170 through the entirety of their respective thicknesses T6 and T8. In some embodiments, the through die holes TDH3 may be formed during one or more etching steps. In some embodiments, formation of the through die holes TDH3 completes a stack building block SBB1. The stack building block SBB1 may include the two semiconductor wafers 1160, 1170 bonded together via the bonding layer 420 without being (yet) electrically connected. In some embodiments, stack building blocks like the stack building block SBB1 of FIG. 8D may be used to conveniently build chip stacks (e.g., memory cubes, die stacks, or the like). In some embodiments, referring to FIG. 8D and FIG. 8E, a conductive material is filled within the through die holes TDH3 to produce through die vias 620, similarly to what was previously described for the through die vias 600 and 610, and a detailed description thereof is omitted herein. In some embodiments, the through die vias 620 establish electrical connection between the semiconductor dies 170 of the semiconductor wafer 1170 with the underlying semiconductor dies 160 of the semiconductor wafer 1160. Furthermore, top surfaces 620*t* of the through die vias 620 are exposed by the backside surfaces 170*b* of the semiconductor dies 170, and opposite bottom surfaces 620*b* of the through die vias 620 are exposed by the backside surfaces 160*b* of the semiconductor dies 160. Therefore, both top and bottom surfaces 620*t*, 620*b* of the through die vias 620 are available to establish electrical connection between the semiconductor dies 160, 170 and other semiconductor dies, packages or devices, according to production requirements.

Figure 8F:
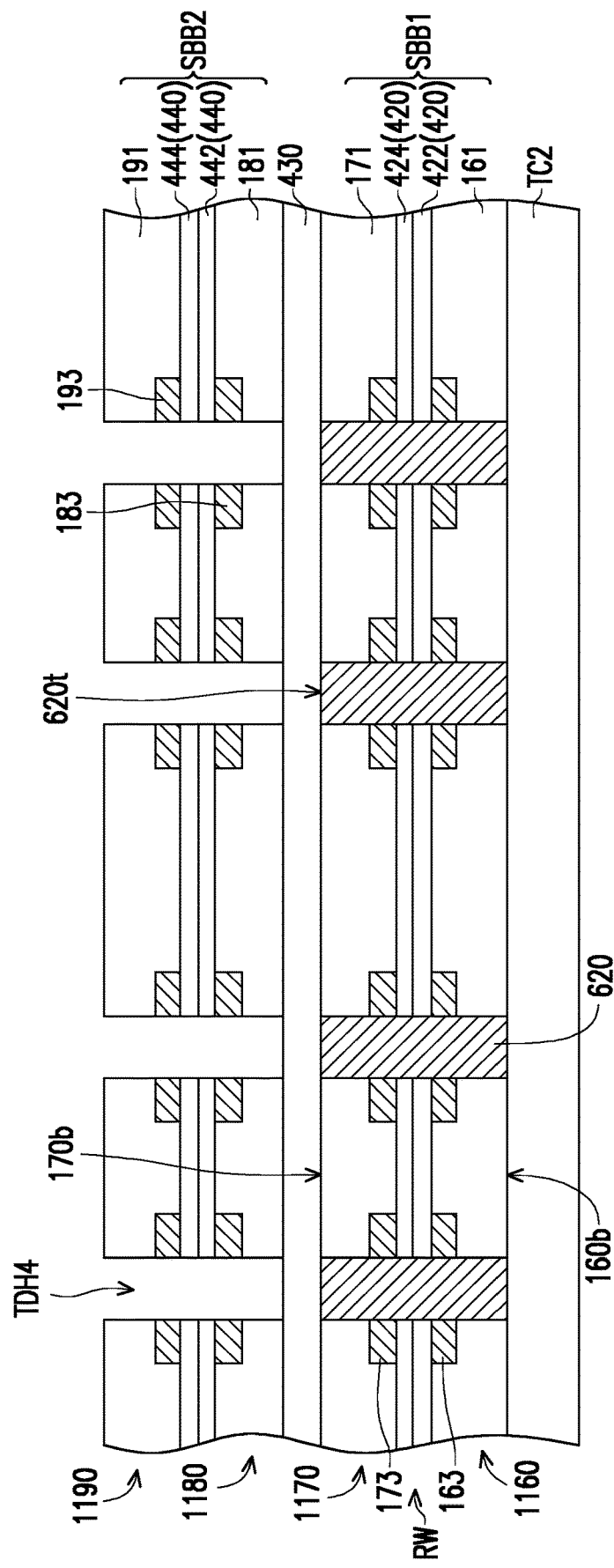
Figure 8G:
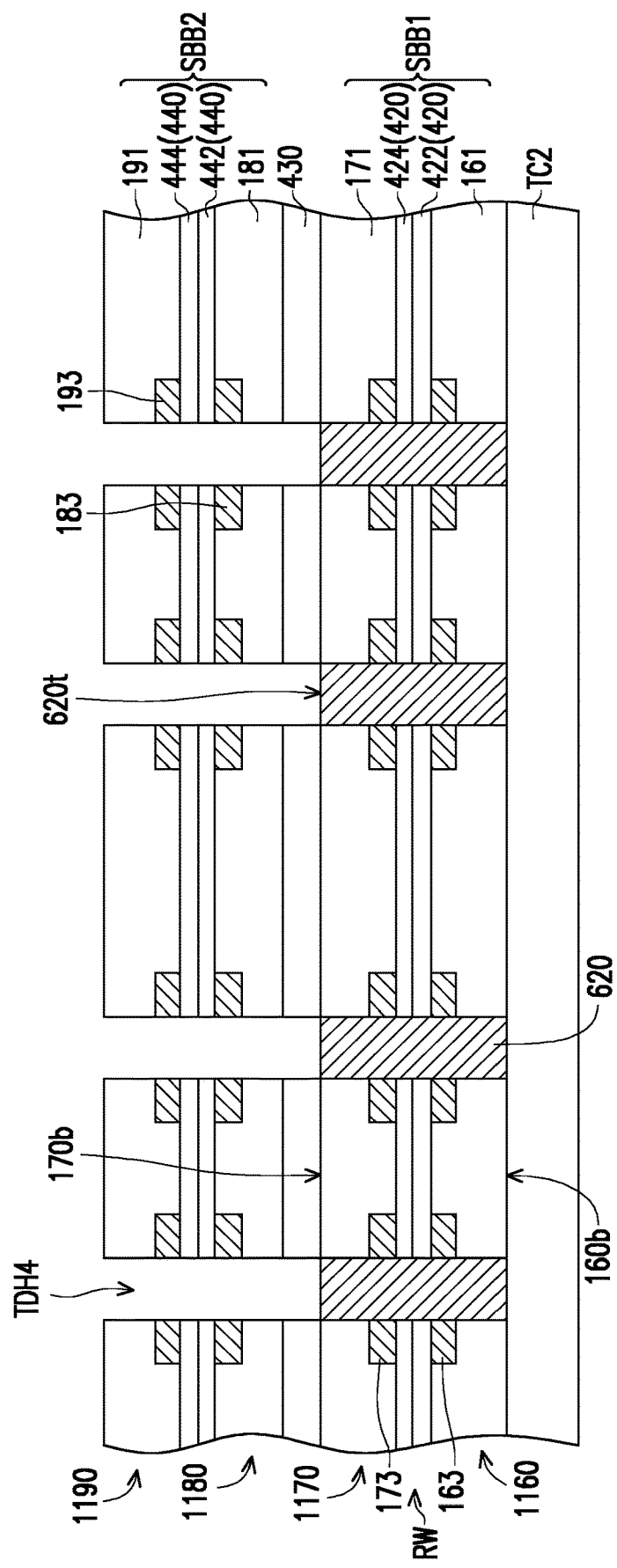
Figure 8H:
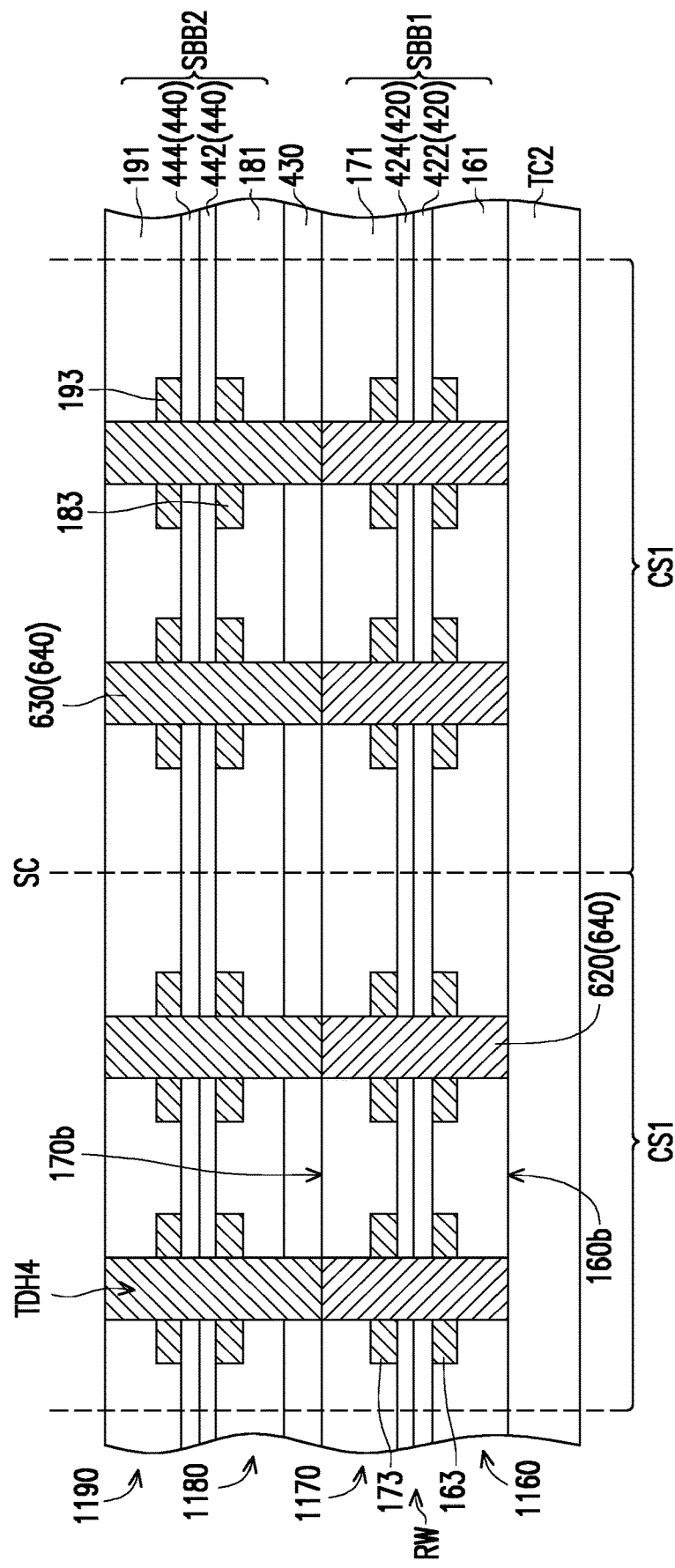
Figure 8I:
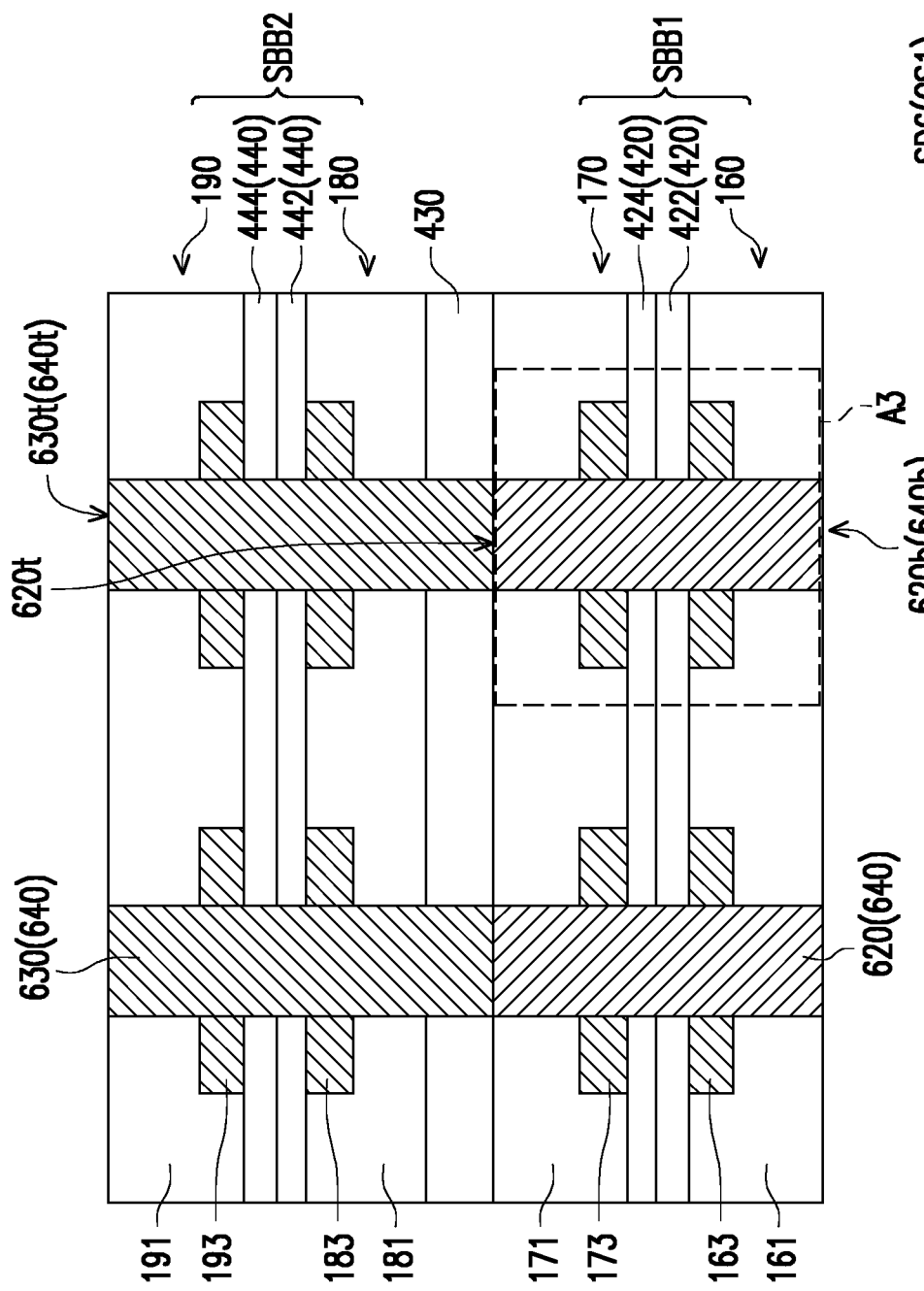

In some embodiments, a second bonding layer 430 may be formed over the stack building block SBB1, possibly following similar processes and employing similar materials as what was previously described with reference to the bonding layer 400. In some embodiments, the bonding layer 430 covers the backside surface 1170*b* of the semiconductor wafer 1170 and the top surfaces 620*t* of the through die vias 620. In some embodiments, as shown in FIG. 8F, a second stack building block SBB2 may be bonded to the first stack building block SBB1 via the bonding layer 430. The second stack building block SBB2 may include the semiconductor wafers 1180, 1190, each respectively having semiconductor dies 180, 190 formed therein and bonded together by a bonding layer 440. In some embodiments, the bonding layer 440 may include a bonding layer 442 formed on the semiconductor wafer 1180 and a bonding layer 444 formed on the semiconductor wafer 1190. Through die holes TDH4 may be formed in the second stack building block SBB2 through the semiconductor substrates 181, 191 of the semiconductor dies 180, 190, exposing the patterned conductive pads 183, 193 and the underlying second bonding layer 430. In some embodiments, referring to FIG. 8G, the through die holes TDH4 are extended through the second bonding layer 430 to expose the top surfaces 620*t* of the through die vias 620. Thereafter, a conductive material may be disposed in the through die holes TDH4 to form through die vias 630 on top of the through die vias 620, as shown in FIG. 8H. The through die vias 630 may be electrically connected with the through die vias 620. Together, the through die vias 620 and 630 may interconnect the stacked semiconductor dies 160, 170, 180, 190, and may be referred to as a through stack via 640. In some embodiments, after forming the through stack vias 640, a singulation step may be performed on the reconstructed wafer RW to produce individual chip stacks CS1, for example by cutting along the scribe lines SC. Removal of the temporary carrier TC2 may result in the semiconductor devices SD6 (chip stacks CS1) shown in FIG. 8I.

In some embodiments, the semiconductor device SD6 (sometimes referred to as chip stack CS1) includes the stacked semiconductor dies 160, 170, 180, 190 interconnected by the through stack vias 640. In some embodiments, the through stack vias 640 includes the through die vias 620 and the through die vias 630 stacked on top of each other. In some embodiments, the bottom surfaces 620*b* of the through die vias 620 constitute the bottom surfaces 640*b* of the through stack vias 640 and the top surfaces 630*t* of the through die vias 630 constitute the top surfaces 640*t* of the through stack vias 640. In some embodiments, a given through stack via 640 may have both of the top surface 640*t* and the bottom surface 640*b* exposed and available for further electrical connection. In some embodiments, the through die vias 620 extend through the semiconductor substrates 161, 171 and the interposed bonding layer 420, interconnecting the patterned conductive pads 163 and 173 which are enclosed by the two semiconductor substrates 161, 171. In some embodiments, the through die vias 620 contact at their top surfaces 620*t* the through die vias 630. The through die vias 630 extend through the bonding layers 430 and 440 and the semiconductor substrates 181, 191, interconnecting the patterned conductive pads 183, 193 which are enclosed by the two semiconductor substrates 183, 193. According to some embodiments, the chip stack CS1 can be conveniently manufactured by stacking stack building blocks SBB1, SBB2, each stack building block SBB1, or SBB2 including two bonded semiconductor wafers (e.g., 1160 and 1170 for SBB1, 1180 and 1190 for SBB2, as shown in FIG. 8H). In some embodiments, the same stack building block may be stacked to form a chip stack (e.g., SBB1 being the same as SBB2). In some embodiments, design flexibility may be achieved by stacking the stack building blocks SBB1 and SBB2 in different orientations. In the chip stack CS1 of FIG. 8I, the semiconductor die 180 is stacked immediately on top of the semiconductor die 170. In some alternative embodiments (not shown) the semiconductor die 190 may be stacked immediately on top of the semiconductor die 170, or the semiconductor die 161 may be stacked directly on top of one of the semiconductor die 190 or the semiconductor die 180. According to some embodiments, the manufacturing process of chip stacks like the chip stack CS1 may be simplified, increasing the process throughput and reducing the manufacturing costs.

Figure 9A:
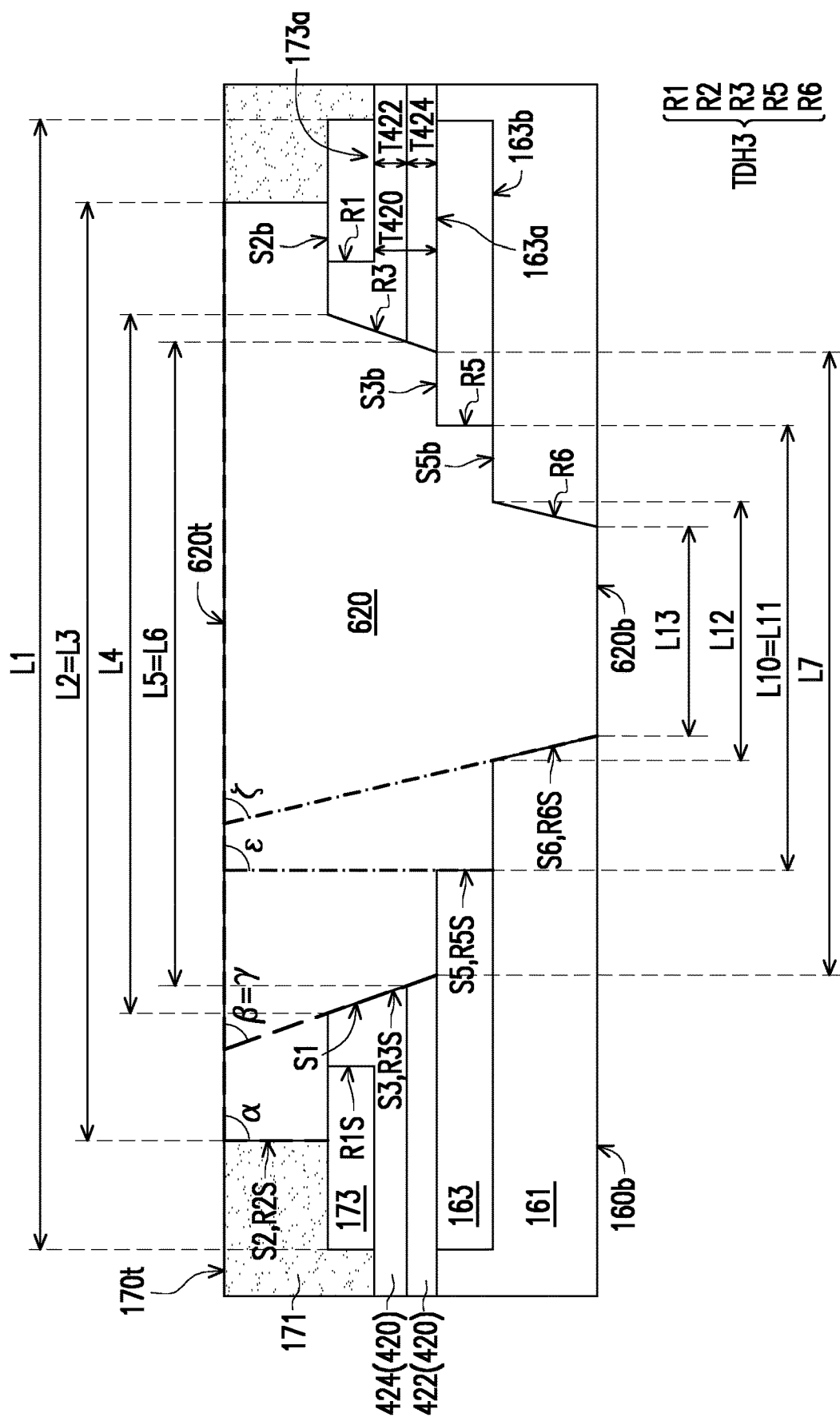
FIG. 9A through FIG. 9B show schematic cross-sectional views of portions of semiconductor devices according to some embodiments of the present disclosure.
Figure 9B:
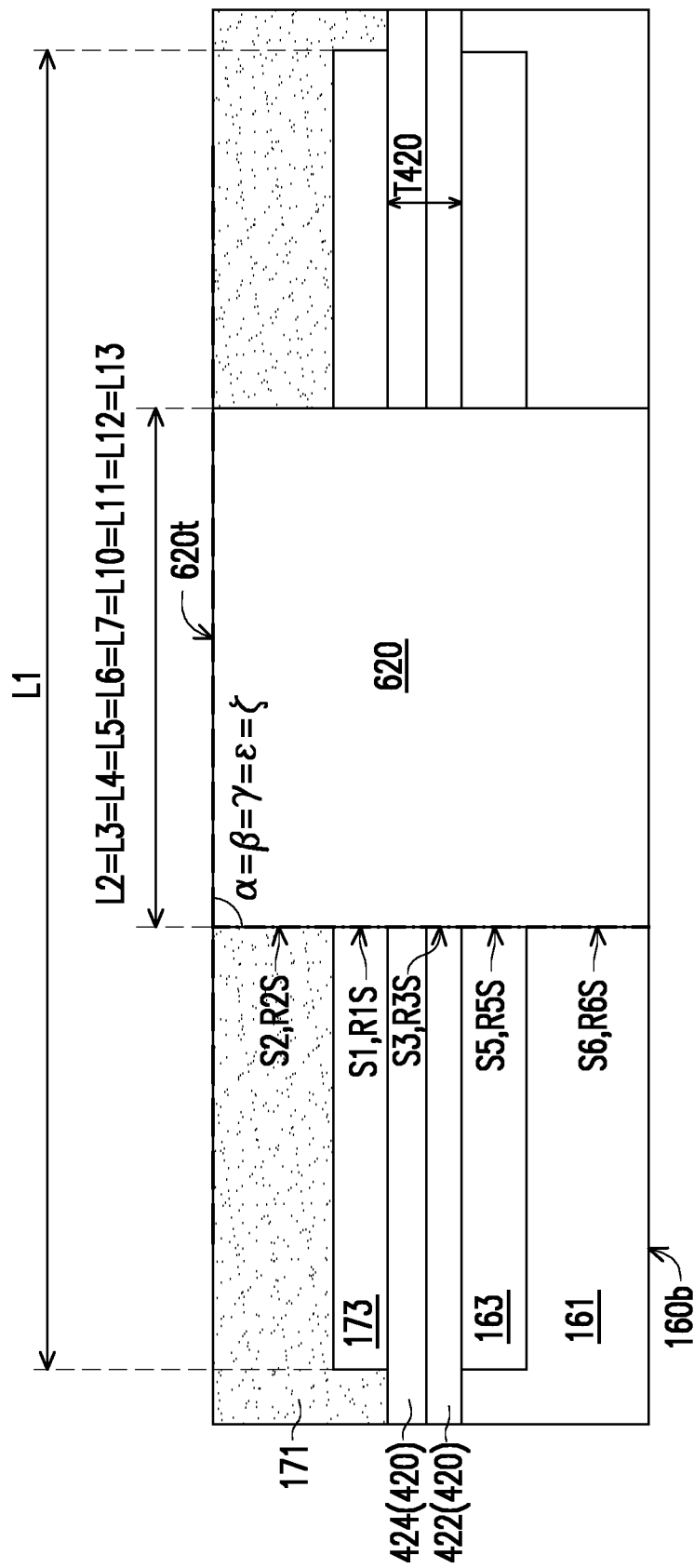

In FIG. 9A and FIG. 9B are shown schematic cross-sectional views of portions of semiconductor devices according to some embodiments of the disclosure. The portions of semiconductor devices shown in FIG. 9A and FIG. 9B correspond to the area A3 shown in FIG. 8I for the semiconductor device SD6. In the cross-sectional views of FIG. 9A and FIG. 9B are illustrated some features of the die interconnection established by the through die vias 620 in the stack building block SBB1 according to some embodiments of the disclosure. As discussed above with reference to FIG. 3A through FIG. 3E, it is remarked that the cross-sectional views may be not in scale to highlight some particular features or dimensions, and that some optional elements (e.g., the seed layer SL shown in FIG. 2G) may not be shown for the sake of clarity. Furthermore, it is reiterated that the interconnection is not required to have any particular symmetry (e.g. cylindrical symmetry), and that the described spatial relationships may be encountered in one or more planes of view, but not necessarily all of them. In FIG. 9A and FIG. 9B, the portions of semiconductor dies 160 and 170 are illustrated in their entire thicknesses T160, T170. Therefore, a portion of the backside surface 160*b*, the top surface 620*t* of the through die via 620, and a portion of the top surface 170*t* are also illustrated. The schematic cross-sectional views of FIG. 9A and FIG. 9B are taken along a plane passing through a central part (a central axis) of the through die via 620.

In the schematic cross-sectional view of FIG. 9A, the dimensions L1 to L7 and the angles $\alpha$, $\beta$, and $\gamma$ are defined as described above with reference to FIG. 3A to FIG. 3D and FIG. 6A and FIG. 6B. In at least some embodiments of the present disclosure, the teachings discussed for FIG. 3A to FIG. 3D and FIG. 6A and FIG. 6B concerning the possible relationships and combinations of the dimensions L1 to L7, the angles $\alpha$, $\beta$, and $\gamma$ and the side surfaces S1, S2, S3 apply equally with respect to the embodiments discussed with reference to FIG. 9A and FIG. 9B, and a detailed description thereof is omitted herein for the sake of brevity. However, it should be kept in mind that in the context of the embodiments of FIG. 9A and FIG. 9B the seventh dimension L7 corresponds only to the width of the through die via 620 at the bottom of the third recess R3, where the bottom of the third recess R3 may be defined at the interface between the bonding layer 420 and the patterned conductive pad 163. In some embodiments, the seventh dimension L7 may correspond to the width of the through die via 620 at the level at which the through die via 620 reaches the patterned conductive pad 163 moving away from the top surface 620t.

In some embodiments, a tenth dimension L10 may correspond to the width of the through die via 620 at the top of the fifth recess R5 (where a side surface RS5 of the fifth recess R5 joins a top surface 163a of the patterned conductive pad 163 in contact with the bonding layer 420). The fifth recess R5 may be disposed below the third recess R3. As shown in FIG. 9A, even though third recess R3 is formed on the fifth recess R5, the tenth dimension L10 is not necessarily equal to the seventh dimension L7. That is, the side surface R3S of the third recess R3 (and the side surface S3 of the through die via 620 in the third recess R3) may land on the patterned conductive pad 163, and a surface S3b of the through die via 620 at the bottom of third recess R3 may extend over the surface 163a of the patterned conductive pad 163 closer to the top surface 620t of the through die via 620. That is, the side surface S3 of the through die via 620 in the third recess R3 and the side surface S5 of the through die via 620 in the fifth recess R5 may be separated by the surface S3b at the bottom of the third recess R3. In some alternative embodiments, the seventh dimension L7 may be equal to the tenth dimension L10 (as shown, for example, in FIG. 9B), and the side surface S3 of the through die via 620 in the third recess R3 may directly contact (be contiguous with) the side surface S5 of the through die via 620 in the fifth recess R5.

In some embodiments, a width of the through die via 620 at the bottom of the fifth recess R5 in contact with the semiconductor substrate 161 (at the level of the interface between the patterned conductive pad 163 and the semiconductor substrate 161; where the side surface RS5 of the fifth recess R5 joins a second surface 163b of the conductive pad 163 closer to the backside surface 160b of the semiconductor die 160) may correspond to an eleventh dimension L11. In some embodiments, the eleventh dimension L11 may be different than the tenth dimension L10. That is, the through die via 620 in the fifth recess R5 may have side surfaces S5 inclined at an angle ε other than π/2 radians with respect to the top surface 620t of the through die via 620. In some embodiments, a range of the angle ε may be similar to the range for the angle α described above. In some embodiments, if the angle ε is π/2 radians the through die via 620 in the fifth recess R5 has a substantially vertical profile, and the tenth dimension L10 is about equal to the eleventh dimension L11 (as shown, for example, in FIG. 9B). Even when the two side surfaces S3 and S5 are contiguous (i.e., they are not separated by the bottom surface S3b at the bottom of third recess R3), the angles γ and ε may be different. In some alternative embodiments, the angles γ and δ may be the same, and the contiguous side surfaces S3 and S4 may describe a continuous surface (as shown, for example, in FIG. 9B).

In some embodiments, a sixth recess R6 formed in the semiconductor substrate 161 may connect the fifth recess R5 to the backside surface 160b of the semiconductor die 160. In some embodiments, a twelfth dimension L12 may correspond to the width of the through die via 620 at the top of the sixth recess R6. The sixth recess R6 may be disposed below the fifth recess R5. As shown in FIG. 9A, even though the fifth recess R5 is formed on the sixth recess R6, the twelfth dimension L12 is not necessarily equal to the eleventh dimension L11. That is, the side surface R5S of the fifth recess R5 (and the side surface S5 of the through die via 620 in the fifth recess R5) may land on the semiconductor substrate 161, and a surface S5b of the through die via 620 at the bottom of fifth recess R5 may extend on the semiconductor substrate 161. That is, the side surface S5 of the through die via 620 in the fifth recess R5 and the side surface S6 of the through die via 620 in the sixth recess R6 may be separated by the surface S5b of the through die via 620 at the bottom of the fifth recess R5. In some alternative embodiments, the eleventh dimension L11 may be equal to the twelfth dimension L12 (as shown, for example, in FIG. 9B), and the side surface S5 of the through die via 620 in the fifth recess R5 may directly contact (be contiguous with) the side surface S6 of the through die via 620 in the sixth recess R6.

In some embodiments, a width of the through die via 620 at the bottom of the sixth recess R5 (a width of the bottom surface 620b) may correspond to a thirteenth dimension L13. In some embodiments, the thirteenth dimension L13 may be different from the twelfth dimension L12. That is, the through die via 620 in the sixth recess R6 may have side surfaces S6 inclined at an angle ζ other than π/2 radians with respect to the top surface 620t of the through die via 620. In some embodiments, a range of the angle ζ may be similar to the range for the angle α described above. In some embodiments, if the angle ζ is π/2 radians the through die via 620 in the sixth recess R6 has a substantially vertical profile, and the twelfth dimension L12 is about equal to the thirteenth dimension L13 (as shown, for example, in FIG. 9B). Even when the two side surfaces S5 and S6 are contiguous (i.e., they are not separated by the bottom surface S5b at the bottom of fifth recess R5), the angles c and may be different. In some alternative embodiments, the angles c and may be the same, and the contiguous side surfaces S5 and S6 may describe a continuous surface (as shown, for example, in FIG. 9B).

In some embodiments, a thickness T420 of the bonding layer 420 may be in the same range described above for the thicknesses T400 and T410. In some embodiments, the thickness T420 may correspond to the sum of the thicknesses T422 and T424 of the bonding layers 422 and 424, respectively. In some embodiments, the thickness T420 of the bonding layer 400 is measured as the distance between facing surfaces 163a and 173a of the patterned conductive pads 163 and 173, respectively. The surface 173a may be the surface of the patterned conductive pads 173 further away (in a vertical direction) from the top surface 170t of the semiconductor die 170. This means that in the embodiments in which the bonding layer 424 extends within the first recess R1 (as shown in FIG. 9A, for example), the portions of the bonding layer 424 extending within the first recess R1 are not considered when evaluating the thickness of the bonding layer 420.

Figure 10A:
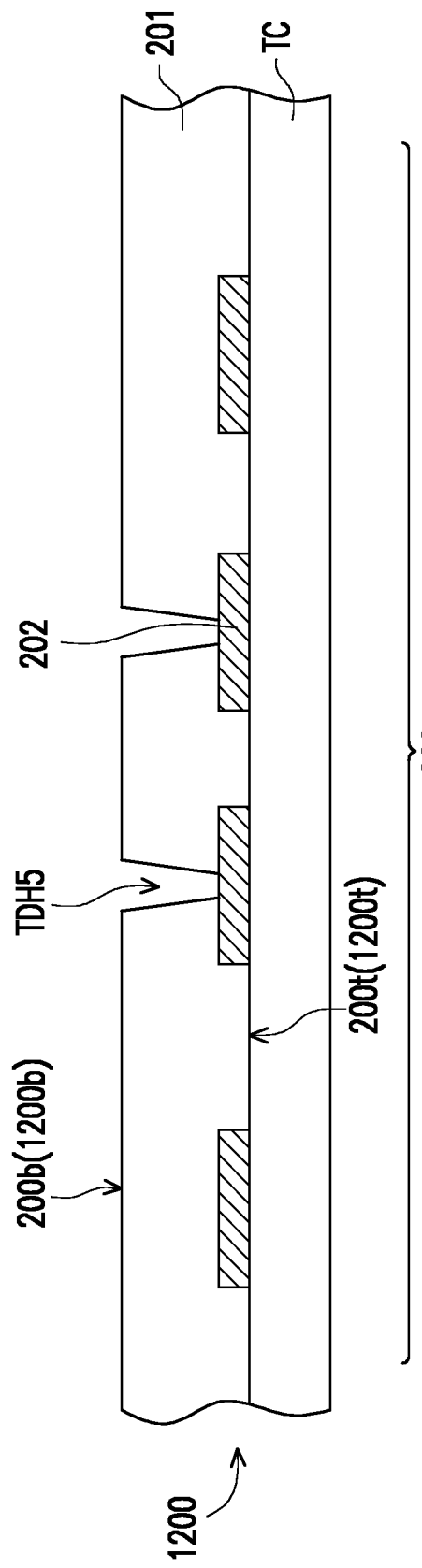
FIG. 10A through FIG. 10D show schematic cross-sectional views of structures produced at various stages of a manufacturing method of a semiconductor device according to some embodiments of the present disclosure.
Figure 10B:
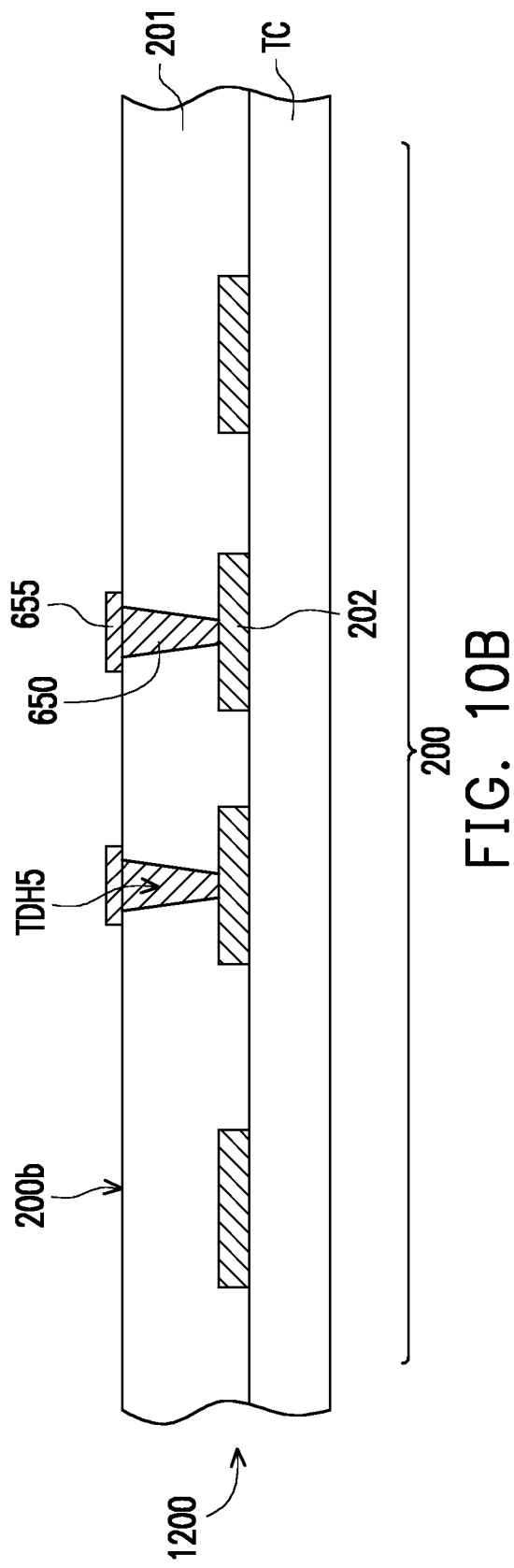

FIG. 10A through FIG. 10D show schematic cross-sectional views of structures produced during a manufacturing method of a semiconductor device SD7 (shown in FIG. 10D) according to some embodiments of the disclosure. Referring to FIG. 10A, in some embodiments a semiconductor wafer 1200 having semiconductor dies 200 formed therein is provided on a temporary carrier TC. The semiconductor wafer 1200 may be disposed with a top surface 1200t on which conductive pads 202 are formed disposed towards the temporary carrier TC. Through die holes TDH5 may be opened in the semiconductor substrate 201 from the backside surface 200b of the semiconductor dies 200 to expose the conductive pads 202. Referring to FIG. 10B, in some embodiments through die vias 650 may be formed in the through die hole TDH5.

Conductive pads 655 may be provided on top of the through die vias 650. The through die vias 650 may provide electrical connection between at least some of the conductive pads 202 and the conductive pads 650.

Figure 10C:
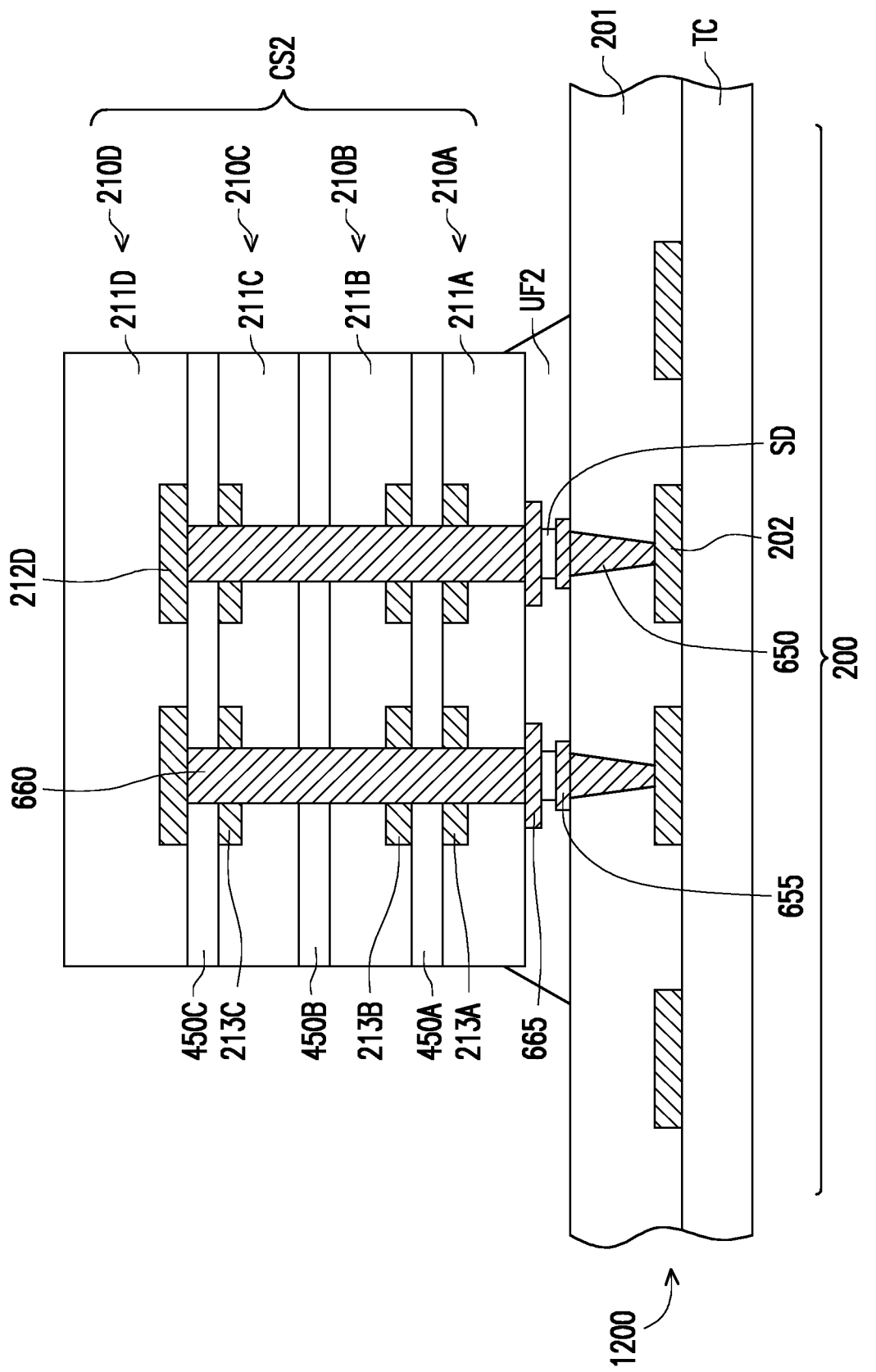

Referring to FIG. 10C, a chip stack CS2 may be bonded to the semiconductor die 200. In some embodiments, the chip stack CS2 may have a similar structure and be formed following a similar process as described above for the first chip stack CS1. That is, the chip stack CS2 may include stacked semiconductor dies 210A to 210D bonded via bonding layers 450A to 450C and electrically interconnected by through stack vias 660. The semiconductor dies 211A and 211C may be disposed in a face-to-face configuration with the semiconductor dies 211B and 211D, respectively. The patterned conductive pads 213A to 213C and the conductive pads 212D may be buried by the semiconductor substrates 211A to 211D. The through stack vias 660 may contact the patterned conductive pads 213A to 213C and the conductive pads 212D by crossing through the semiconductor substrates 211A to 211C. Conductive pads 665 may be formed on exposed bottom surfaces of the through stack vias 660, and may be joined to the conductive pads 655 formed on the semiconductor die 200 via an intermediate solder material SD. In some embodiments, an underfill UF2 may be disposed between the chip stack CS2 and the underlying semiconductor die 200 to protect the solder joints from thermal and mechanical stresses. Whilst in FIG. 10C a single chip stack CS2 and a single semiconductor die 200 are illustrated, the disclosure is not limited thereto. Because multiple semiconductor dies 200 may be in the form of semiconductor wafer 1200, multiple semiconductor devices SD7 (shown in FIG. 10D) may be formed simultaneously.

Figure 10D:
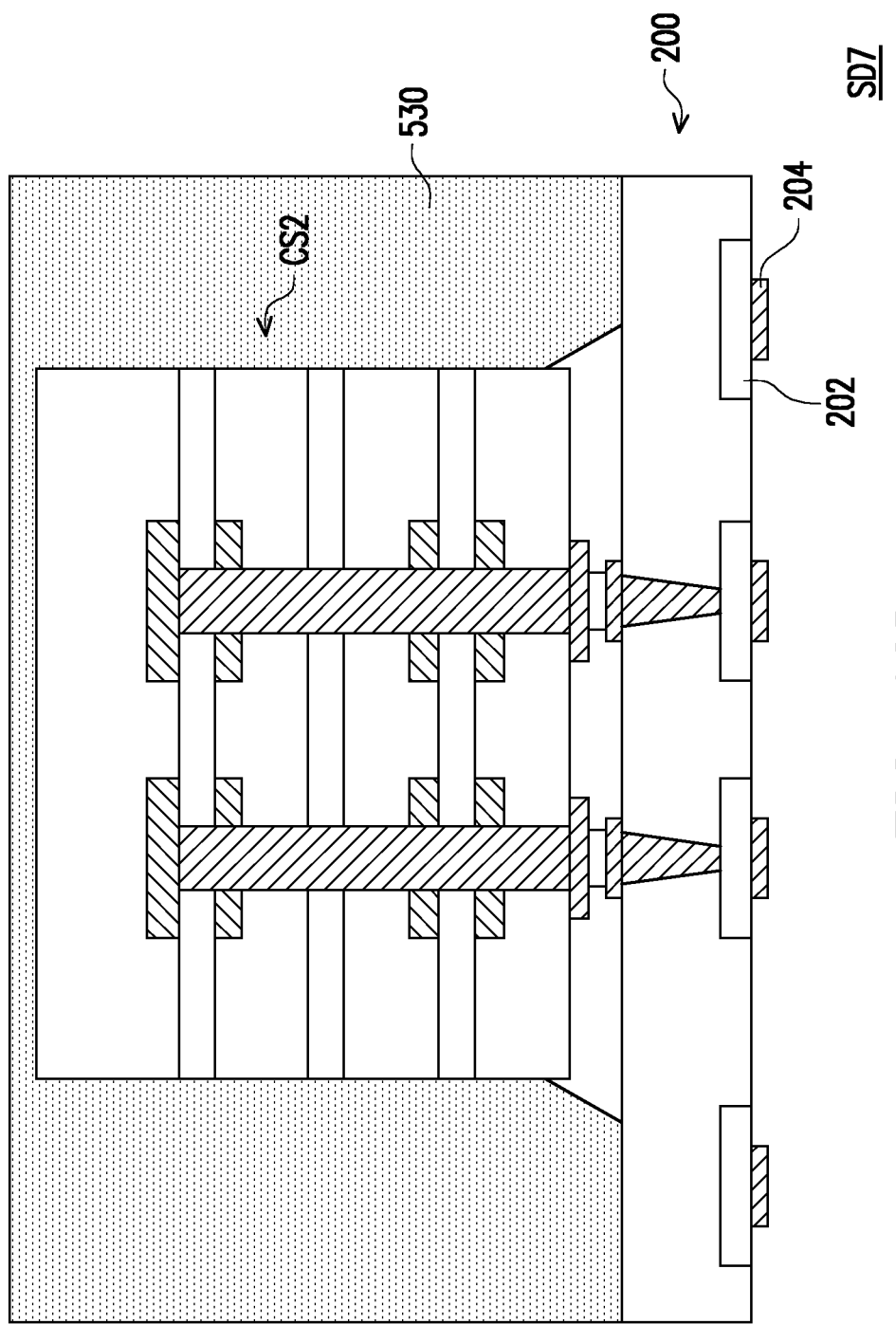

Referring to FIG. 10C and FIG. 10D, in some embodiments production of an encapsulant 530 wrapping the chip stack CS2, removal of the temporary carrier TC, formation of the conductive pads 204 over the exposed conductive pads 202 and (if applicable), a singulation process may produce the semiconductor device SD7 illustrated in FIG. 10D. Because the semiconductor device SD7 includes a bump-less chip stack CS2 which can be produced according to the method discussed above with reference to FIG. 8A through FIG. 8H, the process throughput for the manufacturing of the semiconductor device SD7 may be increased, while a failure rate may be reduced. Furthermore, because the chip stack CS2 includes semiconductor dies interconnected in a bump-less manner, power consumption may be reduced and reliability of the semiconductor device SD7 may be increased.

Figure 11:
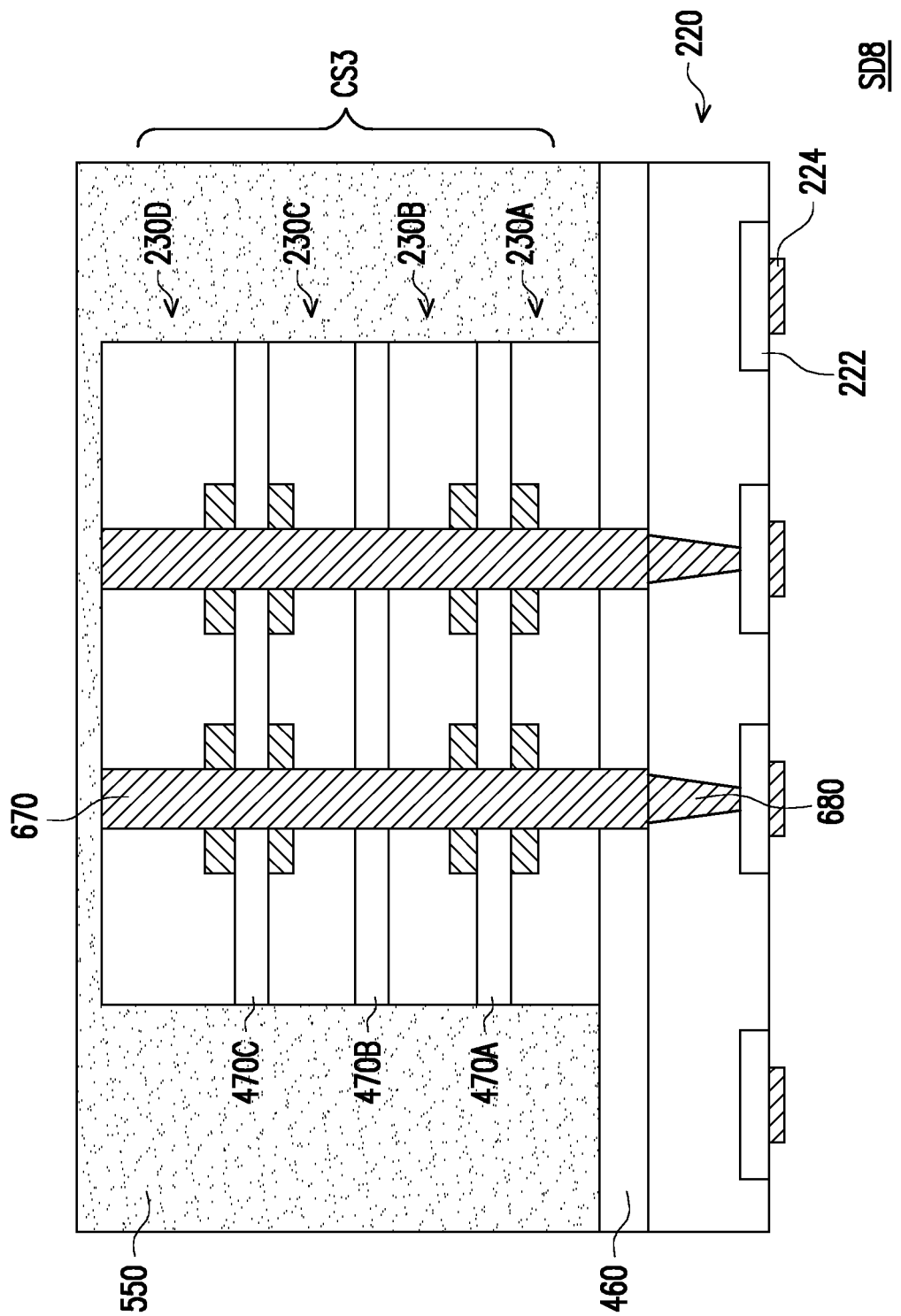
FIG. 11 shows a schematic cross-sectional view of a semiconductor device according to some embodiments of the present disclosure.

In FIG. 11 is shown a schematic cross-sectional view of a semiconductor device SD8 according to some embodiments of the disclosure. The semiconductor device SD8 may be similar to the semiconductor device SD7 and the same or similar reference numbers identify the same or similar components. A difference between the semiconductor device SD7 of FIG. 10D and the semiconductor device SD8 of FIG. 11 may be the bump-less connection between the chip stack CS3 and the underlying semiconductor die 220. That is, in place of the underfill and the solder joints of the semiconductor device SD7, in the semiconductor device SD8 a bonding layer 460 may be formed on the semiconductor die 220 and the chip stack CS3 may be directly bonded over the bonding layer 460. The through stack vias 670 of the chip stack CS3 may extend through the bonding layer 460 to establish electrical connection with the through die vias 680 formed in the semiconductor die 220. In some embodiments, the semiconductor dies 230A to 230D forming the chip stack CS3 may be bonded together by the bonding layer 470A to 470C before being bonded to the semiconductor die 220. In some embodiments, the through stack vias 670 may be formed after bonding the semiconductor dies 230A to 230D to the semiconductor die 220. An encapsulant 550 may be disposed over the bonding layer 460 to wrap the chip stack CS3. In some embodiments, because the bump-less connection between the semiconductor dies 220 and 230A to 230D of the semiconductor device SD8 reduces the power consumption and increases the reliability and the manufacturing throughput of the semiconductor device SD8.

Figure 12:
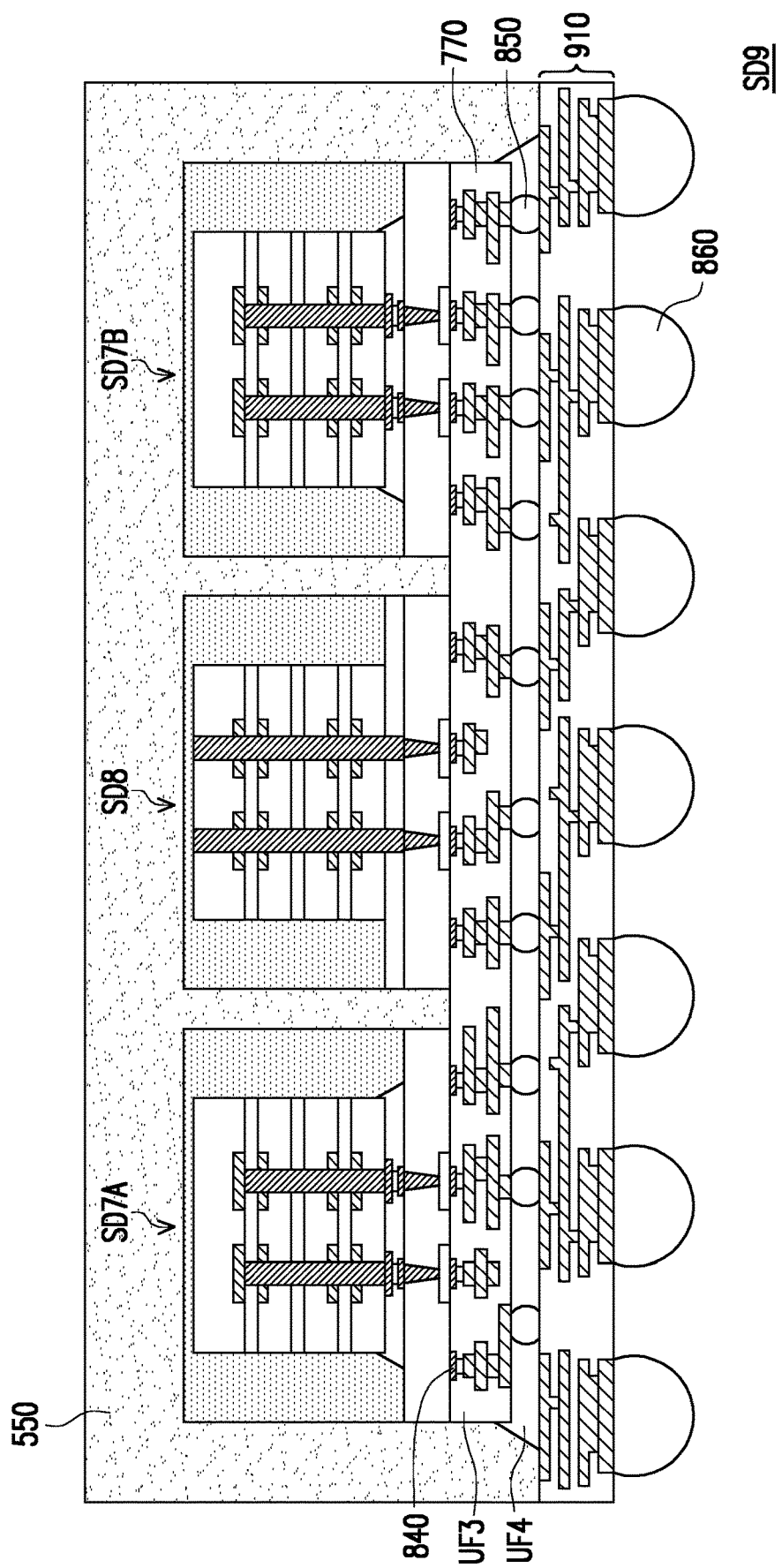
FIG. 12 shows a schematic cross-sectional view of a semiconductor device according to some embodiments of the present disclosure.

In some embodiments, multiple semiconductor device (e.g., SD7 and SD8) may be integrated together to produce a larger semiconductor device SD9 (e.g., a chip on wafer on substrate, CoWoS), of which a cross-sectional view is illustrated in FIG. 12. In some embodiments, the semiconductor devices SD7A, SD7B, SD8 may be connected to an interposer 770 via connectors 840. In some embodiments, the connectors 840 are solder joints formed between conductive pads of the semiconductor devices SD7A, SD7B, SD8 and the interposer 770. The interposer 740 may be bonded via connectors 850 to a circuit carrier 910. Underfills UF3 and UF4 may be disposed may be disposed between the semiconductor devices SD7A, SD7B, SD8 and the interposer 770 and between the interposer 770 and the circuit carrier 910 to protect the connectors 840 and 850 from thermal and mechanical stress. In some embodiments, connectors 860 may be provided on a side of the circuit carrier 910 further away from the interposer 770 to further integrate the semiconductor device SD9 with other devices (not shown).

In light of the foregoing, according to the present disclosure it is possible to interconnect semiconductor dies in a bump-less manner by forming through die vias within at least one of the semiconductor dies. In some embodiments, the through die vias cross the semiconductor substrate and the conductive pads of a semiconductor die to establish electrical connection with the conductive pads of another semiconductor die. In some embodiments, the bump-less connection reduces the power consumption of the semiconductor device, and may provide a high bandwidth interconnection between the semiconductor dies. In some embodiments, the bump-less connection may allow finer density of the conductive lines, and an increase in the number of input/output ports available. In some embodiments, semiconductor dies are bonded together via an interposed bonding layer, and the through die vias may extend through the interposed bonding layer. Bonding the semiconductor dies via the bonding layer may allow to establish dies interconnection working at lower temperatures (e.g., below 200° C.) with respect to the case in which conductive bumps are used to interconnect the semiconductor dies. In some embodiments, lower process temperatures may reduce occurrence of cracks in porous materials such as low-k dielectric materials, increasing the overall process yields and reducing the unitary manufacturing costs. In some embodiments, the manufacturing process may be adapted to produce stack building blocks, which may be used in the modular production of chip stacks. In some embodiments, die stacked in a stack building block may include patterned conductive pads buried by the semiconductor substrates of adjacent dies and the intervening bonding layer. In some embodiments, the patterned conductive pads may be exposed by through die vias that extend throughout the stack building block. In some embodiments, modular production of chip stacks may reduce the manufacturing times, increasing the process throughput.

In some embodiments of the present disclosure, a manufacturing method of a semiconductor device includes the following steps. A curable material layer is coated on a surface of a first semiconductor die. The first semiconductor die includes a first semiconductor substrate and a first contact pad. A second semiconductor die is bonded to the first semiconductor die. The second semiconductor die includes a second semiconductor substrate and a second contact pad. The second contact pad is located on the second semiconductor substrate, at an active surface of the second semiconductor die. Bonding the second semiconductor die to the first semiconductor die includes disposing the second semiconductor die with the active surface closer to the curable material layer and curing the curable material layer. A through die hole is etched in the second semiconductor substrate from a backside surface of the second semiconductor substrate opposite to the active surface. The through die hole further extends through the cured material layer, is encircled by the second contact pad, and exposes the first contact pad. A conductive material is disposed in the through die hole. The conductive material electrically connects the first contact pad to the second contact pad.

In some embodiments of the present disclosure, a manufacturing method of a semiconductor device includes the following steps. A first recess is formed in a first contact pad of a first semiconductor die. The first recess extends through the first contact pad to expose a first semiconductor substrate of the first semiconductor die. A second recess is formed in the first semiconductor substrate from an opposite side of the first semiconductor substrate with respect to the first contact pad. The second recess is connected to the first recess. The first semiconductor die is stacked on a bonding layer formed on a second semiconductor die. A third recess is formed. The third recess extends through the bonding layer to expose a second contact pad of the second semiconductor die. The third recess is connected to the first recess. The first recess, the second recess, and the third recess are filled with a metallic material, thereby electrically connecting the first semiconductor die to the second semiconductor die.

In some embodiments of the present disclosure, a manufacturing method of a semiconductor device includes the following steps. A first semiconductor die is provided. The first semiconductor die includes a conductive pad disposed on an active surface of the first semiconductor die. An organic bonding layer is formed on the first semiconductor die. A second semiconductor die is bonded on the organic bonding layer. The second semiconductor die includes a semiconductor substrate and a conductive pad disposed on an active surface of the second semiconductor die. A portion of the conductive pad of the second semiconductor die is removed. A portion of the semiconductor substrate of the second semiconductor die and a portion of the organic bonding layer are removed to form a through die hole. The through die hole exposes a portion of the conductive pad of the first semiconductor die and of the conductive pad of the second semiconductor die. A conductive material is disposed in the through die hole to form a through die via. The through die via interconnects the first semiconductor die with the second semiconductor die.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a semiconductor device, comprising:
   coating a curable material layer on a surface of a first semiconductor die, the first semiconductor die including a first semiconductor substrate and a first contact pad;
   bonding a second semiconductor die to the first semiconductor die, the second semiconductor die including a second semiconductor substrate and a second contact pad, the second contact pad being located on the second semiconductor substrate at an active surface of the second semiconductor die, wherein bonding the second semiconductor die to the first semiconductor die comprises disposing the second semiconductor die with the active surface closer to the curable material layer and curing the curable material layer;
   etching a through die hole in the second semiconductor substrate from a backside surface of the second semiconductor substrate opposite to the active surface, wherein the through die hole further extends through the cured material layer, is encircled by the second contact pad, and exposes the first contact pad; and
   disposing a conductive material in the through die hole, wherein the conductive material electrically connects the first contact pad to the second contact pad.

2. The manufacturing method of claim 1, further comprising removing a region of the second contact pad to expose the second semiconductor substrate before bonding the second semiconductor die to the first semiconductor die, wherein the through die hole further extends where the region of the second contact pad has been removed.

3. The manufacturing method of claim 2, further comprising forming another curable material layer on the active surface of the second semiconductor substrate after the region of the second contact pad has been removed, whereby the other curable material layer covers exposed surfaces of the second contact pad, wherein the second semiconductor die is disposed on the first semiconductor die with the other curable material layer contacting the curable material layer.

4. The manufacturing method of claim 3, wherein the curable material layer is formed on a backside surface of the first semiconductor die, the backside surface of the first semiconductor die being opposite to an active surface of the first semiconductor die where the first contact pad is located.

5. The manufacturing method of claim 3, wherein the curable material layer is formed on an active surface of the first semiconductor die where the first contact pad is located.

6. The manufacturing method of claim 1, further comprising: forming an encapsulant on the cured material layer to encapsulate the second semiconductor die.

7. The manufacturing method of claim 6, wherein the first semiconductor die comprises a third contact pad disposed beside the first contact pad, and the method further comprises forming a conductive pillar extending through the curable material layer to contact the third contact pad, wherein the conductive pillar is encapsulated by the encapsulant.

8. A manufacturing method of a semiconductor device, comprising:
   forming a first recess in a first contact pad of a first semiconductor die, the first recess extending through the first contact pad to expose a first semiconductor substrate of the first semiconductor die;

forming a second recess in the first semiconductor substrate from an opposite side of the first semiconductor substrate with respect to the first contact pad, wherein the second recess is connected to the first recess;

stacking the first semiconductor die on a bonding layer formed on a second semiconductor die;

forming a third recess extending through the bonding layer to expose a second contact pad of the second semiconductor die, wherein the third recess is connected to the first recess; and filling the first recess, the second recess, and the third recess with a metallic material, thereby electrically connecting the first semiconductor die to the second semiconductor die.

9. The manufacturing method of claim 8, wherein the third recess is formed from the same side as the second recess.

10. The manufacturing method of claim 8, wherein the first recess is disposed between the second recess and the third recess.

11. The manufacturing method of claim 8, further comprising forming a fourth recess in a second semiconductor substrate of the second semiconductor die, wherein the fourth recess is connected to the third recess and is filled of the metallic material together with the first recess, the second recess, and the third recess.

12. The manufacturing method of claim 11, further comprising forming a fifth recess extending through the second contact pad to expose the second semiconductor substrate, wherein the fifth recess is disposed between the third recess and the fourth recess.

13. The manufacturing method of claim 12, further comprising:
    forming a first conductive pad on a rear surface of the second semiconductor substrate and extending on the metallic material filling the fourth recess;
    soldering the first conductive pad to a second conductive pad of a third semiconductor die;
    forming an encapsulant on the third semiconductor die encapsulating the stacked first semiconductor die and second semiconductor die.

14. The manufacturing method of claim 13, wherein the third semiconductor die comprises a third semiconductor substrate and a third contact pad formed at a front surface of the third semiconductor substrate, the method further comprising:
    forming a sixth recess in the third semiconductor substrate extending from a rear surface of the third semiconductor substrate to the third contact pad;
    filling the sixth recess with additional metallic material; and
    forming the second conductive pad on the rear surface of the third semiconductor die, wherein the second conductive pad extends on the metallic material filling the sixth recess.

15. A manufacturing method of a semiconductor device, comprising:
    providing a first semiconductor die, including a conductive pad disposed on an active surface of the first semiconductor die;
    forming an organic bonding layer on the first semiconductor die;
    bonding a second semiconductor die on the organic bonding layer, the second semiconductor die including a semiconductor substrate and a conductive pad disposed on an active surface of the second semiconductor die;
    removing a portion of the conductive pad of the second semiconductor die;
    removing a portion of the semiconductor substrate of the second semiconductor die and a portion of the organic bonding layer to form a through die hole exposing a portion of the conductive pad of the first semiconductor die and of the conductive pad of the second semiconductor die; and
    disposing a conductive material in the through die hole to form a through die via interconnecting the first semiconductor die with the second semiconductor die.

16. The manufacturing method of claim 15, wherein the portion of the conductive pad of the second die is removed before the portion of the semiconductor substrate of the second die is removed.

17. The manufacturing method of claim 15, further comprising thinning the second semiconductor die to a thickness of 25 micrometers or less.

18. The manufacturing method of claim 15, wherein the through die hole is opened throughout the first semiconductor die and the second semiconductor die.

19. The manufacturing method of claim 18, further comprising:
    forming a second bonding layer over the second semiconductor die; and
    bonding a third semiconductor die having a fourth semiconductor die bonded thereon on to the second semiconductor die via the second bonding layer,
    wherein the third semiconductor die has a conductive pad,
    the fourth semiconductor die has a conductive pad,
    the third semiconductor die and the fourth semiconductor die include a second through die hole opening throughout the third semiconductor die and the fourth semiconductor die and exposing the conductive pad of the third die and the conductive pad of the fourth die.

20. The manufacturing method of claim 19, wherein the third and fourth semiconductor dies are disposed on the second semiconductor die with the second through die hole exposing a portion of the second bonding layer overlying the through die via, the manufacturing method further comprising:
    removing a portion of the second bonding layer to extend the second through die hole to expose the through die via; and
    filling the second through die hole with a conductive material to form a through stack via interconnecting the first semiconductor die with the second semiconductor die, the third semiconductor die and the fourth semiconductor die.

* * * * *